(12) United States Patent
Achler

(10) Patent No.: US 8,504,725 B2
(45) Date of Patent: Aug. 6, 2013

(54) ADAPTIVE COMPRESSION AND DECOMPRESSION

(75) Inventor: Isaac Achler, Holmdel, CA (US)

(73) Assignee: SuTech Data Solutions Co., LLC, Wilmington, DE (US)

( * ) Notice: Subject to any disclaimer, the term of this patent is extended or adjusted under 35 U.S.C. 154(b) by 229 days.

(21) Appl. No.: 12/559,891

(22) Filed: Sep. 15, 2009

(65) Prior Publication Data

US 2010/0077141 A1    Mar. 25, 2010

Related U.S. Application Data

(60) Continuation of application No. 11/525,723, filed on Sep. 21, 2006, which is a division of application No. 10/026,680, filed on Dec. 17, 2001, now abandoned.

(51) Int. Cl.
*G06F 15/16* (2006.01)
(52) U.S. Cl.
USPC ............................ 709/247; 709/217; 709/203
(58) Field of Classification Search
USPC .................................. 709/245, 217–219, 203
See application file for complete search history.

(56) References Cited

U.S. PATENT DOCUMENTS

| | | | | |
|---|---|---|---|---|
| 5,410,671 A | * | 4/1995 | Elgamal et al. | 711/202 |
| 5,455,576 A | * | 10/1995 | Clark et al. | 341/50 |
| 5,473,326 A | * | 12/1995 | Harrington et al. | 341/51 |
| 5,530,645 A | | 6/1996 | Chu | |
| 5,608,396 A | * | 3/1997 | Cheng et al. | 341/50 |
| 5,696,823 A | | 12/1997 | Blaze | |
| 5,805,600 A | | 9/1998 | Venters et al. | |
| 5,850,526 A | | 12/1998 | Chou | |
| 5,903,754 A | | 5/1999 | Pearson | |
| 5,933,635 A | | 8/1999 | Holzle et al. | |
| 6,038,226 A | | 3/2000 | Ellersick et al. | |
| 6,237,141 B1 | | 5/2001 | Holzle et al. | |
| 6,275,588 B1 | | 8/2001 | Videcrantz et al. | |
| 6,321,326 B1 | | 11/2001 | Witt | |
| 6,359,548 B1 | * | 3/2002 | Cooper | 341/50 |
| 6,381,331 B1 | | 4/2002 | Kato | |
| 6,404,362 B1 | * | 6/2002 | York et al. | 341/106 |
| 6,414,610 B1 | * | 7/2002 | Smith | 341/106 |
| 6,501,840 B1 | | 12/2002 | Saijo | |
| 6,532,121 B1 | | 3/2003 | Rust et al. | |
| 6,625,671 B1 | | 9/2003 | Collette et al. | |

(Continued)

FOREIGN PATENT DOCUMENTS

EP          0802653         10/1997

OTHER PUBLICATIONS

"Final Office Action", U.S. Appl. No. 11/525,723, (Feb. 5, 2010), 8 pages.

(Continued)

*Primary Examiner* — David Lazaro

(57) ABSTRACT

Adaptive compression and decompression techniques are described. In at least some embodiments, compression techniques include adaptively compressing a plurality of input words into a plurality of compression codes and outputting the compression codes upon encountering an end-of-file signal. In at least some embodiments, the compression codes are fewer in number than the number of unique bit patterns requiring unique compression codes under LZW (Lempel Ziv & Welch) compression. In at least some other embodiments, decompression techniques include adaptively decompressing a plurality of compressed code words into a plurality of decompressed words and outputting the decompressed words upon encountering an end-of-file signal.

22 Claims, 20 Drawing Sheets

U.S. PATENT DOCUMENTS

| | | | |
|---|---|---|---|
| 6,920,154 | B1 | 7/2005 | Achler |
| 7,020,160 | B1 | 3/2006 | Achler |
| 7,180,909 | B1 | 2/2007 | Achler |
| 2002/0101367 | A1 | 8/2002 | Geiger et al. |
| 2002/0165957 | A1 | 11/2002 | Devoe et al. |
| 2003/0018647 | A1* | 1/2003 | Bialkowski .................. 707/101 |
| 2003/0030575 | A1* | 2/2003 | Frachtenberg et al. ......... 341/51 |
| 2003/0081776 | A1 | 5/2003 | Candelore |
| 2009/0080653 | A1 | 3/2009 | Candelore et al. |
| 2010/0172497 | A1 | 7/2010 | Candelore et al. |

OTHER PUBLICATIONS

"Non Final Office Action", U.S. Appl. No. 11/525,723, (Jun. 11, 2009), 10 pages.

Achler, Isaac "Integrated circuits for high speed adaptive compression and methods therfor", U.S. Appl. No. 10/026,680, filed Dec. 17, 2001.

Kembel, Robert W., "Fibre Channel: A Comprehensive Introduction", *Northwest Learning Associates, Inc.* Tucson, AZ 2000, (Provided as Non-Scanable Artifact in priority U.S. Appl. No. 10/026,370, on Dec. 2, 2004).

Knobe, et al., "Massively parallel data optimization", *IEEE* Oct. 1988 publication, (Oct. 1988).

Microsoft Press, "Microsoft Computer Dictionary", *Fifth Edition, copyright 2002*, 117.

Nelson, Mark "LZW Data Compression", http://www.dogma.net/markn/articles/lzw/lzw.htm, Originally published in Oct. 1989 Dr. Dobb's Journal (2800 Campus Drive, San Mateo, CA), www.ddj.com.

Welch, Terry A., "A Technique for High Performance Data Compression", *IEEE Computer 17*(6), Jun. 1984, pp. 8-19.

"Non Final Office Action", U.S. Appl. No. 12/057,235, (Nov. 9, 2010), 14 pages.

Official Action in U.S. Appl. No. 12/057,235 mailed on Feb. 24, 2011, 18 pages.

Office Action in U.S. Appl. No. 12/057,235 issued Aug. 3, 2011, 5 pages.

Office Action in U.S. Appl. No. 12/057,235 issued Nov. 25, 2011, 6 pages

Office Action in U.S. Appl. No. 11/525,723 issued Feb. 26, 2013, 10 pages.

\* cited by examiner

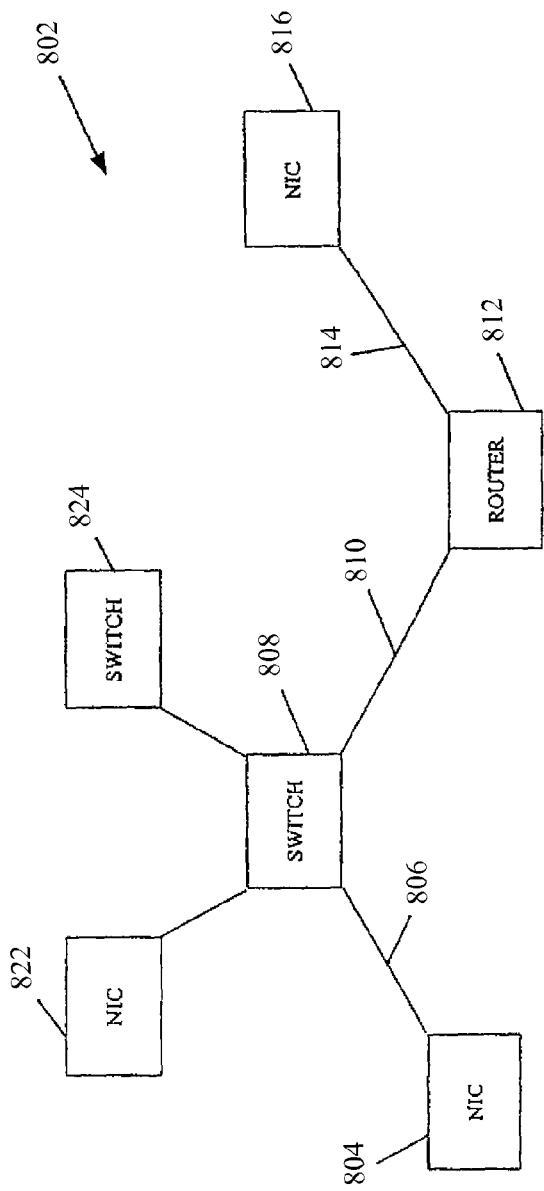
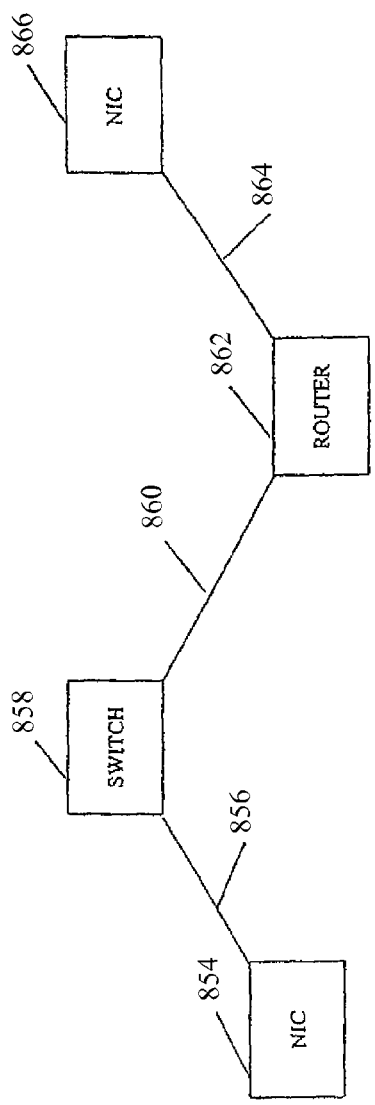
FIG. 8
FIG. 9

ADAPTIVE COMPRESSION AND DECOMPRESSION

PRIORITY CLAIM

This application is a continuation of and claims priority to U.S. application Ser. No. 11/525,723, filed Sep. 21, 2006, the disclosure of which is incorporated by reference herein in its entirety. U.S. application Ser. No. 11/525,723, in turn, is a divisional of and claims priority to U.S. application Ser. No. 10/026,680, filed on Dec. 17, 2001, the disclosure of which is incorporated by reference herein. Priority is also claimed to U.S. application Ser. No. 10/026,680.

BACKGROUND

Data transmission links and data storage devices are basic building blocks of modern electronic systems and computer networks. Data transmission links are present in every electronic system and are also fundamental for interconnecting nodes in a computer network. In an electronic system, such as in a computer for example, a data transmission link such as an address bus or a data bus may be employed to transmit digital data between two or more subsystems. Within a computer network (e.g., a local area network, a metro area network, a wide area network, or the Internet), data may be transmitted from one networked device to another via one or more data transmission links using a variety of well-known networking protocols. As is well known, the data transmission links themselves may be implemented using any physical media, such as wireless, copper or fiber optics, and may transfer data in a serial or parallel format.

In modern high-speed electronic systems, the data transmission link has long been regarded as one of the bottlenecks that limit overall system performance. To facilitate discussion of the foregoing, FIG. 1 shows simplified CPU, bus, and memory subsystems within an exemplary computer 100. In a typical computer system, such as in computer 100, a central processing unit (CPU) 102 typically operates at a much higher speed than the speed of a bus 104, which is employed to transmit data between CPU 102 and the various subsystems (such as a memory subsystem 106). By way of example, in some Windows™-based or Unix-based computer systems, it is not unusual to see a CPU having a clock speed in the Gigahertz range being coupled to a data bus running in the low hundreds of Megahertz range. There are many reasons behind the disparity between the CPU speed and the bus clock speed. For one, advances in processor technologies tend to follow the so-called Moore's law, which states that the speed of a typical electronic device can be expected to double roughly every 18 months. The clock speed of a typical data or address bus, on the other hand, is limited by the impedance and other physical characteristics of conductive traces that comprise the bus. Thus, it is often times impractical to run these buses at a higher speed to match the speed of the fast CPU due to issues related to power, interference, and the like.

The data storage device, such as a memory subsystem 106 within computer system 100, also represents another bottleneck to higher overall system performance. With regard to memory subsystem 106, there are generally three issues: 1) the speed of data transfer to and from memory subsystem 106, 2) the operating speed of memory subsystem 106, and 3) the storage capacity of memory subsystem 106. With regard to the data transfer speed issue, the discussion above regarding the data transmission link bottleneck applies. With regard to the operating speed of memory subsystem 106, dynamic random access memory (DRAM), which is widely employed for storage of data and instructions during operation, must be refreshed periodically (by a memory controller 108 as shown or by some type of refresh circuitry), and the capacitors employed in the DRAM to store the charges representing the 0's and 1's have a finite response time. Together, these factors tend to limit the speed of a typical DRAM to well below the operating speed of the CPU. Even if static random access memory (SRAM) is employed (assuming the high power consumption and low density issues can be tolerated) in memory subsystem 106, the operating speed of a typical SRAM is also well below that of a typical CPU in computer system 100.

Because of the relative slow response of memory subsystem 106, attempts have been made, some more successful than others, to improve memory access speed. Caching is one popular technique to improve the memory access speed for frequently used or most recently used data. In caching, a small amount of dedicated very high-speed memory 110 is interposed between memory subsystem 106 and CPU 102. This high-speed memory is then employed to temporarily store frequently accessed or most recently used data. When there is a memory read request from the CPU, the cache memory is first checked to see whether it can supply the requested data. If there is a cache hit (i.e., the requested data is found in the cache memory), the faster cache memory, instead of the slower main memory, supplies the requested data at the higher cache memory access speed.

Caching, however, increases the overall complexity of the computer system architecture and its operating system. Further, the use of expensive and power-hungry cache memory (e.g., on-board high speed custom SRAM) disadvantageously increases cost, power consumption, and the like. Furthermore, the cache hit rate is somewhat dependent on the software application and other parameters. If the cache hit rate is low, there may not be a significant improvement in memory access speed to justify the added complexity and cost of a cache subsystem.

As mentioned above, the memory capacity in memory subsystem 106 also represents another constraint to higher overall system performance. Modern complex software, which is often employed to manipulate large database, graphics, sound, or video files, requires a large amount of main memory space for optimum performance. The performance of many computer systems can be greatly improved if more storage is provided in the computer system's main memory. Due to power consumption, board space usage, and cost concerns, however, most computer systems are however manufactured and sold today with a less-than-optimum amount of physical memory on board. Consequently, the overall system performance suffers.

The same three issues pertaining to main memory 106 (i.e., the speed of data transfer to and from memory, the operating speed of the memory, and the storage capacity) also apply to a permanent memory subsystem (such as a hard disk). When a hard disk drive is employed for storing data, for example, the limited speed of the data transmission link between the hard disk drive and the main system bus, the slow access time due to the mechanical rotation nature of the hard disk's platters and the mechanical movement of the actuator arm that contains the read/write head, as well as the fixed storage capacity of the platters all represent factors that tend to limit system performance. Yet, with the advent of the Internet and improved multimedia technologies, users nowadays routinely transmit and store large graphics, video, and sound files using the permanent memory subsystem in their computers.

Consequently, it is generally desirable to increase both the memory access speed and the storage capacity of the permanent memory subsystem.

The same three issues pertaining to main memory 106 (i.e., the speed of data transfer to and from memory, the operating speed of the memory, and the storage capacity) also apply to Network-Assisted Storage (NAS) systems, storage area networks (SANs), RAID storage systems, and other networked electromagnetic or optical-based data storage systems. With reference to FIG. 2, irrespective of the protocol implemented on a transmission link 202 between a drive controller 204 and the actual storage media 206 (e.g., hard disks, optical platters, and the like), storage performance can be improved if the effective data throughput through transmission link 202 can be improved. This is true irrespective whether the protocol implemented is serial ATA (S-ATA), IDE, FCAL, SCSI, Fiber Channel over Ethernet, SCSI over Ethernet, or any other protocol employed to transfer data between disk controller 204 and storage media 206. With respect to the storage capacity issue, there is a fixed capacity to storage media 206 based on physical limitations and/or formatting limitations. From a cost-effectiveness standpoint, it would be desirable to transparently increase the capacity of storage media 306 without requiring a greater number and/or larger platters, or changing to some exotic storage media.

The data transmission bandwidth bottleneck also exists within modern high-speed computer networks, which are widely employed for carrying data among networked devices, whether across a room or across a continent. In a modern high-speed computer network, the bottlenecks may, for example, reside with the transmission media (e.g., the wireless medium, the copper wire, or the optical fiber) due to the physical characteristics of the media and the transmission technology employed. Further, the bottleneck may also reside with the network switches, hubs, routers, and/or add-drop multiplexers which relay data from one network node to another. In these devices, the line cards and/or switch fabric are configured to operate at a fixed speed, which is typically limited by the speed of the constituent devices comprising the line card. The device speed is in turn dictated the latest advances in microelectronics and/or laser manufacturing capabilities. In some cases, the bottleneck may be with the protocol employed to transmit the data among the various networked devices. Accordingly, even if the transmission media itself (such as a fiber optic) may theoretically be capable of carrying a greater amount of data, the hardware, software, and transmission protocols may impose a hard limit on the amount of data carried between two nodes in a computer network.

To further discuss the foregoing, there are shown in FIG. 3, in a simplified format, various subsystems of a typical Ethernet-based network 300. Components of Ethernet-based network 300 are well known and readily recognized by those skilled in the art. In general, digital data from a Media Access Controller (MAC) 302 is transformed into physical electrical or optical signals by a transceiver 304 to be transmitted out onto an Ethernet network 308 via a data transmission link 306, which is an Ethernet link in this case. MAC 302, as well as transceiver 304, generally operate at a predefined speed, which is dictated in part by the Ethernet protocol involved (e.g., 10 Mbps, 100 Mbps, 1 Gbps, or 10 Gbps). Thus, the throughput of data through the Ethernet arrangement 300 of FIG. 3 tends to have a finite limit, which cannot be exceeded irrespective of capacity requirement or the theoretical maximum capacity of data transmission link 306.

As the network grows and the capacity requirement for Ethernet-based network 300 increases, it is customary to upgrade MAC 302 and transceiver 304 and other associated electronics to enable data transmission link 306 to carry more data. With the advent of the Internet, however, a 300% growth in data traffic per year is not unusual for many networks. A hardware upgrade to one of the higher speed protocols, unfortunately, tends to involve network-wide disruptive changes (since the sending and receiving network nodes must be upgraded to operate at the same speed). A system-wide upgrade is also costly as many network nodes and components must be upgraded simultaneously to physically handle the higher speed protocol. It would be desirable to have the ability to enable Ethernet 300 to effectively carry more data for a given transmission speed. It would also be desirable to have the ability to upgrade, in a scalable manner, selective portions of the network so that both the upgraded and the legacy equipment can interoperate in an automatic, transparent manner.

In a commonly-owned, co-pending patent application entitled Data Optimization Engines And Methods Therefor (filed by inventor Isaac Achler on the same date, and incorporated by reference herein), various implementations of a data optimization engine and methods therefor are described in detail. In particular, various implementations of an optimization processor which are capable of performing at least one or both of the compression/decompression and encryption/decryption tasks are described in detail. Since the optimization processor and data optimization engine described in the above-discussed patent application have utility in many different environments, such as in computer systems and computer networks to transparently optimize the data transmission bandwidth, in storage systems (e.g., hard disks, RAID systems, Network Assistant Storage or NAS systems, Storage Area Networks or SANs, and other networked electromagnetic or optical-based data storage systems) to optimize the data transmission bandwidth and storage capacity, it is realized that it would be highly advantageous to create a universal, modular data optimization engine that can be easily and efficiently adapted to work with different protocols.

Generically speaking, for a data optimization engine to optimize a stream of data having a given protocol, certain issues need to be addressed in addition to the actual compression/decompression and/or encryption/decryption tasks themselves. To allow the data optimization engine to be universal, protocol adaptation, i.e., the translation of the data from the protocol received to one that can be understood by the optimization processor, needs to be performed. After the data is optimized by the optimization processor, the optimized data needs to undergo protocol adaptation again prior to outputting.

Data alignment and data parsing are also protocol-specific tasks that need to be handled differently for different data input protocols. Data alignment refers to the need to recognize and frame the incoming data properly with respect to some reference data frame as the incoming data is received. Data alignment facilitates data parsing, since efficient data parsing relies on the correct relative positioning of the various data fields within some reference data frame. For each data frame that can be optimized (since not all data frames are eligible for optimization), some portion of the optimizable data frame needs to be preserved while other portions can be optimized by the optimization processor. Data parsing separates the optimizable portion from the non-optimizable portion of the data frame so that the optimizable portion can be optimized by the optimization processor.

A related task is optimizable data handling, which refers to the need to reassemble the data frame, putting together the non-optimizable portion of the data frame with the optimizable portion after the optimization processor has finished its optimizing task. Optimizable data handling ensures that a properly reassembled data frame is presented at the output for transmission to the next hop or to the final destination. As mentioned, some incoming data frames may be non-optimizable, e.g., due to an explicit request from software or from some other higher layer in the communication stack. Bypass data handling needs to be performed on the incoming data to ensure that the data optimization engine will handle these non-optimizable data frames properly.

Another task is congestion control, which is used to ensure that the optimization processor is not overloaded if incoming data is received at the data optimization engine in rapid bursts. Congestion control gives the optimization processor time to complete its optimization task on a frame-by-frame basis while minimizing and/or eliminating the possibility of dropping incoming data frames if they arrive in rapid bursts. Yet another related task is traffic handling, which ensures that while data optimization takes place within the inline data optimization engine, the communication channel remains error-free. Traffic handling is used if the data optimization engine is to be transparent to the transmitting and receiving devices.

Since these tasks all need to be performed, and they are all different for different protocols, the challenge of creating a universal data optimization engine rests, in part, in the ability to innovatively section and modularize the data optimization engine and to innovatively arrange the various circuits therein in a manner such that when the data optimization engine needs to be reconfigured to work with a different protocol, the reconfiguration may be done quickly and efficiently and changes to the data optimization engine may be minimized.

In view of the foregoing, there are desired improved techniques and apparatus for optimizing the data transmission bandwidth in data buses and network transmission links, as well as for optimizing the storage capacity of temporary and permanent memory in electronic devices and computer networks.

SUMMARY

Various embodiments relate generally to a highly modularized, protocol-flexible data optimization engine for performing high speed, adaptive, in-line optimization (compression/decompression and/or encryption/decryption) of data using either hardware or software. The data optimization engine includes a transmit interface circuit that is protocol-flexible, a high speed optimization processor, and receive interface circuit that is also highly flexible with regard to the protocol on the transmission medium. The data optimization engine also implements, in one embodiment, a novel high speed adaptive compression technique that improves on the standard LZW compression.

One embodiment relates to a computer-implemented method for compressing a first stream of data, the first stream of data comprising a plurality of input words. The computer-implemented method includes receiving the plurality input words, and adaptively compressing the plurality of input words into a plurality of compression codes. The computer-implemented method further includes outputting the plurality of compression codes upon encountering an end-of-file signal in the first stream of data, wherein the plurality of compression codes are fewer in number than the number of unique bit patterns requiring unique compression codes under LZW (Lempel Ziv & Welch) compression.

In accordance with another aspect, a Content-Addressable-Memory (CAM) array is employed to store the code book, which is mirrored by a shadow RAM. The combination of CAM-based codebook and shadow RAM makes it possible to compress data at a high speed. In accordance with another aspect, the integrated circuit implementing the inventive HSO compression technique has at least two CAM arrays. The multiple CAM arrays are employed to store codebooks associated with consecutive data files in a round-robin manner. Thus, one CAM can be used to store the codebook associated with one input file while the other CAM is reset and prepared for storing the codebook associated with the next input file.

These and other features will be described in more detail below in the detailed description and in conjunction with the following figures.

BRIEF DESCRIPTION OF THE DRAWINGS

Various embodiments are illustrated by way of example, and not by way of limitation, in the figures of the accompanying drawings and in which like reference numerals refer to similar elements and in which:

FIGS. 8 and 9 depict how a data optimization engine may be employed in a communication network.

DETAILED DESCRIPTION

Various embodiments will now be described in detail with reference to a few examples thereof as illustrated in the accompanying drawings. In the following description, numerous specific details are set forth in order to provide a thorough understanding of the described embodiments. It will be apparent, however, to one skilled in the art, that the various described embodiments may be practiced without some or all of these specific details. In other instances, well known process steps and/or structures have not been described in detail in order to not unnecessarily obscure the described embodiments.

Figure 1:
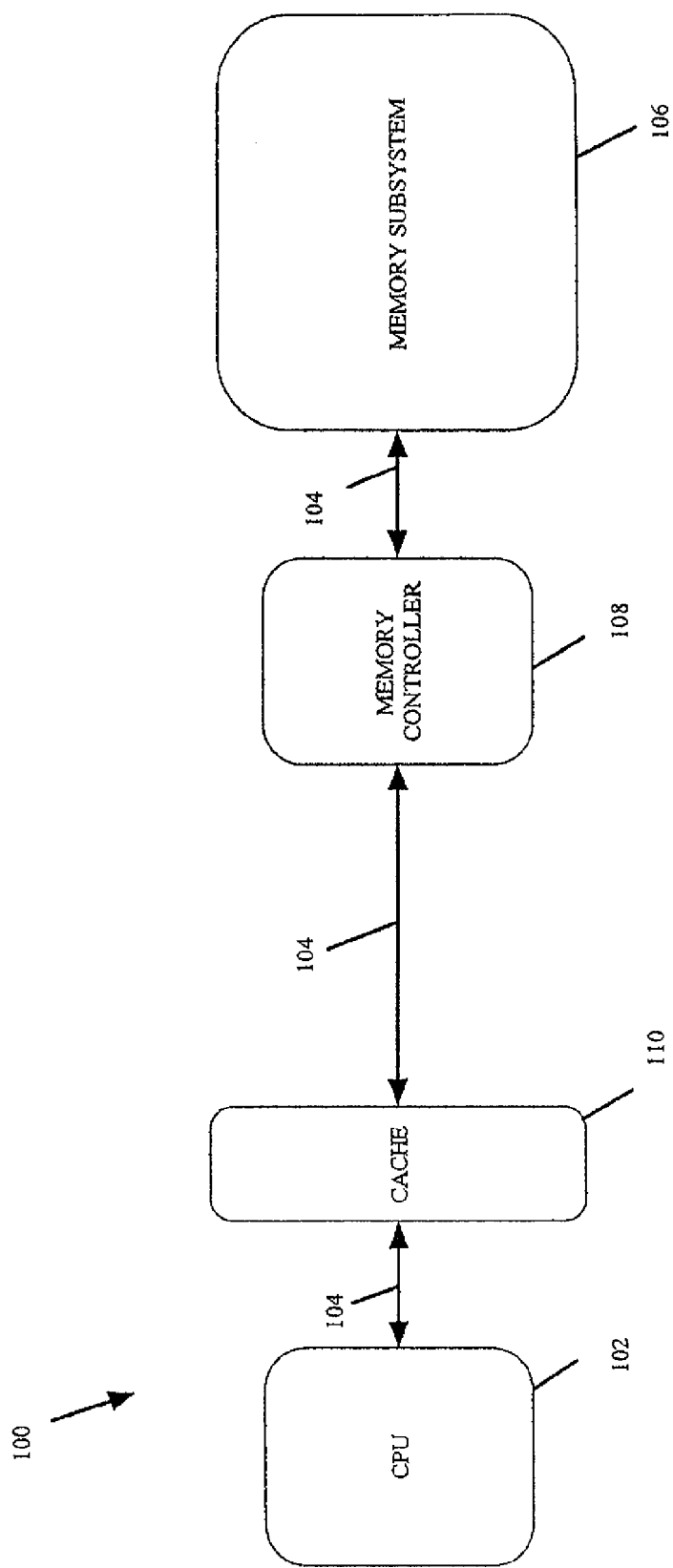
FIG. 1 shows simplified CPU, bus, and memory subsystems within an exemplary computer to facilitate discussion of the transmission bandwidth bottleneck issue therein.
Figure 2:
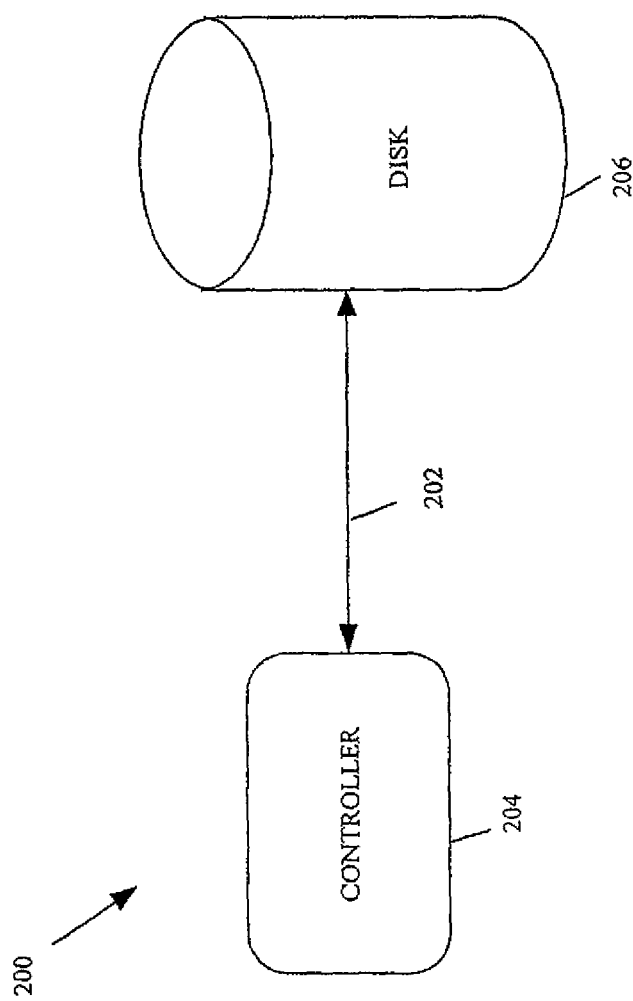
FIG. 2 is a simplified illustration of a portion of a data storage system to facilitate discussion of the transmission bandwidth bottleneck and capacity bottleneck issues therein.
Figure 3:
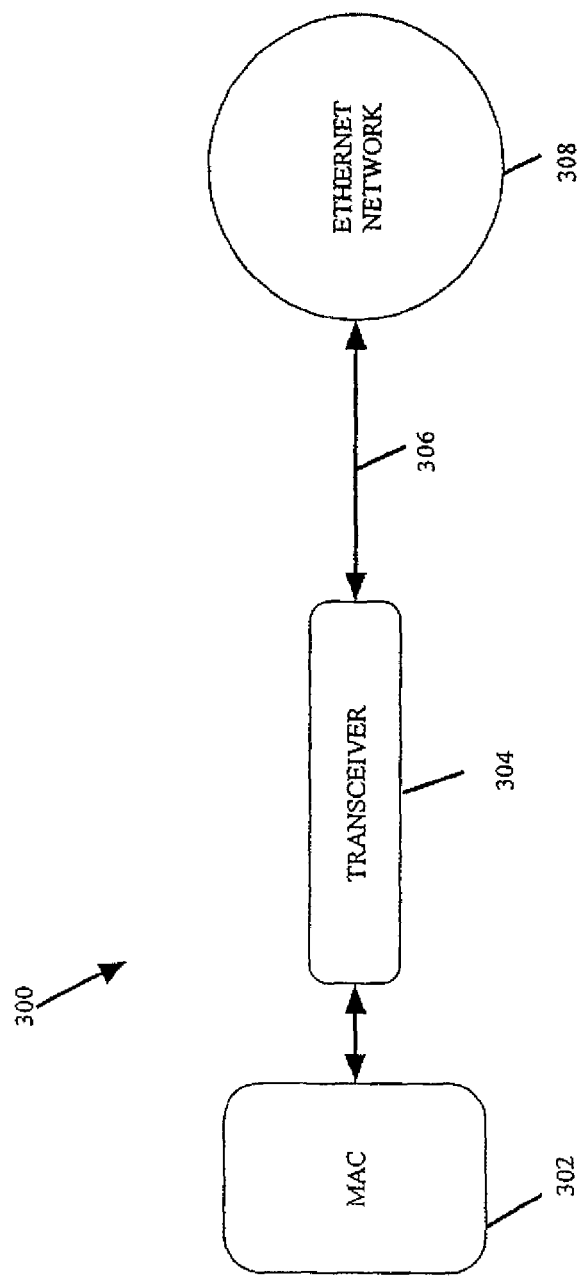
FIG. 3 illustrates, in a simplified format, various subsystems of a typical Ethernet-based network to discuss the bandwidth bottleneck issue therein.
Figure 4:
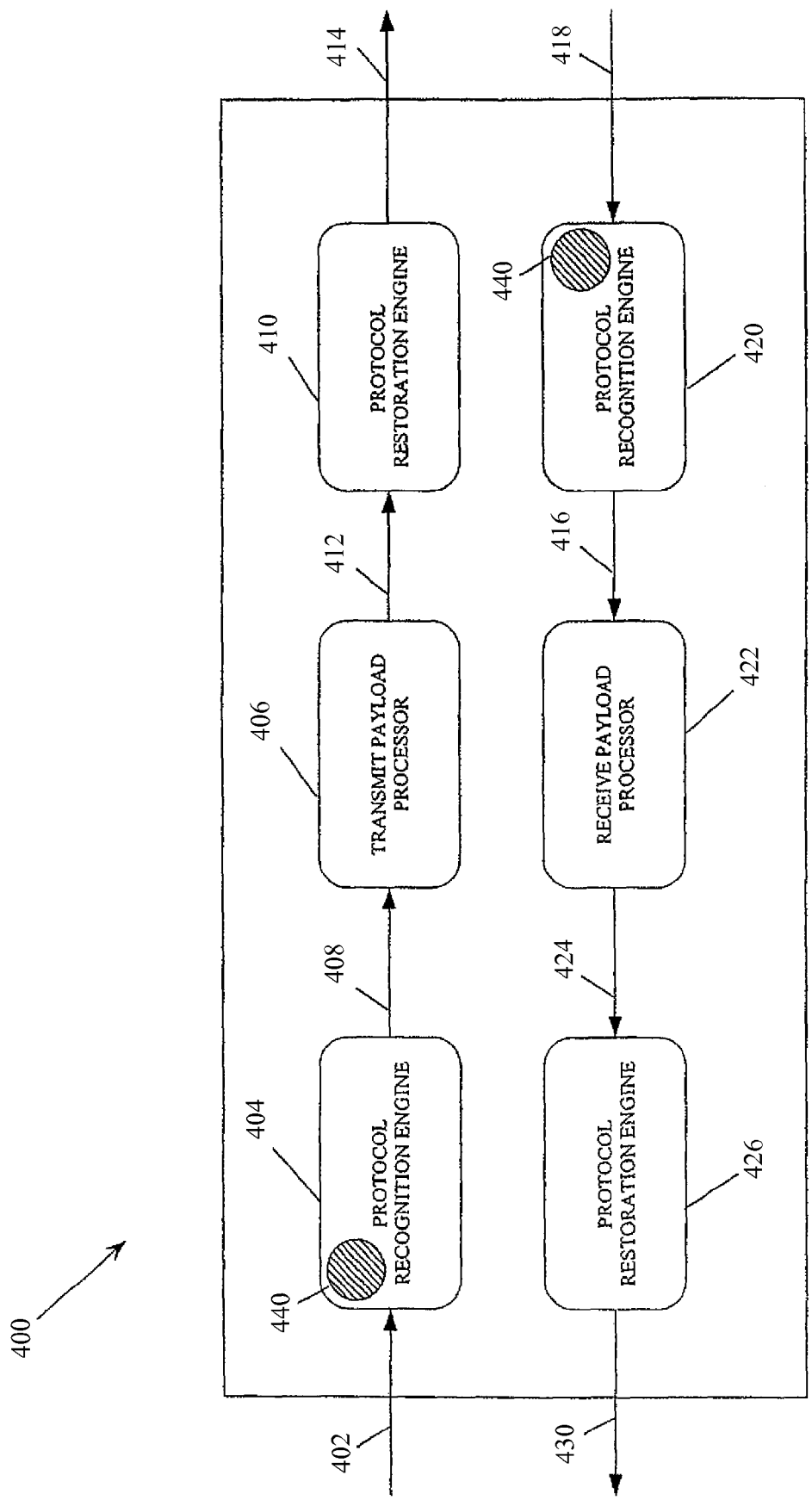
FIG. 4 shows, in accordance with one embodiment, a high level block diagram of the inventive data optimization engine.

FIG. 4 shows, in accordance with one embodiment, a high level block diagram of the inventive data optimization engine 400. Referring now to FIG. 4, the inventive data optimization engine includes three main logic blocks in each of the transmit and receive data paths. In the transmit data path, data input at a bus 402 is received by a protocol recognition engine 404. Protocol recognition engine 404, which is tailored to one or more specific protocols, serves to extract the payload from the input data, which is formatted in accordance with the dictates of the protocol employed. By way of example, data input at bus 402 may conform to the Peripheral Component Interconnect (PCI) interface, PCI-X interface (an extension of the PCI interface to enable higher speed), Infiniband (a high speed competing protocol to PCI), High Speed Serial Interface (HSSI), 10-bit interface (TBI, such as that developed under the guidance of the X3 technical committee of the American National Standards Institute), serial ATA (Serial AT attachment, an interface for coupling with storage devices), or the 64/66 protocol (which may be seen as either a derivative of the 10-bit protocol or an extension of the PCI protocol). Protocol recognition engine may also perform some or all of other tasks such as traffic handling, congestion control, data alignment, data parsing, optimizable data handling, and the like. These tasks are discussed in greater detail in connection with FIG. 17 herein.

FIG. 4 also shows block 440, representing the processing block that may be provisioned within protocol recognition engine 404 to handle higher layer or overlay protocols such as, for example, Ethernet (1/10/40 Gigabit), Fiber Channel (1/2/10 Gigabit), Extended Attachment Unit Interface (XAUI), or I-SCSI (a storage over Ethernet interface).

The payload extracted by protocol recognition engine 404 is then transmitted to a transmit payload processor 406 via a bus 408. In one embodiment, protocol recognition engine 404 also performs congestion management. That is, protocol recognition engine 404 manages the flow of data into transmit payload processor 406 to ensure that transmit payload processor is not overloaded. Additionally, protocol recognition engine 404 may also perform some level of bypass traffic management, such as detecting certain data frames or words that do not need to and/or should not be compressed and/or encrypted based on the information provided in the header. These data frames or words are then permitted to bypass transmit payload processor to proceed immediately to the output port.

At transmit payload processor 406, compression and/or encryption may be performed. Whether transmit payload processor 406 performs compression and/or encryption on a particular data block received from protocol recognition engine 404 depends on many factors, which will be discussed later herein. After compression and/or encryption, transmit payload processor 406 outputs the processed payload data onto a bus 412 to be transmitted to a protocol restoration engine 410. Since transmit payload processor 406 deals primarily with the payload portion of the data received on bus 402, it may be desirable to make the processed payload data transmitted from transmit payload processor 406 conform to the appropriate protocol for eventual transmission to another device. Thus protocol restoration engine 410 performs the appropriate processing and packaging on the processed payload data to render the processed payload data conformant to the protocol expected by the downstream device receiving such a device coupled to media 414 (which can be optical, wired, or wireless media).

In accordance with one advantageous embodiment, the protocol restoration engine 410 may in fact package the optimized payload data received from the transmit payload processor in a protocol different from the protocol associated with that of bus 402. For example, the data may employ the Fiber Channel protocol on bus 402 but may be packaged by protocol restoration engine 410 to be transmitted out on bus 414 using the Gigabit Ethernet protocol. In fact, any of the aforementioned protocols or a well-known protocol may be received and data optimization engine 400 may perform protocol translation in addition to or in place of optimization so that a different protocol, which may be any of the aforementioned protocols or another well-known protocol, may be sent out. Together, protocol recognition engine 404 and protocol restoration engine 410 may be thought of as the interface circuitry for transmit payload processor 406.

On the receive path, the protocol recognition engine 420 receives data from media 418 and performs payload extraction (and/or congestion management and/or bypass traffic management) and other tasks similar to those performed by protocol recognition engine 404 associated with the transmit path. The payload extracted is then transmitted to a receive payload processor 422 via a bus 416. Receive payload processor 422 then decrypts and/or decompresses the payload. Whether receive payload processor 422 performs decryption and/or decompression on a particular data block received from protocol recognition engine 420 depends on many factors, which will be discussed later herein. After decryption and/or decompression, receive payload processor 422 outputs the processed payload data onto a bus 424 to be transmitted to a protocol restoration engine 426. Since receive payload processor 422 deals primarily with the payload portion of the data received on media 418, it may be desirable to make the processed payload data transmitted from receive payload processor 422 conform to the appropriate protocol for eventual transmission to another device. Thus protocol restoration engine 426 performs the appropriate processing and packaging on the processed payload data to render the processed payload data conformant to the protocol expected by the device receiving such data from media 430 (which can be optical, wired, or wireless media). Again, protocol translation may occur on the receive path as well.

Figure 5:
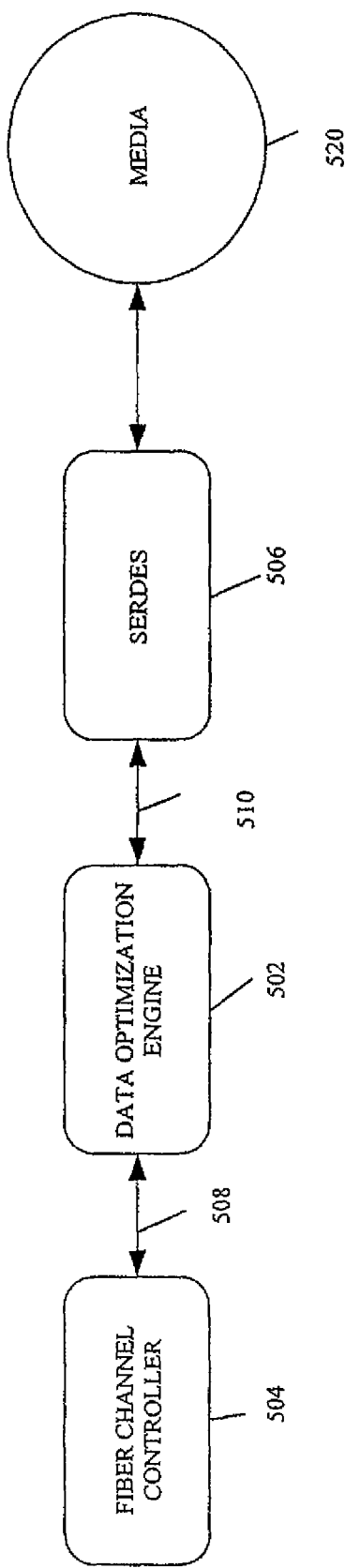
FIG. 5 shows, in accordance with one embodiment, how a data optimization engine may be deployed in a Fiber Channel setting.

To provide an example of how the data optimization engine of FIG. 4 may be employed, FIG. 5 shows, in accordance with one embodiment, how a data optimization engine 502 may be deployed in a Fiber Channel setting. In FIG. 5, the data optimization engine 502 is interposed between a Fiber Channel controller 504 and a SERDES (Serializer/Deserializer) 506 via 10-bit interface 508 and 510 respectively. This 10-bit interface implements the 10-bit encoding scheme to transmit information on the Fiber Channel link. Further information regarding the 10-bit encoding may be found in the text "Fibre Channel: A comprehensive Introduction" by Robert W. Kembel (Northwest Learning Associates, Inc., Tucson, Ariz., 2000), incorporated by reference herein. Fiber Channel controller 504 may, for example, be part of an I/O plug-in board or an integral part of a computer system.

Data received at Fiber Channel controller 504 is compressed and/or encrypted as appropriate in real time by data optimization engine 502 prior to being output to SERDES 506 for transmission over media 520. Data received from media 520 is decrypted and/or decompressed as appropriate by data optimization engine 502 prior to being output to Fiber Channel controller 504. It should be noted that although the Fiber Channel protocol is employed in the example of FIG. 5, other protocols such as some of those mentioned (e.g., Ethernet, Infiniband, XAUI) may well be implemented.

The data optimization engine may find use in many diverse applications where there is a need to increase the bandwidth of the transmission link, the memory/storage access speed and capacity, and/or a need for the ability to implement compression/encryption in a manner so as to guarantee compatibility with other devices irrespective whether those other devices implement the data optimization engine.

Figure 6:
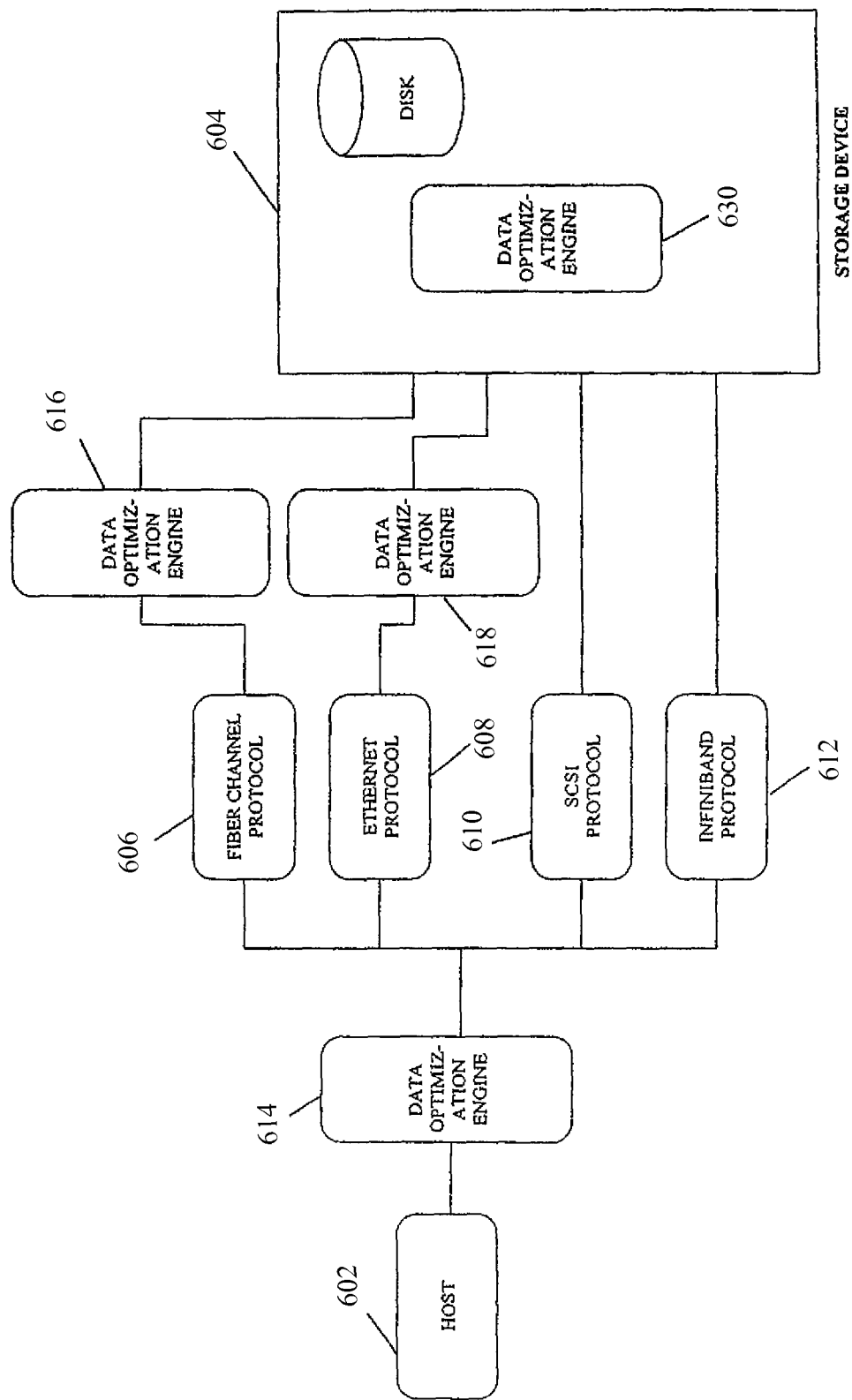
FIG. 6 depicts, in accordance with one aspect, how a data optimization engine may be employed to improve the performance of a data storage system.

FIG. 6 depicts, in accordance with one aspect, how a data optimization engine may be employed to improve the performance of a data storage system. In FIG. 6, there is shown a host device 602, which transmits data to and receives data from a storage device 604 using a suitable protocol. By way of example, FIG. 6 shows four exemplary interfaces 606, 608, 610, and 612, representing alternative interfaces for permitting host 602 to communicate with storage device 604 using the fiber channel protocol, the Ethernet protocol, the SCSI protocol, or the Infiniband protocol respectively.

The data optimization engine may be disposed at location 614, either as a separate device or integrated directly with host device 602. For manufacturers of processors or motherboards, this arrangement is useful to transparently improve I/O performance vis-a-vis storage device 604. Alternatively, the data optimization engine may be disposed at locations 616 and 618 to facilitate communication via the Fiber Channel or the Ethernet protocols. This arrangement is useful for peripheral device manufacturers, who may want to incorporate the advanced compression and encryption capabilities of the inventive data optimization engine without requiring changes in either host device 602 or storage device 604 (which may be manufactured by other parties). Alternatively, the data optimization engine may be integrated with storage device 604 (shown by reference number 630), thereby allowing storage device 604 to store more information and responds to memory requests in less time without requiring changes in either host device 602 or interfaces 606-612. Note that in general, only one data optimization engine is required (i.e., only one of data optimization engines 614, 616, or 618 is required) between host device 602 and storage device 604.

Figure 7:
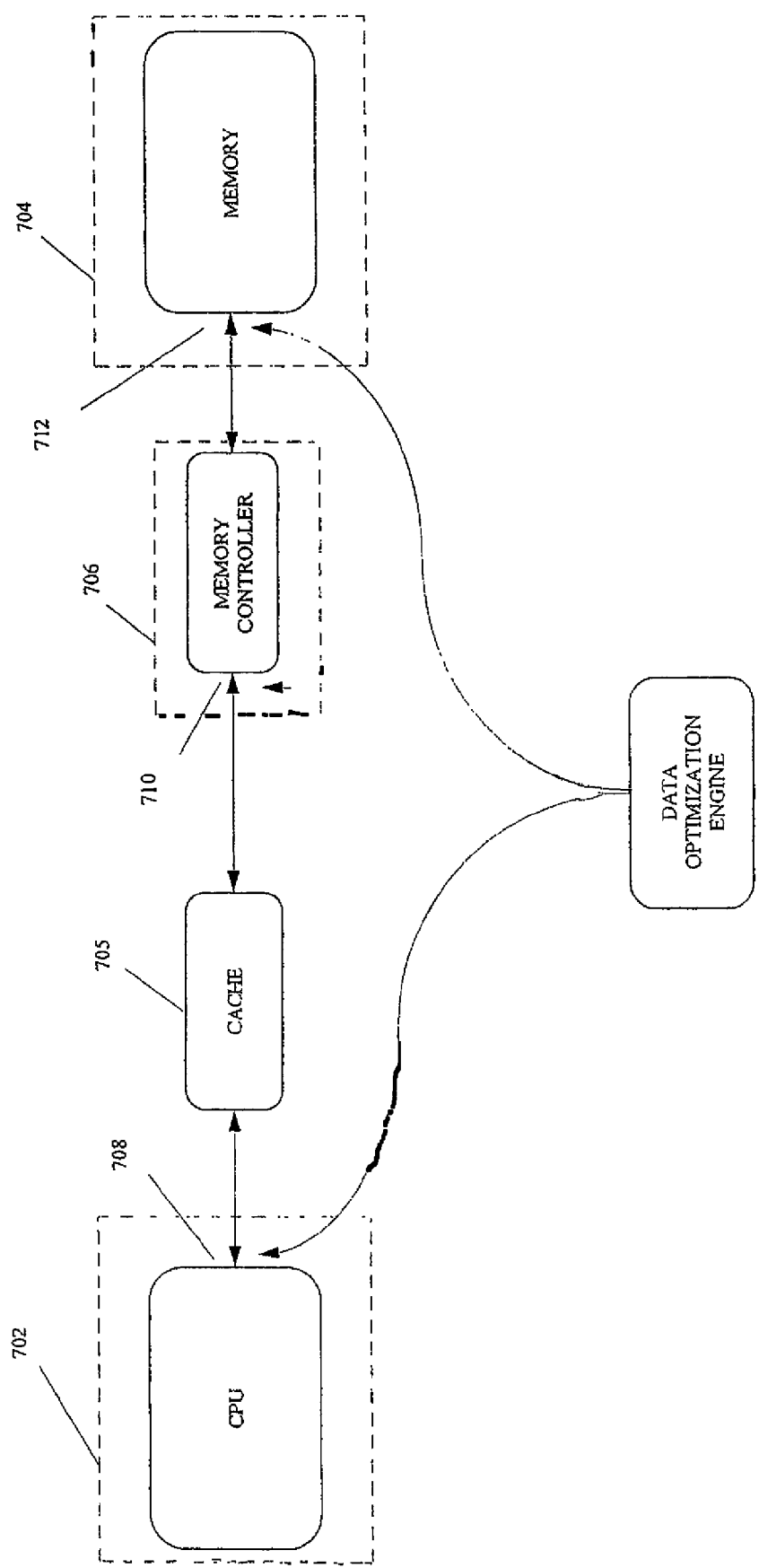
FIG. 7 depicts, in accordance with one aspect, how a data optimization engine may be employed to improve performance in a computer system when a CPU accesses its main memory.

FIG. 7 depicts, in accordance with one aspect, how a data optimization engine may be employed to improve performance in a computer system when a CPU accesses its main memory. In the case of FIG. 7, since data communication between a CPU 702 and a memory 704 occurs within a closed system, encryption is generally unnecessary. However, the encryption capability of the data optimization engine may be employed if encryption is deemed desirable (e.g., in highly secure systems or when the communication takes place over a networked link). With respect to FIG. 7, CPU 702, memory 704, cache 705, and memory controller 706 are conventional and generally communicate among themselves using a bus-based protocol or a high speed serial protocol. The data optimization engine may be disposed at a location 708, which is generally considered part of the CPU subsystem or even integrated within the die of the processor itself. This arrangement is highly advantageous for processor manufacturers looking for a competitive advantage since it permits the CPU to transparently and apparently improve the rate of data transfer between itself and memory 704, as well as to transparently and apparently increase the capacity of memory 704 as well as to implement encryption without taking up a significant amount of CPU processing resources, all without requiring changes in memory controller 706 or memory 704.

The data optimization engine may be disposed at location 710, i.e., between CPU 702 and memory controller 706. In one embodiment, the data optimization engine may be made part of the memory controller subsystem or integrated with one of the memory controller ICs. This arrangement is advantageous for memory controller manufacturers who wish to offer the ability to apparently increase the speed of data transfer between CPU 702 and memory 704 without requiring changes in memory 704, CPU 702, or cache 705. In the background, the data optimization engine compresses (and/or encrypts) the data before passing the processed data onward. The fact that the data is optimized means that fewer bits need to be transmitted between CPU 702 and memory 704. This increases, in an apparent manner, the transmission speed/bandwidth of the bus between CPU 702 and memory 704. Furthermore, fewer bits need to be stored in memory 704, which means that fewer memory cycles are needed to store/access the required data. This in turn also increases the speed, in an apparent manner, of memory access by CPU 702 for any given file. It should be pointed out that the apparent speed increase and bandwidth increase due to the fact that few bits need to be transmitted also apply in both the data storage system setting (e.g., FIG. 6) and in the networking setting.

The data optimization engine may be disposed at a location 712, i.e., as part of memory 704. This arrangement is advantageous for memory manufacturers, such as DRAM or RAM manufacturers or hard disk or optical drive manufacturers, to apparently increase the speed of data transfer between CPU 702 and memory 704 as well as to increase the apparent capacity of the physical memory without requiring changes in memory controller 706, CPU 702, or cache 705. In the background, the data optimization engine compresses the data before storing on the physical media to reduce the number of bits that need to be stored. Since the bottleneck to higher performance in permanent memory subsystems tends to be found in the relatively slow mechanical movement of the access arm (as in the case of hard disk drives) or the speed at which the bits can be recorded onto storage locations in the media (e.g., the speed at which the magnetic particles can be aligned to store information or the speed at which the optical media records information, or the speed at which the latches or capacitors may be able to store or read a bit of data), reducing the number of bits that need to be stored tend to increase the overall performance of memory 704 as well as apparently increase its capacity to store information.

FIGS. 8 and 9 illustrate, in accordance with one or more embodiments, how a data optimization engine may be employed to transparently and apparently increase the data transmission speed and bandwidth (i.e., carrying capacity) between networked devices (such as network interface cards, routers, or switches). In FIG. 8, a data optimization engine may be provided with each networked device in network 802. In this case, the payload data is compressed and/or encrypted for transmission prior to being transmitted on a network link in order to maximize the speed and bandwidth of the link, as well as to ensure data security (if encryption is performed). Thus, the payload data is compressed and/or encrypted by network interface card (NIC) 804 prior to being transmitted via link 806 to switch 808. At switch 808, the destination is looked up to ascertain the appropriate output port. If the destination device does not have the data optimization engine, the payload data may be decrypted and/or decompressed in switch 808. Thereafter, the data is transmitted out via link 810 to a router 812. At router 812, the destination is looked up to ascertain the appropriate output port. If the destination device does not have the data optimization engine, the payload data may be decrypted and/or decompressed in router 812 (unless decryption and/or decompression occurred already in switch 808). Thereafter, the data is again transmitted out via a link 814 to a NIC 816. At NIC 816, the data is decrypted and/or decompressed for use by a data optimization engine provisioned therein. If NIC 816 does not have a data optimization engine, the decryption and/or decompression occurs at one of the earlier nodes as discussed.

Since the data optimization engine of the various embodiments can transparently work with legacy networked devices, a NIC 822 or a switch 824 which does not have the data optimization engine built-in can also utilize switch 808 and router 812 to transmit data to and receive data from NIC 804 and 816. If the data received at switch 808 or router 812 is uncompressed and/or not encrypted, the inventive data optimization engine can perform encryption and/or compression, effectively upgrading the legacy networked devices up to the level of the upgraded network. Furthermore, if unencrypted/uncompressed date arrives at a NIC having therein the inventive data optimization engine, the data optimization engine therein simply does not perform decryption and/or decompression before passing the data on to its host. This is an advantage since it allows network 802 to be upgraded in a modular, gradual manner. In other words, one part of the network may be upgraded and be expected to work with other parts of the network, which contain legacy devices. This ability minimizes disruption to the network during upgrade cycles and gives network managers great flexibility in the provisioning of their networks.

FIG. 9 depicts a network 852 wherein switch 858 and router 862 are both legacy network devices without the data optimization capability. NICs 854 and 866 are, however, equipped with the inventive data optimization engine. The situation of FIG. 9 is often realized, for example, when two computers equipped with NICs having integrated therein the inventive data optimization engines communicate with one another via a public network. In this case, the ability to reduce the amount of data that needs to be transmitted (via compression) still yields advantages since such optimization apparently improves the speed of data transfer between NICs 854 and 866 (since fewer bits need to be transmitted for a given amount of information) and the carrying capacity of links 856, 860, and 864. Encryption increases the security of the data transmitted, which is also a consideration when data is transmitted/received over computer networks.

Note that when only one of NIC 854 or NIC 866 is equipped with the data optimization capability and the other is not, data transmission is still possible. In this case, the switch or router device equipped with the data optimization capability simply receives the uncompressed (and/or nonencrypted) data and passes such data transparently through the data optimization engine. Prior to retransmission of the data on the output port of that switch or router, the payload data may be compressed and/or encrypted to transparently improve the transmission speed or network capacity or data security. In one embodiment, however, a field may be employed in the header portion of the received data that informs switch 858 or router 862 that the payload data should not be compressed and/or encrypted (as in the case wherein the receiving NIC does not have the ability to decrypt and/or decompress).

In yet another embodiment, the networked devices at the edge of the network (e.g., the Label Edge Routers or LER in a MPLS network) are all equipped with data optimization engines to permit the all data transferred among nodes of the network to be compressed and/or encrypted irrespective whether the sending and/or receiving NICs have the ability to encrypt/decrypt (and/or compress/decompress). Thus, the payload data is compressed and/or encrypted once at the input edge of the network and decrypted and/or decompressed again at the output edge of the network. In between, the payload data is in its compressed and/or encrypted form to yield the bandwidth/speed-enhancing advantages and/or the security advantages.

In yet another embodiment, only the routers or switches at the edge of the network for a given data flow perform the compression/decompression and/or encryption/decryption even though the network nodes in between may also be provisioned with the inventive data optimization engines (which can perform the compression/decompression and/or encryption/decryption for other data flows). In this case, the data frames or blocks may be marked with a flag (e.g., in the header) so as to insure that compression/decompression and/or encryption/decryption cycle only takes place once through the network. This is an advantage in heterogeneous networks (such as the Internet) where no single entity may control the various end-to-end paths through which various data flows are expected to traverse.

Irrespective of the specific implementation, the inventive data optimization engine allows network providers to apparently increase the speed of data transmission among the nodes of the network, as well as apparently increase the capacity of the network links, as well as increase the data security among the network nodes without requiring an upgrade to all the NICs and/or all network nodes to those capable of compression/decompression and/or encryption/decryption.

Figure 10:
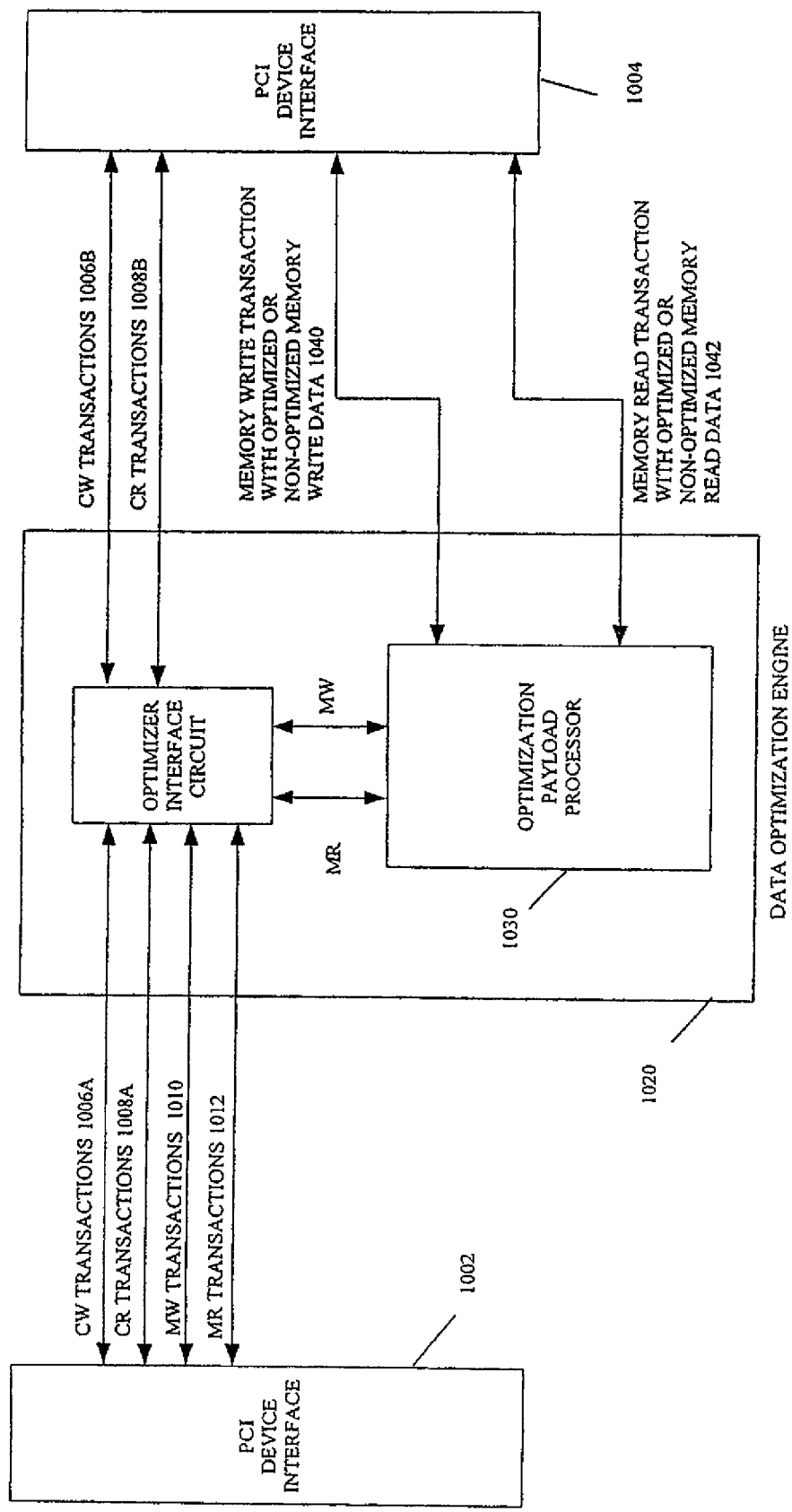
FIG. 10 shows, in accordance with one embodiment, an arrangement whereby the inventive data optimization engine is interposed between two PCI devices in an extended PCI (PCI-X) system.

FIG. 10 shows, in accordance with one embodiment, an arrangement whereby the inventive data optimization engine is interposed between two PCI devices 1002 and 1004 in an extended PCI (PCI-X) system. In a PCI-based system, a PCI device may either be a PCI master or a PCI target, depending on the type of communication that takes place between itself and one or more other PCI devices.

For discussion purposes, there are two broad types of transaction that PCI device 1002 may wish to initiate vis-a-vis PCI device 1004. PCI device 1002 may write configuration data to PCI device 1004 via the CW (configuration write) transaction 1006A. In this case, data, address, signaling, and other types of information pertaining to configuration would be sent from PCI device 1002 and received and/or acknowledged by PCI device 1004. Likewise, PCI device 1002 may receive configuration information from PCI device 1004 via the CR (configuration read) transaction 1008A. Again, in this CR transaction, data, address, signaling, and other types of information pertaining to configuration would be sent from PCI device 1004 and received and/or acknowledged by PCI device 1002. Configuration read transactions may be initiated by either PCI device 1002 or PCI device 1004 to enable PCI device 1002 to receive configuration data.

Memory Write (MW) transaction 1010 and Memory Read (MR) transaction 1012 are two other types of transaction between PCI device 1002 and PCI device 1004. In MW transaction 1010, PCI device 1002 writes one or more blocks of data to PCI device 1004 at certain address locations. In addition to clocking and signaling data, both the address and data are specified. In MR transaction 1012, PCI device 1002 requests one or more blocks of data from PCI device 1004. Again, in addition to clocking and signaling data, both the address and data are specified.

As shown in FIG. 10, a data optimization engine 1020 is interposed inline between PCI device 1002 and PCI device 1004 and monitors the transactions between these two devices. Configuration transactions are passed through data optimization engine 1020 substantially transparently without significant processing. In FIG. 10, these CW transaction 1006A and CR transaction 1008A are shown passing substantially transparently through data optimization engine 1002 as are CW transaction 1006B and CR transaction 1008B.

Memory write transactions MW 1010, on the other hand, are examined by optimization processor 1030 for possible encryption and/or compression. If encryption and/or compression are appropriate for this data, the data to be written to PCI device 1004 is encrypted and/or compressed (shown by reference number 1040) prior to being transmitted to PCI device 1004.

Conversely, memory read transactions 1012 are also examined by optimization processor 1030 for possible decryption and/or decompression. If decryption and/or decompression are appropriate (shown by reference number 1042), the data to be written from PCI device 1004 to PCI device 1002 is decrypted and/or decompressed prior to being transmitted to PCI device 1002.

Within the optimization processor, there are two engines: a compression engine and a decompression engine. In one embodiment, at the output side the compression engine, there is provided a packer in order to receive the compression output, which comes from the compression engine from time to time, and packs those compression output as a continuous stream in groups of n, with n being the number of bits required by the interface circuitry. Thus, the packer is flexible with regard to the number of bits of data that it packs into. For example, the 3-bit code output is received by the packer from time to time as output by the compression engine, and is packed by the packer into groups of two, assuming 2 is the number of bits required by the interface circuitry.

At the input side of the decompression engine, there is provided a corresponding unpacker, which receives from the packer associated with the compressor continuous streams of data in groups of n, with n being the number of bits employed by the interface circuitry. In this case, the unpacker then unpacks this stream of bits into the compressed code having a size corresponding to the size of the compressor output code. In the previous example, the unpacker would receive a stream of compressed data in groups of two and unpacks this stream into 3-bit codes to be fed to the decompressor.

If the packing results in a partial group, then padding may be needed. For example, if the compression output code is 11 bits and the interface circuitry requires 8 bits, the receipt of 3 compression output codes is 33 bits of data. Packing 33 bits of data into groups of 8 will result in a partial group. In one embodiment, padding is performed so that the number of bits, including the pad, is a multiple of n (or a multiple of 8 in this example). Thus, another 7 bits will be padded. In another embodiment, this is solved by padding the 33 bits up to a group size that is equal to the size of the compression output code multiplied by the size of the group output by the packer. In this example, this group size is 88 bits (or 11 bits.times.8 bits). In other words, 55 bits are padded. The unpacker then looks at each 88-bit group that comes in, and in any 88-bit group that contains the EOF, the padding that comes after the EOF is ignored.

Figure 11:
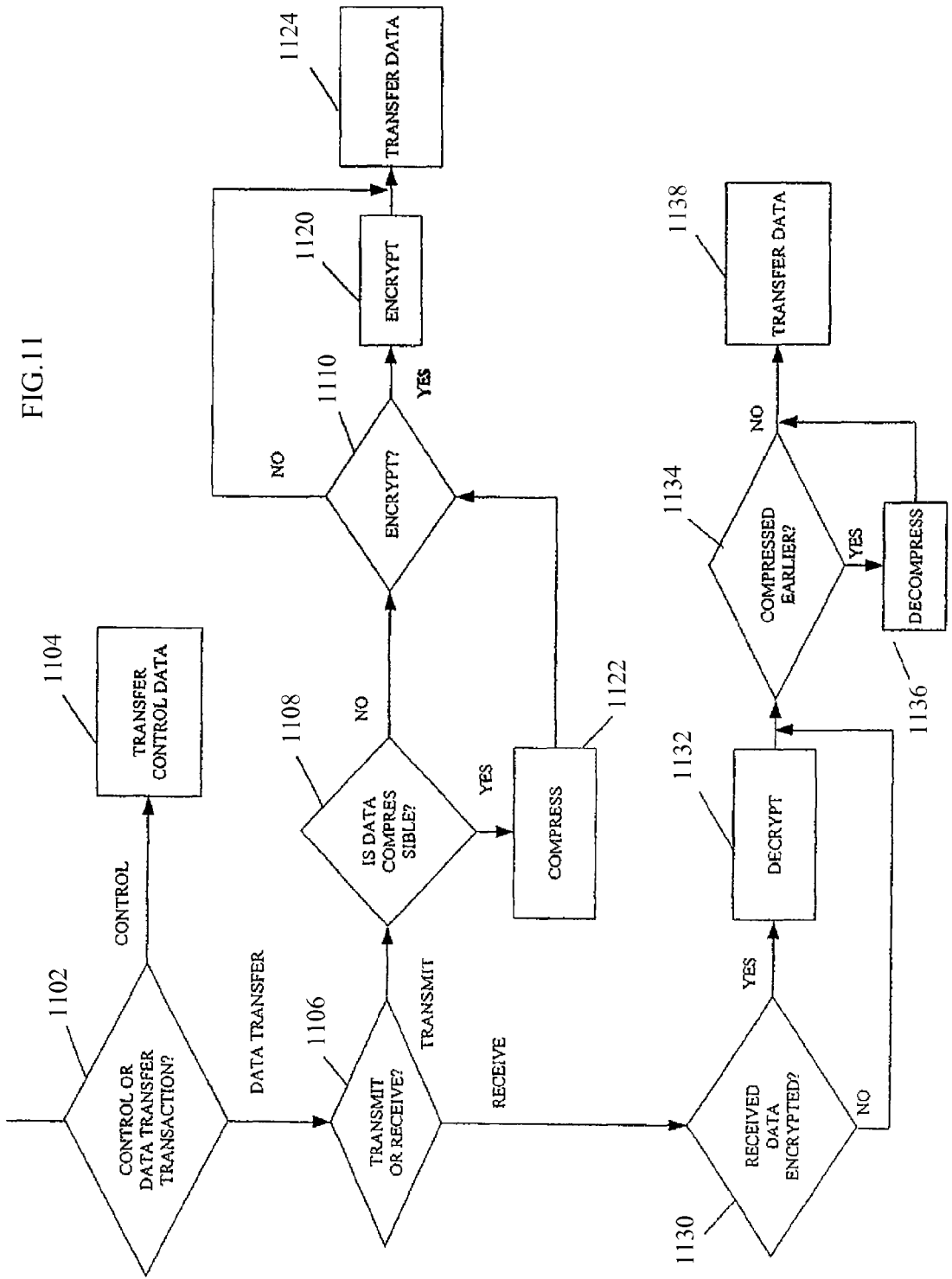
FIG. 11 shows, in a logic diagram format, the logic functions of a data optimization engine in accordance with one embodiment.

FIG. 11 shows, in a logic diagram format, the logic functions of data optimization engine 1020 in accordance with one embodiment. In block 1102, the method first decides whether the transaction under consideration is a control transaction or a data transfer. If the transaction under consideration is a transaction other than a data transfer, the method proceeds to block 1104 to pass the transaction substantially transparently through the data optimization engine. On the other hand, if the transaction is a data transfer transaction, the method proceeds to block 1106. One skilled in the art should readily appreciate that the discussion also applies to other types of data transfer transactions, such as data transmission inside a computer system or between a computer and its storage device(s).

In block 1106, it is ascertained whether the data transfer transaction under consideration is a transmit transaction or a receive transaction. In general, receive data appears on the receive data input port; transmit data appears on the transmit data input port. If a transmit transaction is detected, the method proceeds to block 1108 to ascertain whether the data therein is compressible. In one embodiment, the header can be analyzed to see if the data is already compressed, or if the data is of a type that cannot be compressed. This may be indicated via one or more fields in the header. By way of example, the Fiber Channel header typically has one or more fields to indicate such information. Alternatively or additionally, this information may be provided by higher level software in a pre-determined field. If the examined transmit data contains non-compressible data, compression is not performed and the data is immediately passed to block 1110 to ascertain whether encryption should be performed.

In block 1110, the decision whether to encrypt may be based on whether an encryption key is detected. In most public key transcription schemes, a key is typically present if encryption is desired. Of course there exist other ways to detect whether encryption is desired, depending on the encryption scheme employed (such as, e.g., flagging in an appropriate field in the header of the data frames). If encryption is desired (as ascertained in block 1110), the method proceeds to block 1120 to encrypt. After encryption, the encrypted data is passed to block 1124 to transfer out. On the other hand, if encryption is not desired (as ascertained in block 1110), the method bypasses the encryption block 1120 and proceeds directly to block 1124 to transfer the data out.

If the transmit transaction under consideration contains compressible data (as ascertained in block 1108), the method proceeds to block 1122 to perform compression. Thereafter, the compressed data is passed onto block 1110 to decide whether encryption should also be performed. If encryption is desired (as ascertained in block 1110), the method proceeds to block 1120 to encrypt. In general, any encryption technique may be employed. In one embodiment, encryption is performed using 118-bit AES public key encryption. However, since the inventive data optimization engine performs compression prior to encryption, even lower powered encryption schemes (e.g., 64-bit public key) may be employed with a high degree of confidence since the combination of compression and subsequent encryption renders the encrypted data much more difficult to break than encryption alone. This is an advantage since it is not possible in some markets, due to governmental restrictions or other administrative restrictions, to employ a high-powered encryption scheme.

Thereafter, the encrypted data is passed to block 1124 to transfer out. On the other hand, if encryption is not desired (as ascertained in block 1110, the method bypasses the encryption block 1120 and proceeds directly to block 1124 to transfer the data out.

As can be seen, when data transmit transaction is under consideration, the data optimization engine, in real time, decides whether to compress. Irrespective whether compression is performed, another independent decision is made whether to encrypt. There is thus a great deal of flexibility with regard to how data may be treated prior to being sent onward to the receiving device/interface.

On the other hand, if the data transfer transaction is a receive transaction (as ascertained in block 1106), the method proceeds to block 1130 to ascertain whether the data received was encrypted earlier. In one embodiment, the information pertaining to whether a data frame in a data block was encrypted may be stored using a bit in the header of the data frame (e.g., a SONET or Ethernet header). Alternatively or additionally, the information pertaining to whether a data frame or a data block (which comprises multiple data frames) was encrypted may also be stored in a table/database associated with a data storage device during a data write transaction to that data storage device. This table/database is then consulted during a data retrieval transaction to determine whether encryption was involved. In yet another embodiment, encryption is ascertained by detecting whether a key is present with the data frame or data block associated with the memory read transaction (assuming a public key encryption scheme).

If the data associated with the receive transaction is encrypted data, the method proceeds to block 1132 to decrypt the data block received. Thereafter, the method proceeds to block 1134 to ascertain whether the data was compressed earlier. On the other hand, if the data associated with the receive transaction is non-encrypted data, the method bypasses block 1132 and proceeds directly to block 1134 (which ascertains whether the data associated with the memory transaction was compressed).

In one embodiment, each data frame in the block is marked with a bit that flags whether that data frame contains compressed data. By way of example, this bit may be in the header of the data block itself (such as the Ethernet or SONET header). In another embodiment, the information pertaining to whether a data block contains compressed data is stored in a table or database in the memory storage device (e.g., hard drive). During a transmit transaction, the table is updated if the data block stored contains compressed data. Responsive to the data retrieval request, the table/database is then consulted to ascertain whether the requested data was compressed earlier.

If the data block was compressed (as ascertained by block 1134), the method proceeds to block 1136 to decompress the data block. After decompression, the method proceeds to block 1138, representing the I/O block to output the data to the device that requested it. On the other hand, if the data block was not compressed earlier, the method bypasses block 1136 to proceed directly to block 1138 to output the data to the device that requested it.

As can be seen, when a data receive is under consideration, the data optimization engine, in real time, decides whether the data was compressed earlier and to decompress if needed. Uncompressed data transparently bypasses the decompression logic of the inventive data optimization engine. Irrespective whether decompression is performed, another independent decision is made whether to decrypt. In this manner, the inventive data optimization engine is highly flexible and fully compatible with other subsystems/devices that do not have compression and/or encryption capabilities in that data from those devices may bypass the decompression/decryption logic of the data optimization engine. This flexibility permits the data optimization engine to be employed to upgrade a computer network in a modular, gradual fashion since the flexibility in working with both compressed and uncompressed data, as well as with encrypted and un-encrypted data, permits the network devices that implement the inventive data optimization engine to interoperate smoothly with other legacy and upgraded network devices. This flexibility also permits the data optimization engine to be employed to upgrade a computer system or a data storage system in a manner so as to minimize the number of changes required in the various subsystems of the computer system or the data storage system, since the flexibility in working with both compressed and uncompressed data, as well as with encrypted and un-encrypted data, permits the subsystems that implement the inventive data optimization engine to interoperate smoothly with other legacy or off-the-shelf subsystems of the computer system or data storage system.

In accordance with another aspect, there is provided an inventive High Speed Optimized (HSO) compression/decompression technique to enable the data optimization engine to perform high speed, in-line adaptive loss-less compression/decompression. To facilitate discussion of the inventive HSO compression/decompression technique, some background discussion on LZW compression may be in order first.

LZW compression is the compression of a file into a smaller file using a table-based lookup algorithm invented by Abraham Lempel, Jacob Ziv, and Terry Welch. A particular LZW compression algorithm takes each input sequence of bits of a given length (for example, 12 bits) and creates an entry in a table (sometimes called a "dictionary" or "codebook") for that particular bit pattern, consisting of the pattern itself and a shorter code. As input is read, any pattern that has been read before results in the substitution of the shorter code, effectively compressing the total amount of input to something smaller. The LZW algorithm does include the look-up table of codes as part of the compressed file. However, one particularly useful feature of LZW compression/decompression is that it is capable of building the table (i.e., dictionary or codebook) on the fly during decompression. That is, the decoding program that uncompresses the file is able to build the table itself by using the algorithm as it processes the input compressed data. An explanation of the LZW algorithm may be found in Mark Nelson's "LZW Data Compression" from the October, 1989 issue of Dr. Dobb's Journal (2800 Campus Drive, San Mateo, Calif www.ddj.com). Further details regarding LZW compression may be found, for example, in the article "A Technique for High Performance Data Compression," Terry A. Welch, IEEE Computer, 17(6), June 1984, pp. 8-19 (all of the above articles are incorporated herein by reference).

Further, LZW compression is highly adaptable to any type of input data. It is this adaptability of LZW that renders it highly useful as a starting point for the compression engine employed in the various described embodiments. Many other data compression procedures require prior knowledge, or the statistics, of the data being compressed. Because LZW does not require prior knowledge of the data statistics, it may be utilized over a wide range of information types, which is typically the requirement in a general purpose data optimization engine.

LZW, as an algorithm for compression, is known in the art. An example of known LZW compression/decompression in operation is discussed below. Suppose the input string /WED/WE/WEE/WEB needs to be compressed using LZW.

TABLE 1

Example of standard LZW compression.

| Character input | Code output | New code value and associated string |
|---|---|---|
| /W | / | 256 = /W |
| E | W | 257 = WE |
| D | E | 258 = ED |
| / | D | 259 = D/ |
| WE | 256 | 260 = /WE |
| / | E | 261 = E/ |
| WEE | 260 | 262 = /WEE |
| /W | 261 | 263 = E/W |
| EB | 257 | 264 = WEB |
| <END> | B | |

In this example, LZW starts with a 4K dictionary, of which entries 0-255 refer to individual bytes, and entries 256-4095 refer to substrings. This type of dictionary is useful for text compression, for example. Each time a new code is generated it means a new string has been parsed. New strings are generated by appending the current character K to the end of an existing string w.

The algorithm for LZW compression is as follows:

```
set w = NIL
loop
    read a character K
    if wK exists in the dictionary
        w = wK
    else
        output the code for w
        add wK to the string table
        w = K
end loop
```

A sample run of LZW over a (highly redundant) input string can be seen in the Table 1 above. The strings are built up character-by-character starting with a code value of 256. LZW decompression takes the stream of codes and uses it to exactly recreate the original input data. Just like the compression algorithm, the decompressor adds a new string to the dictionary each time it reads in a new code. All it needs to do in addition is to translate each incoming code into a string and send it to the output.

A sample run of the LZW decompressor is shown in below in Table 2. Using the compressed code /WED<256>E<260><261><257>B as input to decompressor, decompression yields the same string as the input to the compressor above.

TABLE 2

Example of standard LZW decompression.

| Input code | Output string | New code value and associated string |
|---|---|---|
| / | / | |
| W | W | 256 = /W |
| E | E | 257 = WE |
| D | D | 258 = ED |
| 256 | /W | 259 = D/ |
| E | E | 260 = /WE |
| 260 | /WE | 261 = E/ |
| 261 | E/ | 262 = /WEE |
| 257 | WE | 263 = E/W |
| B | B | 264 = WEB |

As can be seen, one remarkable feature of LZW compression is that the entire dictionary has been transmitted to the decompressor without actually explicitly transmitting the dictionary. At the end of the run, the decompressor will have a dictionary identical to the one the encoder has, built up entirely as part of the decoding process.

The above discussion relates to the known LZW compression algorithm. To optimize the compression for use in the data optimization engine, in accordance with one or more embodiments, several improvements are added. In one embodiment, to minimize the size of the dictionary and the time spent looking up the dictionary, various embodiments can limit the number of different output codes to a fixed number. In other words, whereas the standard LZW compression algorithm assumes that there would be a sufficient number of output codes to represent each unique bit pattern in the dictionary, at least one embodiment is optimized to guarantee correct compression and decompression even if there are far fewer output code values than the number of unique bit patterns requiring storage in the dictionary.

One disadvantage with storing one unique compression output code with each unique bit pattern in the dictionary is that for a universal data optimization engine, it is often not known in advance what type of data would be encountered, how compressible the input data would be, and thus how many unique bit patterns may be encountered. In such as case, the known LZW algorithm would require one to overprovision the dictionary, i.e., to allot a sufficient large number of code values and a sufficiently large amount of storage space so as to ensure that there is a unique code for each unique bit pattern to be stored into the table for all types of data that may be encountered.

However, the challenge with limiting the number of output codes and the size of the dictionary is that there exists a risk that the number of unique bit patterns encountered would exceed the number of output codes provided. When the number of unique bit patterns that need to be stored in the dictionary exceeds the number of output codes in the dictionary, known LZW compression techniques break down, as far as the inventor is aware. Yet, limiting the number of output codes and the size of the dictionary is often the key to keeping the memory size to a reasonable number and the dictionary search time low to enable real-time operation and/or to make a universal data optimization engine.

In accordance with one aspect, there is provided an adaptive High Speed Optimized (HSO) compression technique that addresses the need for a high speed, low memory usage, adaptive compression technique, and which can be implemented in hardware for high speed, in-line operation, or in software for portability. The inventive HSO compression technique in accordance with one embodiment may be better understood with reference to Table 3 and FIG. 12 herein.

TABLE 3

Example of inventive HSO compression.

| Row No. | Input character (2 bits) | Bit Pattern to Search (3 bits + 2 bits) | Counter Value (3 bits) | CAM content (3 bits) | CAM address (5 bits) | Code Output (3 bits) | Note |
|---|---|---|---|---|---|---|---|
| R1 | 1a | | | | | | |
| R2 | 1b | 1a1b | 4 | 4 | 11 | 1a | |
| R3 | 1c | 1b1c | | | | | |
| R4 | 1d | 41d | 5 | 5 | 41 | 4 | |
| R5 | 1e | 1d1e | | | | | |
| R6 | 1f | 41f | | | | | |
| R7 | 1g | 51g | 6 | 6 | 51 | 5 | |
| R8 | 1h | 1g1h | | | | | |
| R9 | 1i | 41i | | | | | |
| R10 | 1j | 51j | | | | | |
| R11 | 1k | 61k | 7 → 4 | 4 | 61 | 6 | The CAM address 11, which previously stored the value 4 (Row R2) is now freed up |
| R12 | 1L | 1k1L | 5 | | | 1k | Special Case |
| R13 | 1m | 1L1m | 6 | | | 1L | Special Case |
| R14 | 1n | 1m1n | 7 → 4 | | | 1m | Special Case |
| R15 | 1o | 1n1o | 5 | | | 1n | Special Case |
| R16 | 1p | 1o1p | 6 | 6 | 11 | 1o | The CAM address 51, which previously stored the value 6 (Row R7) is now freed up |
| R17 | 0q | 1p0q | 7 → 4 | 4 | 10 | 1p | The CAM address 61, which previously stored the value 4 (Row R11) is now freed up |
| R18 | 1r | 0q1r | 5 | 5 | 01 | 0q | |
| R19 | 1s | 1r1s | | | | | |
| R20 | 1t | 61t | 6 | 6 | 61 | 6 | The CAM address 11, which previously stored the value 6 (Row R16) is now freed up |
| R21 | 1u | 1t1u | 7 → 4 | | | 1t | Special Case |
| R22 | 1v | 1u1v | 5 | 5 | 11 | 1u | |
| R23 | EOF | 1v | | | | 1v | |
| R24 | | | | | | EOF | |

In the example of Table 3, the input pattern is as shown in rows R1-R22, with row R23 having the special input EOF, which marks the end of the input file. Each input "character" is assumed to be two bits (and thus can have the value of 0, 1, 2, or 3). Since 3 is the maximum value of the input character, the value 4 is selected to be the first counter value representing the smallest code output from the dictionary. It should be apparent that any value higher than 3 can be chosen as the smallest code output from the dictionary, albeit with some loss of efficiency since a larger number of bits will be required to represent a larger output code value.

To illustrate the ability of the present inventive technique to compress and decompress with only a limited number of output code values to save memory, the number of bits of the output code value will be artificially constrained to be 3 and the maximum value to 6. The value 7 (the largest value that can be produced using 3 bits) is used, in this example, to represent the EOF flag in the output stream to be sent to the decompressor. Thus, there are only 3 additional output code values (i.e., 4, 5, and 6), other than the input characters and the EOF flag, that will be in the compressed output stream. As can be appreciated by one skilled in the art, this allows the content addressable memory dictionary (or a dictionary implemented in any other type of memory technology) to be vastly reduced in size and also substantially simplifies the process of searching through the dictionary for a matching bit pattern.

In the example of Table 3, the input sequence is 1,1,1,1,1, 1,1,1,1,1,1,1,1,1,1,1,0,1,1,1,1,1,EOF. To simplify understanding, the input characters are given subscripts (a-v) to aid the reader in tracking the explanation through the table. It is to be understood that these subscripts (a-v) are present only to aid the reader in understanding the example of Table 3; these subscripts are not present in the stream of data. Also, two temporary string variables CharIn1 and CharIn2 are employed in FIG. 12 to track the input and output values when stepping through the compression technique.

Figure 12:
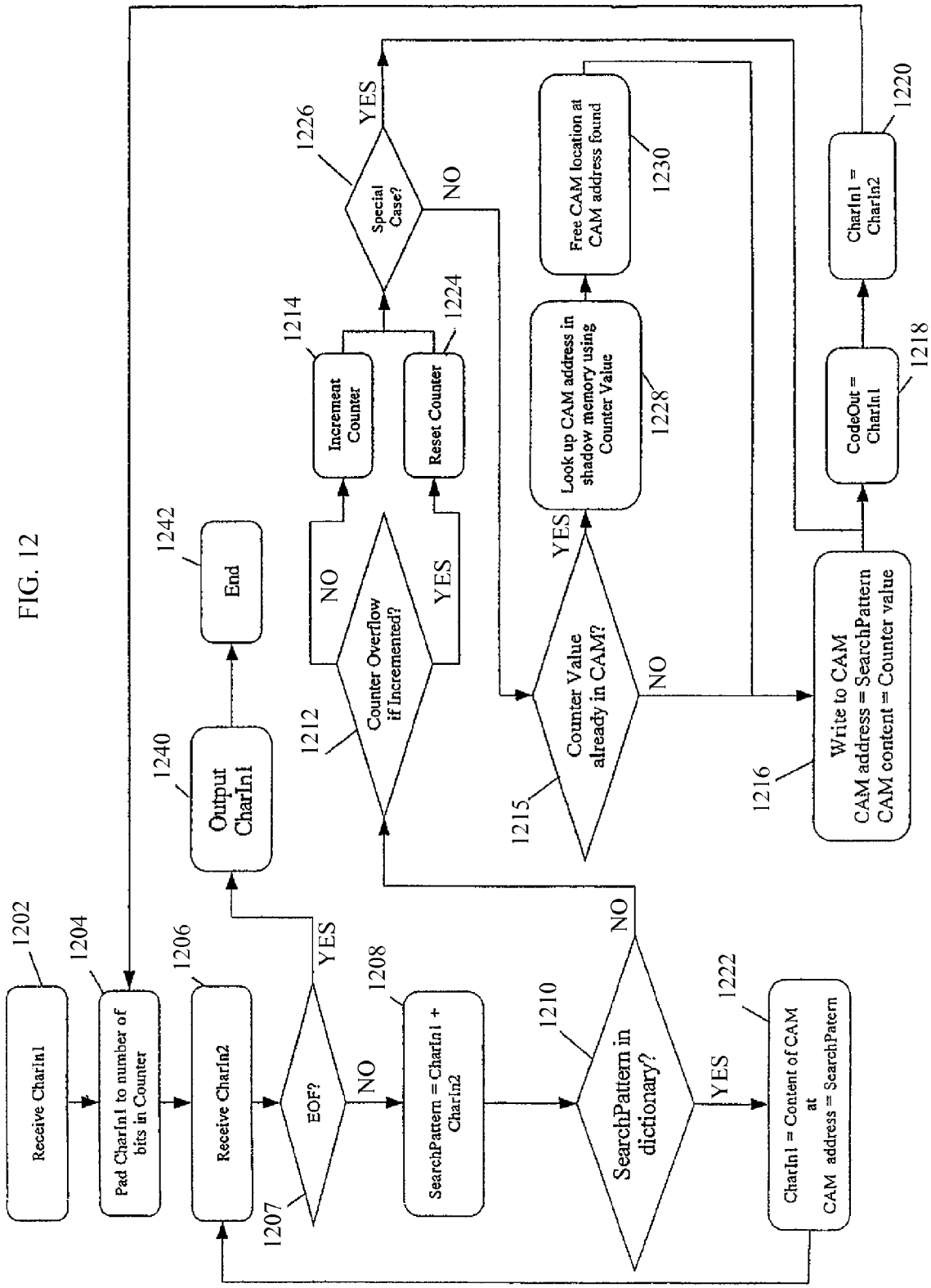
FIG. 12 is a flowchart describing the inventive HSO compression technique in accordance with one aspect.

With reference to Table 3, in row R1, the input character "1" is inputted (FIG. 12: 1202). For ease of reference to Table 3, the subscript "a" is employed in the discussion. Thus, row R1 has "1a" as the input character. Since this is the first input value, nothing is written to the dictionary or outputted.

In row R2, the input character is 1b (FIG. 12: 1206). The bit pattern is now 1a1b (FIG. 12: 1208). It should be noted that prior to forming the bit pattern to search through the dictionary, the prior input character 1a is padded (i.e., pre-pended with zero) to make it 3 bits to match the size of the output code value (FIG. 12: 1204). Because of this padding, the resultant bit pattern is now uniformly 5 bits at all times, which simplifies the search and storage process. Since 11 is not in the dictionary (FIG. 12: 1210), the counter value is incremented to 4 (FIG. 12: 1212/1214) and is written to the CAM at CAM address 11 (FIG. 12: 1216). The output code is 1a (FIG. 12: 1218/1220/1204).

In row R3, the input character is 1c (FIG. 12: 1206). Since "1a" is just outputted, the remaining bit pattern representative of 1b is padded (FIG. 12: 1204) and then merged with 1c to form the bit pattern 1b1c (FIG. 12: 1208). Since 11 is already in the dictionary (stored at row R2), the dictionary is not updated and nothing is outputted. However, the content of CAM address location 11 (which is 4 as shown in row R2) is noted for use with the next input character (FIG. 12: 1210/1222).

In row R4, the input character is 1d (FIG. 12: 1206). Now the bit pattern is 41d (FIG. 12: 1208), which is a merging of the content of CAM address location 11 (which is 4 as shown in row R2), and the new input character 1d. Since the content of CAM address location 11 (which is 4 as shown in row R2) is already 3 bits, no padding is needed, and the new bit pattern 41d is 5 bits as before, which simplifies searching and storage. Since 41 is not in the dictionary (FIG. 12: 1210), the counter value is increased to 5 (FIG. 12: 1212/1214) and is written to the CAM at CAM address 41 (FIG. 12: 1216). The output code is 4 (FIG. 12: 1218/1220/1204).

In row R5, the input character is 1e (FIG. 12: 1206). Now the bit pattern is Idle (FIG. 12: 1208), which is a merging of what remains (1d) of the previous bit pattern for searching (41d) after a code is outputted (4). Note that since what remains comes from the input character 1d, the subscript "d" is again used for ease of understanding. Since 11 is already in the dictionary (stored at row R2), the dictionary is not updated and nothing is outputted. However, the content of CAM address location 11 (which is 4 as shown in row R2) is noted for use with the next input character (FIG. 12: 1210/1222).

In row R6, the input character is 1f (FIG. 12: 1206). Now the bit pattern is 41f (FIG. 12: 1208), which is a merging of the content of CAM address location 11 (which is 4 as shown in row R2), and the new input character 1f. Since 41 is already in the dictionary (stored at row R4), the dictionary is not updated and nothing is outputted. However, the content of CAM address location 41 (which is 5 as shown in row R4) is noted for use with the next input character (FIG. 12: 1210/1222).

In row R7, the input character is 1g (FIG. 12: 1206). Now the bit pattern is 51g (FIG. 12: 1208), which is a merging of the content of CAM address location 41 (which is 5 as shown in row R4), and the new input character 1g. Since 51 is not in the dictionary, the counter value is increased to 6 and is written to the CAM at CAM address 51 (FIG. 12: 1210/1212/1214/1216). The output code is 5 (FIG. 12: 1218/1220/1204).

In row R8, the input character is 1h (FIG. 12: 1206). Now the bit pattern is 1g1h (FIG. 12: 1208), which is a merging of what remains (1g) of the previous bit pattern for searching (51g) after a code is outputted (5). Since 11 is already in the dictionary (stored at row R2), the dictionary is not updated and nothing is outputted. However, the content of CAM address location 11 (which is 4 as shown in row R2) is noted for use with the next input character (FIG. 12: 1210/1222).

In row R9, the input character is 1i (FIG. 12: 1206). Now the bit pattern is 41i (FIG. 12: 1208), which is a merging of the content of CAM address location 11 (which is 4 as shown in row R2), and the new input character 1i. Since 41 is already in the dictionary (stored at row R4), the dictionary is not updated and nothing is outputted. However, the content of CAM address location 41 (which is 5 as shown in row R4) is noted for use with the next input character (FIG. 12: 1210/1222).

In row R10, the input character is 1j (FIG. 12: 1206). Now the bit pattern is 51j (FIG. 12: 1208), which is a merging of the content of CAM address location 41 (which is 5 as shown in row R4), and the new input character 1j. Since 51 is already in the dictionary (stored at row R7), the dictionary is not updated and nothing is outputted. However, the content of CAM address location 51 (which is 6 as shown in row R7) is noted for use with the next input character (FIG. 12: 1210/1222).

In row R11, the input character is 1k (FIG. 12: 1206). Now the bit pattern is 61k (FIG. 12: 1208), which is a merging of the content of CAM address location 51 (which is 6 as shown in row R7), and the new input character 1k. Since 61 is not in the dictionary, the counter ordinarily would be incremented and that value (7 in this case) stored into the dictionary. However, for the purpose of illustrating this embodiment, the counter value was arbitrarily constrained at 6 as the maximum value. Thus, the counter overflows (FIG. 12: 1212/1224) and returns to 4, as shown in row 11 (FIG. 12: 1218/1220/1204).

Also in row R11, the value 4 was noted to have been associated with CAM address location 11 earlier (see row R2) (FIG. 12: 1226/1216). In one advantageous embodiment, a small shadow memory, which is employed to store associative pairings between a CAM content value and its associated CAM address, is searched to determine which CAM address was used previously to store the value 4 (FIG. 12: 1228). That is, the shadow memory addresses are the counter values, and the content stored at each address in the shadow memory is the CAM address currently used to store the counter value that forms the shadow memory address. The use of a shadow memory advantageously allows the CAM address to be rapidly ascertained for any given counter value. This shadow memory is updated every time there is an update to the CAM. Once this CAM address location 11 is ascertained, it is freed up in the CAM (FIG. 12: 1230). In other words, CAM address 11 is now considered free to store another value. In one embodiment, each CAM address has associated with it a Free/Not Free flag bit, and the flag bit is set whenever that CAM address is written to and reset when that CAM address is freed. Alternatively or additionally, the content of that CAM address may be reset to 0 when the CAM address is freed. Once CAM address location 11 is freed, the value 4 is written into location 61 (FIG. 12: 1216), and the code value 6 is outputted (FIG. 12: 1218/1220/1204).

In row R12, the input character is 1L (FIG. 12: 1206). The search bit pattern is now 1k1L (FIG. 12: 1208), which is a merging of what remains (1k) of the previous bit pattern for searching (61k) after a code is outputted (6). However, this is a special case. At this point, an explanation of the special case is in order. A special case exists when the current search bit pattern is the same as the search bit pattern that is associated with the next input character. Using an input buffer and a pipelined input structure in the input stage of the compressor, for example, it is possible to determine in advance the next input character and the search bit pattern that would be employed with that next input character. If one refers to the next row R13, it is possible to see that the next input character is 1m, and the next search bit pattern would be 1L1m. When the special case is encountered, one embodiment simply increments the counter (if such does not cause the counter to overflow) and outputs the first part of the search bit pattern. Thus, the counter is incremented to 5 (FIG. 12: 1212/1214) and the output code is 1k (FIG. 12: 1226/1218/1220/1204).

In row R13, the input character is 1m (FIG. 12: 1206). The search bit pattern is now 1L1m (FIG. 12: 1208), which is a merging of what remains (1L) of the previous bit pattern for searching (1k1L) after a code is outputted (1k). However, this is a special case. If one refers to the next row R14, it is possible to see that the next input character is 1n, and the next search bit pattern would be 1m1n. The special case, it should be recalled, exists when the current search bit pattern is the same as the search bit pattern that is associated with the next input character. When the special case is encountered, one embodiment simply increments the counter (if such does not cause the counter to overflow) and outputs the first part of the search bit pattern. Thus, the counter is incremented to 6 (FIG. 12: 1212/1214) and the output code is 1L (FIG. 12: 1226/1218/1220/1204).

In row R14, the input character is 1n (FIG. 12: 1206). The search bit pattern is now 1m1n (FIG. 12: 1208), which is a merging of what remains (1m) of the previous bit pattern for searching (1L1m) after a code is outputted (1L). However, this is a special case. If one refers to the next row R15, it is possible to see that the next input character is 1o, and the next search bit pattern would be 1n1o. The special case, it should be recalled, exists when the current search bit pattern is the same as the search bit pattern that is associated with the next input character. When the special case is encountered, one embodiment simply increments the counter (if such does not cause the counter to overflow) and outputs the first part of the search bit pattern. However, the increment of the counter causes it to overflow, and it is reset to 4 (FIG. 12: 1212/1224), as shown in row R14. The output code is 1m (FIG. 12: 1226/1218/1220/1204).

In row R15, the input character is 1o (FIG. 12: 1206). The search bit pattern is now 1n1o (FIG. 12: 1208), which is a merging of what remains (1n) of the previous bit pattern for searching (1m1n) after a code is outputted (1m). However, this is a special case. If one refers to the next row R16, it is possible to see that the next input character is 1p, and the next search bit pattern would be 1o1p. The special case, it should be recalled, exists when the current search bit pattern is the same as the search bit pattern that is associated with the next input character. When the special case is encountered, one embodiment simply increments the counter (if such does not cause the counter to overflow) and outputs the first part of the search bit pattern. Thus, the counter is incremented to 5 (FIG. 12: 1212/1214) and the output code is 1n (FIG. 12: 1226/1218/1220/1204).

In row R16, the input character is 1p (FIG. 12: 1206). Now the bit pattern is 1o1p (FIG. 12: 1208), which is a merging of what remains (1o) of the previous bit pattern for searching (1n1o) after a code is outputted (1n). This is not a special case since the ext input character in row R17 is 0q, and the next search bit pattern is 1p0q, which is different from the current search bit pattern 1o1p. Since CAM address 11 is not used in the dictionary (it was freed up earlier in row R11), the counter value incremented (FIG. 12: 1212/1214) and is written to the CAM at CAM address 11. The output code is 1o (FIG. 12: 1226/1218/1220/1204).

In row R17, the input character is 0q (FIG. 12: 1206). Now the bit pattern is 1p0q (FIG. 12: 1208), which is a merging of what remains (1p) of the previous bit pattern for searching (1o1p) after a code is outputted (1o). Since 10 is not in the dictionary, the counter ordinarily would be incremented and that value (7 in this case) stored into the dictionary. However, for the purpose of illustrating this embodiment, the counter value is arbitrarily constrained at 6. Thus, the counter overflows and returns to 4 (FIG. 12: 1212/1224), as shown in row R17.

Also in row R17, the value 4 was noted to have been associated with CAM address location 61 earlier (see row R11) (FIG. 12: 1216). Once this CAM address location 61 is ascertained (FIG. 12: 1228), it is freed up in the CAM (FIG. 12: 1230). In other words, CAM address 61 is now considered free to store another value. Once CAM address location 61 is freed, the value 4 is written into location 10 (FIG. 12: 1216), and the code value 1p is outputted (FIG. 12: 1218/1220/1204).

In row R18, the input character is 1r (FIG. 12: 1206). Now the bit pattern is 0q1r (FIG. 12: 1208), which is a merging of what remains (0q) of the previous bit pattern for searching (1p0q) after a code is outputted (1p). Since 01 is not in the dictionary (FIG. 12: 1216), the counter value is increased to 5 (FIG. 12: 1212/1214) and is written to the CAM at CAM address 01 (FIG. 12: 1216). The output code is 0q (FIG. 12: 1218/1220/1204).

In row R19, the input character is 1s (FIG. 12: 1206). Now the bit pattern is 1r1s (FIG. 12: 1208), which is a merging of what remains (1r) of the previous bit pattern for searching (0q1r) after a code is outputted (0q). Since 11 is already in the dictionary (stored at row R16), the dictionary is not updated and nothing is outputted. However, the content of CAM address location 11 (which is 6 as shown in row R16) is noted for use with the next input character (FIG. 12: 1210/1222).

In row R20, the input character is 1t (FIG. 12: 1206). Now the bit pattern is 61t (FIG. 12: 1208), which is a merging of the content of CAM address location 11 (which is 6 as shown in row R16), and the new input character 1t. Since CAM address 61 is not used in the dictionary (it was freed up in row R17), the counter value is increased to 6 (FIG. 12: 1210/1212/1214). In row R20, the value 6 was noted to have been associated with CAM address location 11 earlier (see row R16) (FIG. 12: 1216). Once this CAM address location 11 is ascertained (FIG. 12: 1228), it is freed up in the CAM (FIG. 12: 1230). In other words, CAM address 11 is now considered free to store another value. Once the CAM address 11 is freed, the counter value is written to the CAM at CAM address 61 (FIG. 12: 1216). The output code is 6 (FIG. 12: 1218/1220/1204).

In row R21, the input character is 1u (FIG. 12: 1206). Now the bit pattern is 1t1u (FIG. 12: 1208), which is a merging of what remains (1t) of the previous bit pattern for searching (61t) after a code is outputted (6). However, this is a special case. If one refers to the next row R22, it is possible to see that the next input character is 1v, and the next search bit pattern would be 1u1v. The special case, it should be recalled, exists when the current search bit pattern is the same as the search bit pattern that is associated with the next input character. When the special case is encountered, one embodiment simply increments the counter (if such does not cause the counter to overflow) and outputs the first part of the search bit pattern. However, the increment of the counter causes it to overflow, and it is reset to 4 (FIG. 12: 1212/1224), as shown in row R21. The output code is 1t (FIG. 12: 1226/1218/1220/1204).

In row R22, the input character is 1v (FIG. 12: 1206). Now the bit pattern is 1u1v (FIG. 12: 1208), which is a merging of what remains (1u) of the previous bit pattern for searching (1t1u) after a code is outputted (1t). Since 11 is not in the dictionary (the CAM address location 11 was freed in row R20), the counter value is increased to 5 (FIG. 12: 1212/1214) and is written to the CAM at CAM address 11 (FIG. 12: 1216). The output code is 1u (FIG. 12: 1218/1220/1204).

In row R23, the special end of file character EOF (FIG. 12: 1206-1207) is encountered, and the compressor outputs the remaining character (FIG. 12: 1240), which 1v (what remains of the previous search bit pattern 1$u$1$v$ after the code 1$u$ is outputted). The compression process ends at block 1242 of FIG. 12.

Note that the CAM only stores the counter value as its content, which allows each row in the CAM table to be relatively small. This is advantageous in helping to reduce the overall CAM size. The size of the CAM is further reduced by allowing the CAM address to be reused. Although a greater number of operations are required to search for CAM addresses in the shadow memory, to update the shadow memory, and to reuse the CAM addresses, it is noted that the speed of logic circuitry nowadays typically outpaces the speed of memory devices. Thus, it is believed that the greater number of logic operations does not materially reduce the speed of the compression engine since the factors that limit compression engine speed tends to be memory-related in the first place.

Table 4 shows a HSO decompression example for the bit pattern outputted by the compressor discussed in connection with Table 3. One embodiment employs Random Access Memory instead of CAM to store the dictionary. It should be noted, however, that although the use of RAM simplifies the implementation of the decompressor, it will be apparent to those skilled in the art that any memory technology may be employed for the dictionary of the decompressor.

The counter is employed as the address value for storing and accessing the bit patterns used to decompress the compressed data. Since the counter value, with its relatively small value range, is employed for addressing memory locations, the amount of memory required is advantageously quite small. Thus, it is possible to implement the dictionary without resorting to a CAM. However, it should be recognized that the decompressor is not limited to the decompression technique disclosed herein (i.e., a standard LZW algorithm may be employed instead).

marks the end of the input file. Rows 3, 5-6, 8-10, and 19 operate on internally generated input values (shown by the italicized numbers in the New Code column for these rows) to generate decompressed output values.

The column New Code contains the values for the externally input characters (referred herein as External New Code) for the decompression cycles, as well as the values for the internally generated input values (referred herein as Internal New Code) for the decompression cycles. To clarify, External New Codes represent the compressed data received by the decompressor from an external source. The Internal New Codes represent the interim values generated by the decompressor itself to facilitate decompression and the generation of the decompressed output values. Both the External New Code and Internal New Code values are 3 bits in the example herein.

The columns Old Code and Zero are columns containing intermediate values generated for the decompression cycles. The column Char Out contains the values outputted from the decompressor, which are further processed into the decompressed output values, as shown in column Decomp Value. Old Code and Zero values are all 3 bits long in the present example, whereas the Char Out values are 2 bits long.

The dictionary comprises two columns: 1) the Counter column, which represents the address into the RAM, and 2) the Content column, which represents what is stored into the dictionary. The Counter value is generated by a counter circuit or software is 3 bits long. As will be seen later during the explanation of the decompression steps, the value of each entry in the Content column comprises the values from both the Old Code and Char Out columns for the current decompression cycle. Accordingly, each Content value is 5 bits long.

Since the Char Out value is 2 bits, the maximum value of Char Out is 11 (binary) or 3 (decimal). The counter value is set to be larger than the maximum value of Char Out. In the

TABLE 4

Example of HSO decompression.

| Row No. | New Code (3 bits) | Old Code (3 bits) | Zero Column (3 bits) | Char Out (2 bits) | Decomp Output (2 bits) | Counter/ Address (3 bits) | Content (Old Code + Char Out) (5 bits) | Group |
|---|---|---|---|---|---|---|---|---|
| R1 | 1a | 0 | 0 | 1a | 1a | | | G1 |
| R2 | 4 | 1a | 1a | 1a | 1a | | | G2 |
| R3 | 1a | 1a | 0 | 1a | 1a | 4 | 1x1y | G2 |
| R4 | 5 | 4 | 4 | 1a | 1x | | | G3 |
| R5 | 4 | 4 | 1x | 1y | 1y | | | G3 |
| R6 | 1x | 4 | 0 | 1x | 1a | 5 | 41z | G3 |
| R7 | 6 | 5 | 5 | 1x | 1x | | | G4 |
| R8 | 5 | 5 | 4 | 1z | 1y | | | G4 |
| R9 | 4 | 5 | 1x | 1y | 1z | | | G4 |
| R10 | 1x | 5 | 0 | 1x | 1x | 6 | 51x | G4 |
| R11 | 1c | 6 | 0 | 1c | 1c | 4 | 61c | G5 |
| R12 | 1d | 1c | 0 | 1d | 1d | 5 | 1c1d | G6 |
| R13 | 1e | 1d | 0 | 1e | 1e | 6 | 1d1e | G7 |
| R14 | 1f | 1e | 0 | 1f | 1f | 4 | 1e1f | G8 |
| R15 | 1g | 1f | 0 | 1g | 1h | 5 | 1f1g | G9 |
| R16 | 1h | 1g | 0 | 1h | 1g | 6 | 1g1h | G10 |
| R17 | 0j | 1h | 0 | 0j | 0j | 4 | 1h0j | G11 |
| R18 | 6 | 0j | 1g | 1h | 1h | | | G12 |
| R19 | 1g | 0j | 0 | 1g | 1g | 5 | 0j1g | G12 |
| R20 | 1k | 6 | 0 | 1k | 1k | 6 | 61k | G13 |
| R21 | 1m | 1k | 0 | 1m | 1m | 4 | 1k1m | G14 |
| R22 | 1n | 1m | 0 | 1n | 1n | 5 | 1m1n | G15 |
| R23 | EOF | | | | | | | |

In the example of Table 4, the input pattern is as shown in the column New Code in rows R1, R2, R4, R7, R11-R18, R20-R22, with row R23 having the special input EOF, which example of Table 4, the counter value has a range of 4-6 to match the conditions imposed during compression, with 4 being the MinCounter value and 6 being the MaxCounter value. In general, the counter value range is known to both the compressor and the decompressor. Initially, the Counter is set to be MinCounter-1, or 3.

Figure 13A:
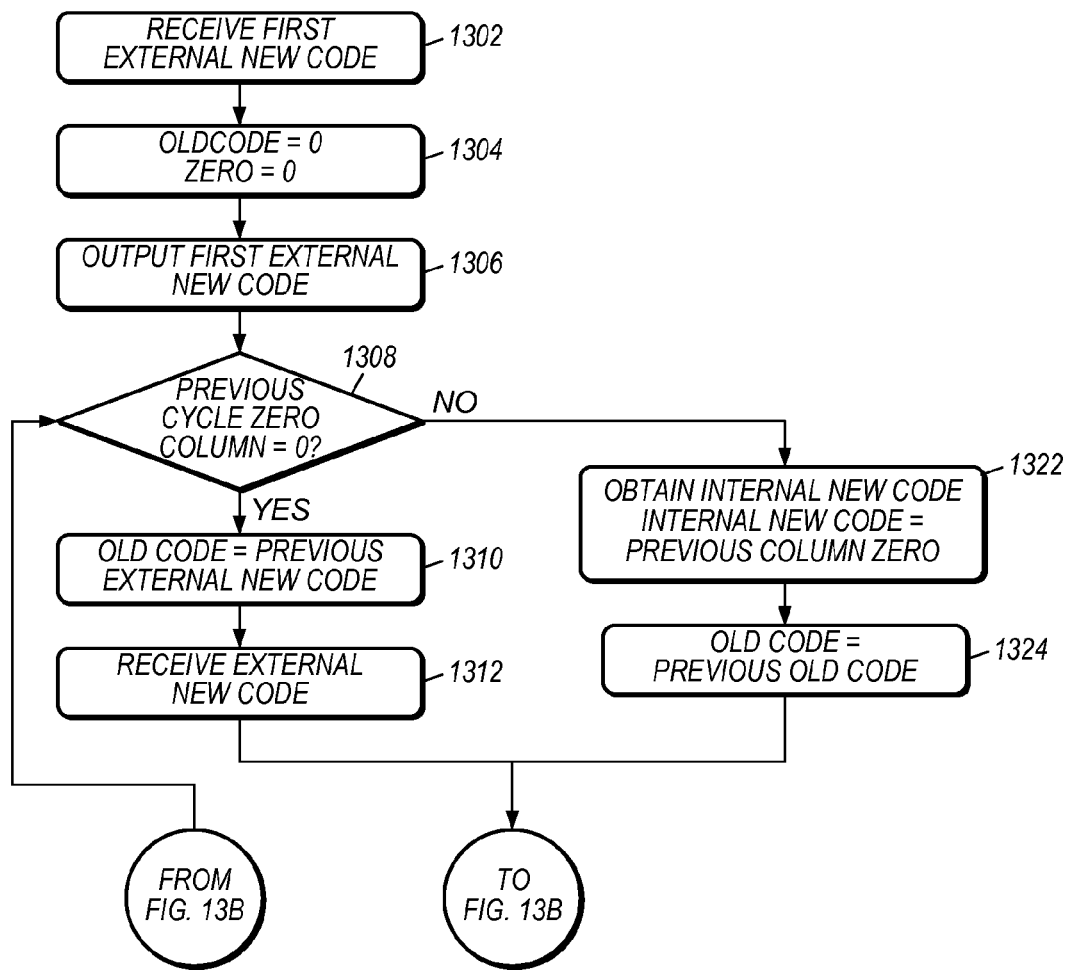
FIGS. 13A-B illustrate a flowchart describing the inventive HSO decompression technique in accordance with one aspect.
Figure 13B:
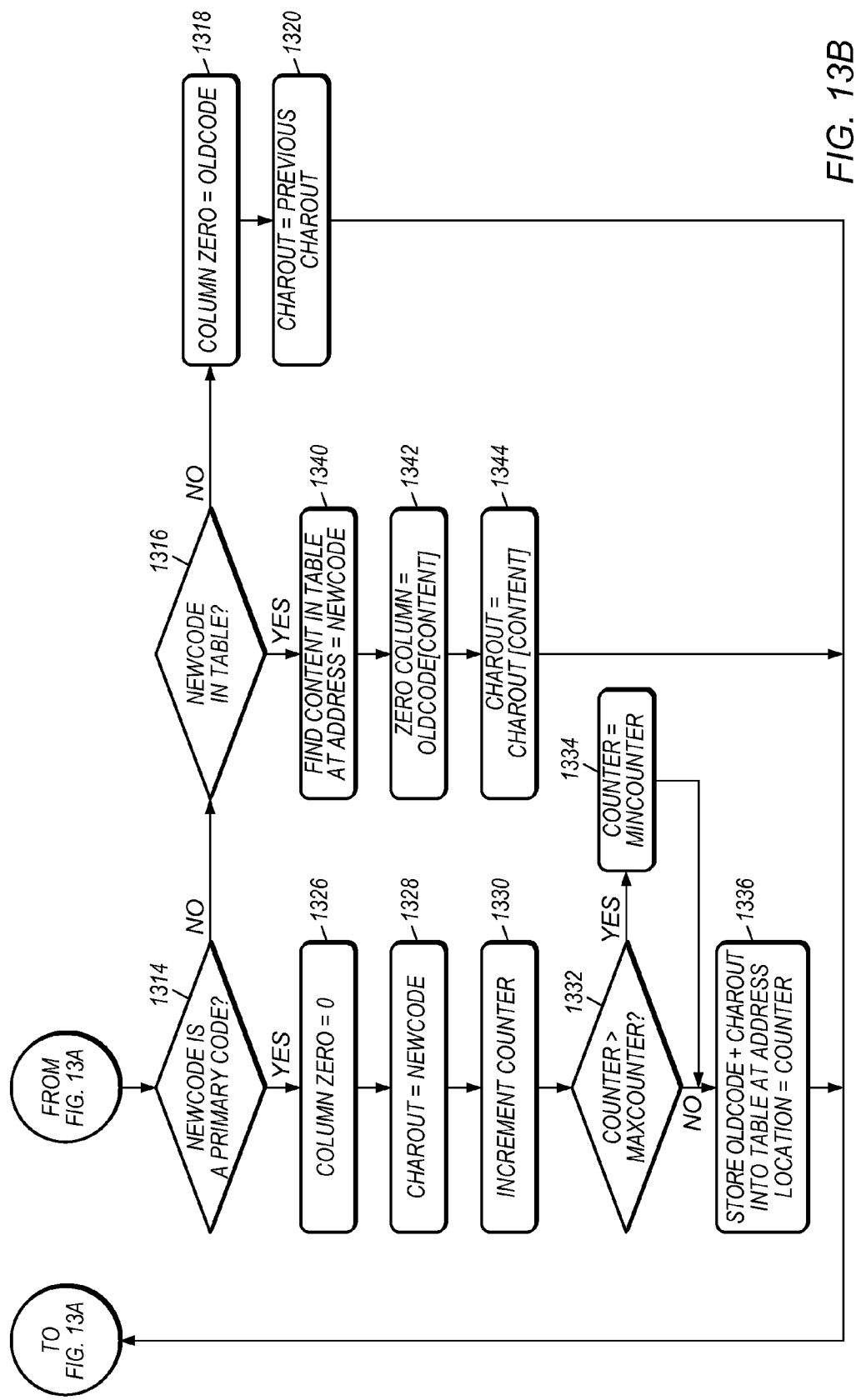

The example of Table 4 will be more easily understood with reference to FIGS. 13A-B. In row R1, the initial compressed value $1a$ is received. Again, the subscript "a" and other subscripts are added to help the reader follow the explanation. They do not exist in implementation. For this initial value, similar to the start of the standard LZW decompression technique, a value is outputted (Char Out=New Code or $1a$). It should be noted that since Char Out is 2 bits and New Code is 3 bits, it may be desirable to remove the MSB of New Code to form Char Out. For this first cycle, both the Old Code column and the Zero column are set to 0. These steps are shown in blocks 1302, 1304 and 1306 in FIG. 13A.

In row R2, it is ascertained whether the previous row (i.e., cycle) has a value 0 in the Zero column (block 1308). If the Zero column of the previous row (row R1) has the value 0, the Old Code column is set to be equal to the previous External New Code value (block 1310), which is $1a$ in this case. The New Code value for the current row is received, as shown by the value 4 in row R2 of Table 4 (block 1312). It is then ascertained (block 1314) whether the New Code for the current cycle (which is an External New Code in this case) is less than the MinCounter value (which is 4 in the present example). Since the External New Code is 4, the method proceeds to block 1316 to ascertain whether the New Code is in the dictionary. In one embodiment, the determination of whether a code is already in the dictionary is as follows. If the counter value is less than New Code and there is no overflow of the counter, then it is assumed that the New Code is not in the dictionary. On the other hand, if the counter value is greater than or equal to New Code or there is an overflow, then the New Code is assumed to be in the dictionary.

Recall that the dictionary is dynamically built for adaptive decompression. In this case, the address location 4 has not been used, and the method proceeds to block 1318 to set the value in the Zero Column to be equal to the Old Code value (or $1a$). The Char Out value is set (block 1320) to be equal to the Char Out value of the previous cycle (row R1) or the value $1a$. The method then returns to block 1308 as shown in FIG. 13A.

With reference to row R3, it is ascertained (block 1308) whether the previous row (i.e., cycle) has a value 0 in the Zero column. Since the Zero column of the previous row (row R2) has the value 1a, the method proceeds to block 1322 to obtain an Internal New Code, which is equal to the Zero column value of the previous cycle (row R2). That value is $1a$ as shown in Table 4. Next, the Old Code value is set (block 1324) to be equal to the value of the Old Code value in the previous cycle (row R2). That value is $1a$ as shown in Table 4. Next, the method proceeds to block 1314 to ascertain whether the New Code for the current cycle (which is an Internal New Code in this case) is less than the MinCounter value (which is 4 in the present example). Since the Internal New Code is 1, the method proceeds to block 1326 to put the value 0 into the Zero column. The Char Out value is then set (block 1328) to be equal to Internal New Code (which is $1a$ in this case). It should be noted that since Char Out is 2 bits and New Code is 3 bits, it may be desirable to remove the MSB of New Code to form Char Out. The method then proceeds to step 1330 to increment the counter from its current value, going from 3 to 4. In step 1332, it is ascertained whether the counter has overflowed by the increment step of block 1330. If an overflow occurs, the counter is reset in block 1334. Since the current counter value 4 is not greater than MaxCounter (or 6 in this example), the method proceeds to block 1336 to store the Content value (Old Code+Char Out) into the address location specified by Counter. Thus, the value 11 is stored into address location 4 for row R3. For ease of explanation, these have been marked with subscript $1x1y$ in Table 4 (with the subscript having no meaning in actual implementation as they are merely an explanation aide). The method then returns to block 1308 as shown in FIG. 13A.

In row R4, it is ascertained whether the previous row (i.e., cycle) has a value 0 in the Zero column (block 1308). Since the Zero column of the previous row (row R3) has the value 0, the Old Code column is set to be equal to the previous External New Code value (block 1310), which is 4 in this case. The New Code value for the current row is received, as shown by the value 5 in row R4 of Table 4 (block 1312). It is then ascertained (block 1314) whether the New Code for the current cycle (which is an External New Code in this case) is less than the MinCounter value (which is 4 in the present example). Since the External New Code is 5, the method proceeds to block 1316 to ascertain whether this New Code is in the dictionary. In this case, the address location 5 has not been used, and the method proceeds to block 1318 to set the value in the Zero Column to be equal to the Old Code value (or 4). The Char Out value is set (block 1320) to be equal to the Char Out value of the previous cycle (row R3) or the value $1a$. The method then returns to block 1308 as shown in FIG. 13A.

With reference to row R5, it is ascertained (block 1308) whether the previous row (i.e., cycle) has a value 0 in the Zero column. Since the Zero column of the previous row (row R4) has the value 4, the method proceeds to block 1322 to obtain an Internal New Code, which is equal to the Zero column value of the previous cycle (row R4). That value is 4 as shown in Table 4. Next, the Old Code value is set (block 1324) to be equal to the value of the Old Code value in the previous cycle (row R4). That value is 4 as shown in Table 4. Next, the method proceeds to block 1314 to ascertain whether the New Code for the current cycle (which is an Internal New Code in this case) is less than the MinCounter value (which is 4 in the present example). Since the Internal New Code is 4, the method proceeds to block 1316 to ascertain whether the Internal New Code is in the dictionary, i.e., whether the address location 4 (which is the value of the Internal New Code) has been used. Since address location 4 was employed to store the value $1x1y$ in row R3, the method proceeds to block 1340 to find the content of the dictionary entry whose address is New Node value (or 4 in this cycle). The first 3 bits of the Content value (previously the Old Code portion of row R3) is parsed and assigned to the Zero column of row R5 (block 1342). The last 2 bits of the Content value (previously the Char Out portion of row R3) is parsed and assigned to the Char Out column of row R5 (block 1344). Thus, the value $1x$ is assigned to the Zero column. The Char Out column is assigned value $1y$. The method then returns to block 1308 as shown in FIG. 13A.

With reference to row R6, it is ascertained (block 1308) whether the previous row (i.e., cycle) has a value 0 in the Zero column. Since the Zero column of the previous row (row R5) has the value $1x$, the method proceeds to block 1322 to obtain an Internal New Code, which is equal to the Zero column value of the previous cycle (row R5). That value is $1x$ as shown in Table 4. Next, the Old Code value is set (block 1324) to be equal to the value of the Old Code value in the previous cycle (row R5). That value is 4 as shown in Table 4. Next, the method proceeds to block 1314 to ascertain whether the New Code for the current cycle (which is an Internal New Code in this case) is less than the MinCounter value (which is 4 in the present example). Since the Internal New Code is 1, which is a primary case (i.e., the value of the Internal New Code is less than the minimum code value, or 4 in this example since the codes are either 4, 5, or 6 as discussed earlier), the method proceeds to block 1326 to put the value 0 into the Zero column. The Char Out value is then set (block 1328) to be equal to New Code (which is $1x$ in this case). It should be noted that since Char Out is 2 bits and New Code is 3 bits, it may be desirable to remove the MSB of New Code to form Char Out. The method then proceeds to block 1330 to increment the counter from its current value, going from 4 to 5. In block 1332, it is ascertained whether the counter has overflowed by the increment step of block 1330. If an overflow occurs, the counter is reset in block 1334. Since the current counter value 5 is not greater than MaxCounter (or 6 in this example), the method proceeds to block 1336 to store the Content value (Old Code+Char Out) into the address location specified by Counter. Thus, the value 41 is stored into address location 5 for row R6. For ease of explanation, these have been marked with subscript $41z$ in Table 4 (with the subscript having no meaning in actual implementation as they are merely an explanation aide). The method then returns to block 1308 as shown in FIG. 13A.

In row R7, it is ascertained whether the previous row (i.e., cycle) has a value 0 in the Zero column (block 1308). Since the Zero column of the previous row (row R6) has the value 0, the Old Code column is set to be equal to the previous External New Code value (block 1310), which is 5 in this case. The New Code value for the current row is received, as shown by the value 6 in row R7 of Table 4 (block 1312). It is then ascertained (block 1314) whether the New Code for the current cycle (which is an External New Code in this case) is less than the MinCounter value (which is 4 in the present example). This is equivalent to checking whether the New Code for the current cycle is a primary value. Since the External New Code is 6, the method proceeds to block 1316 to ascertain whether this New Code is in the dictionary. In this case, the address location 6 has not been used, and the method proceeds to block 1318 to set the value in the Zero Column to be equal to the Old Code value (or 5). The Char Out value is set (block 1320) to be equal to the Char Out value of the previous cycle (row R3) or the value $1x$. The method then returns to block 1308 as shown in FIG. 13A.

With reference to row R8, it is ascertained (block 1308) whether the previous row (i.e., cycle) has a value 0 in the Zero column. Since the Zero column of the previous row (row R7) has the value 5, the method proceeds to block 1322 to obtain an Internal New Code, which is equal to the Zero column value of the previous cycle (row R7). That value is 5 as shown in Table 4. Next, the Old Code value is set (block 1324) to be equal to the value of the Old Code value in the previous cycle (row R7). That value is 5 as shown in Table 4. Next, the method proceeds to block 1314 to ascertain whether the New Code for the current cycle (which is an Internal New Code in this case) is less than the MinCounter value (which is 4 in the present example). Since the Internal New Code is 5, the method proceeds to block 1316 to ascertain whether the Internal New Code is in the dictionary, i.e., whether the address location 5 (which is the value of the Internal New Code) has been used. Since address location 5 was employed to store the value $41z$ in row R6, the method proceeds to block 1340 to find the content of the dictionary entry whose address is New Code value (or 5 in this cycle). The first 3 bits of the Content value (previously the Old Code portion of row R3) is parsed and assigned to the Zero column of row R8 (block 1342). The last 2 bits of the Content value (previously the Char Out portion of row R3) is parsed and assigned to the Char Out column of row R8 (block 1344). Thus, the value 4 is assigned to the Zero column. The Char Out column is assigned value $1z$. The method then returns to block 1308 as shown in FIG. 13A.

With reference to row R9, it is ascertained (block 1308) whether the previous row (i.e., cycle) has a value 0 in the Zero column. Since the Zero column of the previous row (row R4) has the value 4, the method proceeds to block 1322 to obtain an Internal New Code, which is equal to the Zero column value of the previous cycle (row R4). That value is 4 as shown in Table 4. Next, the Old Code value is set (block 1324) to be equal to the value of the Old Code value in the previous cycle (row R8). That value is 5 as shown in Table 4. Next, the method proceeds to block 1314 to ascertain whether the New Code for the current cycle (which is an Internal New Code in this case) is less than the MinCounter value (which is 4 in the present example). Since the Internal New Code is 4, the method proceeds to block 1316 to ascertain whether the Internal New Code is in the dictionary, i.e., whether the address location 4 (which is the value of the Internal New Code) has been used. Since address location 4 was employed to store the value $1x1y$ in row R3, the method proceeds to block 1340 to find the content of the dictionary entry whose address is New Node value (or 4 in this cycle). The first 3 bits of the Content value (previously the Old Code portion of row R3) is parsed and assigned to the Zero column of row R9 (block 1342). The last 2 bits of the Content value (previously the Char Out portion of row R3) is parsed and assigned to the Char Out column of row R9 (block 1344). Thus, the value $1x$ is assigned to the Zero column. The Char Out column is assigned value $1y$. The method then returns to block 1308 as shown in FIG. 13A.

With reference to row R10, it is ascertained (block 1308) whether the previous row (i.e., cycle) has a value 0 in the Zero column. Since the Zero column of the previous row (row R5) has the value $1x$, the method proceeds to block 1322 to obtain an Internal New Code, which is equal to the Zero column value of the previous cycle (row R9). That value is $1x$ as shown in Table 4. Next, the Old Code value is set (block 1324) to be equal to the value of the Old Code value in the previous cycle (row R9). That value is 5 as shown in Table 4. Next, the method proceeds to block 1314 to ascertain whether the New Code for the current cycle (which is an Internal New Code in this case) is less than the MinCounter value (which is 4 in the present example). Since the Internal New Code is $1x$, the method proceeds to block 1326 to put the value 0 into the Zero column. The Char Out value is then set (block 1328) to be equal to New Code (which is $1x$ in this case). It should be noted that since Char Out is 2 bits and New Code is 3 bits, it may be desirable to remove the MSB of New Code to form Char Out. The method then proceeds to block 1330 to increment the counter from its current value, going from 5 to 6. In block 1332, it is ascertained whether the counter has overflowed by the increment step of block 1330. If an overflow occurs, the counter is reset in block 1334. Since the current counter value 6 is not greater than MaxCounter (or 6 in this example), the method proceeds to block 1336 to store the Content value (Old Code+Char Out) into the address location specified by Counter. Thus, the value 51 is stored into address location 6 for row R10. The method then returns to block 1308 as shown in FIG. 13A.

In row R11, it is ascertained whether the previous row (i.e., cycle) has a value 0 in the Zero column (block 1308). Since the Zero column of the previous row (row R10) has the value 0, the Old Code column is set to be equal to the previous External New Code value (block 1310), which is 6 in this case. The New Code value for the current row is received, as shown by the value $1c$ in row R11 of Table 4 (block 1312). It is then ascertained (block 1314) whether the New Code for the current cycle (which is an External New Code in this case) is less than the MinCounter value (which is 4 in the present example). Since the External New Code is 1*c*, the method proceeds to block 1326 to put the value 0 into the Zero column. The Char Out value is then set (block 1328) to be equal to New Code (which is 1*c* in this case). It should be noted that since Char Out is 2 bits and New Code is 3 bits, it may be desirable to remove the MSB of New Code to form Char Out. The method then proceeds to block 1330 to increment the counter from its current value, going from 6 to 7. In block 1332, it is ascertained whether the counter has overflowed by the increment step of block 1330. If an overflow occurs, the counter is reset in block 1334. Since the current counter value 7 is greater than MaxCounter (or 6 in this example), the method resets the counter to MinCounter (or 4 in this example). The method then proceeds to block 1336 to store the Content value (Old Code+Char Out) into the address location specified by Counter. Thus, the value 61 is stored into address location 4 for row R10. Note that in this case, the counter has overflowed and the method simply overwrites the address location 4 (previously used to store the Content value 1*x*1*y* in row R3). As will be seen later in this example, this overwriting of the old dictionary entry, while allowing the use of a much smaller RAM to implement the dictionary, still gives the correct decompression result. The method then returns to block 1308 as shown in FIG. 13A.

In row R12, it is ascertained whether the previous row (i.e., cycle) has a value 0 in the Zero column (block 1308). Since the Zero column of the previous row (row R11) has the value 0, the Old Code column is set to be equal to the previous External New Code value (block 1310), which is 1*c* in this case. The New Code value for the current row is received, as shown by the value 1*d* in row R12 of Table 4 (block 1312). It is then ascertained (block 1314) whether the New Code for the current cycle (which is an External New Code in this case) is less than the MinCounter value (which is 4 in the present example). Since the External New Code is 1*d*, the method proceeds to block 1326 to put the value 0 into the Zero column. The Char Out value is then set (block 1328) to be equal to New Code (which is 1*d* in this case). It should be noted that since Char Out is 2 bits and New Code is 3 bits, it may be desirable to remove the MSB of New Code to form Char Out. The method then proceeds to block 1330 to increment the counter from its current value, going from 4 to 5. In block 1332, it is ascertained whether the counter has overflowed by the increment step of block 1330. If an overflow occurs, the counter is reset in block 1334. Since the current counter value 5 is not greater than MaxCounter (or 6 in this example), the method proceeds to block 1336 to store the Content value (Old Code+Char Out) into the address location specified by Counter. Thus, the value 1*c*1*d* is stored into address location 5 for row R12. Again, note that in this case, the method simply overwrites the address location 5 (previously used to store the Content value 41*z* in row R6). As will be seen later in this example, this overwriting of the old dictionary entry, while allowing the use of a much smaller RAM to implement the dictionary, still gives the correct decompression result. The method then returns to block 1308 as shown in FIG. 13A.

In row R13, it is ascertained whether the previous row (i.e., cycle) has a value 0 in the Zero column (block 1308). Since the Zero column of the previous row (row R12) has the value 0, the Old Code column is set to be equal to the previous External New Code value (block 1310), which is 1*d* in this case. The New Code value for the current row is received, as shown by the value 1*e* in row R13 of Table 4 (block 1312). It is then ascertained (block 1314) whether the New Code for the current cycle (which is an External New Code in this case) is less than the MinCounter value (which is 4 in the present example). Again, this is equivalent to checking whether the New Code is a primary case. Since the External New Code is 1*e*, the method proceeds to block 1326 to put the value 0 into the Zero column. The Char Out value is then set (block 1328) to be equal to New Code (which is 1*e* in this case). It should be noted that since Char Out is 2 bits and New Code is 3 bits, it may be desirable to remove the MSB of New Code to form Char Out. The method then proceeds to block 1330 to increment the counter from its current value, going from 5 to 6. In block 1332, it is ascertained whether the counter has overflowed by the increment step of block 1330. If an overflow occurs, the counter is reset in block 1334. Since the current counter value 6 is not greater than MaxCounter (or 6 in this example), the method proceeds to block 1336 to store the Content value (Old Code+Char Out) into the address location specified by Counter. Thus, the value idle is stored into address location 6 for row R13. Again, note that in this case, the method simply overwrites the address location 6 (previously used to store the Content value 51 in row R10). As will be seen later in this example, this overwriting of the old dictionary entry, while allowing the use of a much smaller RAM to implement the dictionary, still gives the correct decompression result. The method then returns to block 1308 as shown in FIG. 13A.

In row R14, it is ascertained whether the previous row (i.e., cycle) has a value 0 in the Zero column (block 1308). Since the Zero column of the previous row (row R13) has the value 0, the Old Code column is set to be equal to the previous External New Code value (block 1310), which isle in this case. The New Code value for the current row is received, as shown by the value if in row R14 of Table 4 (block 1312). It is then ascertained (block 1314) whether the New Code for the current cycle (which is an External New Code in this case) is less than the MinCounter value (which is 4 in the present example). Since the External New Code is 1*f*, the method proceeds to block 1326 to put the value 0 into the Zero column. The Char Out value is then set (block 1328) to be equal to New Code (which is if in this case). It should be noted that since Char Out is 2 bits and New Code is 3 bits, it may be desirable to remove the MSB of New Code to form Char Out. The method then proceeds to block 1330 to increment the counter from its current value, going from 6 to 7. In block 1332, it is ascertained whether the counter has overflowed by the increment step of block 1330. If an overflow occurs, the counter is reset in block 1334. In this example, the value 7 is reserved for the EOF flag and thus the maximum value of the code is 6 although the theoretical maximum value of the code would have been 7 (due to its 3-bit length). Using the maximum theoretical value to represent the EOF flag is one convenient way of handling EOF flagging. Since the current counter value 7 is greater than MaxCounter (or 6 in this example), the method resets the counter to MinCounter (or 4 in this example). The method then proceeds to block 1336 to store the Content value (Old Code+Char Out) into the address location specified by Counter. Thus, the value 1*e*1*f* is stored into address location 4 for row R14. Note that in this case, the counter has overflowed and the method simply overwrites the address location 4 (previously used to store the Content value 61 in row R11). As will be seen later in this example, this overwriting of the old dictionary entry, while allowing the use of a much smaller RAM to implement the dictionary, still gives the correct decompression result. The method then returns to block 1308 as shown in FIG. 13A.

In row R15, it is ascertained whether the previous row (i.e., cycle) has a value 0 in the Zero column (block 1308). Since the Zero column of the previous row (row R14) has the value 0, the Old Code column is set to be equal to the previous External New Code value (block 1310), which is 1f in this case. The New Code value for the current row is received, as shown by the value 1g in row R15 of Table 4 (block 1312). It is then ascertained (block 1314) whether the New Code for the current cycle (which is an External New Code in this case) is less than the MinCounter value (which is 4 in the present example). Since the External New Code is 1g, the method proceeds to block 1326 to put the value 0 into the Zero column. The Char Out value is then set (block 1328) to be equal to New Code (which is 1g in this case). It should be noted that since Char Out is 2 bits and New Code is 3 bits, it may be desirable to remove the MSB of New Code to form Char Out. The method then proceeds to block 1330 to increment the counter from its current value, going from 4 to 5. In block 1332, it is ascertained whether the counter has overflowed by the increment step of block 1330. If an overflow occurs, the counter is reset in block 1334. Since the current counter value 5 is not greater than MaxCounter (or 6 in this example), the method proceeds to block 1336 to store the Content value (Old Code+Char Out) into the address location specified by Counter. Thus, the value 1f1g is stored into address location 5 for row R15. Again, note that in this case, the method simply overwrites the address location 5 (previously used to store the Content value 1c1d in row R12). As will be seen later in this example, this overwriting of the old dictionary entry, while allowing the use of a much smaller RAM to implement the dictionary, still gives the correct decompression result. The method then returns to block 1308 as shown in FIG. 13A.

In row R16, it is ascertained whether the previous row (i.e., cycle) has a value 0 in the Zero column (block 1308). Since the Zero column of the previous row (row R15) has the value 0, the Old Code column is set to be equal to the previous External New Code value (block 1310), which is 1g in this case. The New Code value for the current row is received, as shown by the value 1h in row R13 of Table 4 (block 1312). It is then ascertained (block 1314) whether the New Code for the current cycle (which is an External New Code in this case) is less than the MinCounter value (which is 4 in the present example). Since the External New Code is 1h, the method proceeds to block 1326 to put the value 0 into the Zero column. The Char Out value is then set (block 1328) to be equal to New Code (which is 1h in this case). It should be noted that since Char Out is 2 bits and New Code is 3 bits, it may be desirable to remove the MSB of New Code to form Char Out. The method then proceeds to block 1330 to increment the counter from its current value, going from 5 to 6. In block 1332, it is ascertained whether the counter has overflowed by the increment step of block 1330. If an overflow occurs, the counter is reset in block 1334. Since the current counter value 6 is not greater than MaxCounter (or 6 in this example), the method proceeds to block 1336 to store the Content value (Old Code+Char Out) into the address location specified by Counter. Thus, the value 1g1h is stored into address location 6 for row R16. Again, note that in this case, the method simply overwrites the address location 6 (previously used to store the Content value 1d1e in row R13). As will be seen later in this example, this overwriting of the old dictionary entry, while allowing the use of a much smaller RAM to implement the dictionary, still gives the correct decompression result. The method then returns to block 1308 as shown in FIG. 13A.

In row R17, it is ascertained whether the previous row (i.e., cycle) has a value 0 in the Zero column (block 1308). Since the Zero column of the previous row (row R16) has the value 0, the Old Code column is set to be equal to the previous External New Code value (block 1310), which is 1h in this case. The New Code value for the current row is received, as shown by the value 0j in row R17 of Table 4 (block 1312). It is then ascertained (block 1314) whether the New Code for the current cycle (which is an External New Code in this case) is less than the MinCounter value (which is 4 in the present example). This is the same is checking whether the current New Code is a primary case. Since the External New Code is 0j, the method proceeds to block 1326 to put the value 0 into the Zero column. The Char Out value is then set (block 1328) to be equal to New Code (which is 0j in this case). It should be noted that since Char Out is 2 bits and New Code is 3 bits, it may be desirable to remove the MSB of New Code to form Char Out. The method then proceeds to block 1330 to increment the counter from its current value, going from 6 to 7. In block 1332, it is ascertained whether the counter has overflowed by the increment step of block 1330. If an overflow occurs, the counter is reset in block 1334. Since the current counter value 7 is greater than MaxCounter (or 6 in this example), the method resets the counter to MinCounter (or 4 in this example). The method then proceeds to block 1336 to store the Content value (Old Code+Char Out) into the address location specified by Counter. Thus, the value 1h0j is stored into address location 4 for row R14. Note that in this case, the counter has overflowed and the method simply overwrites the address location 4 (previously used to store the Content value 1e1f in row R14). As will be seen later in this example, this overwriting of the old dictionary entry, while allowing the use of a much smaller RAM to implement the dictionary, still gives the correct decompression result. The method then returns to block 1308 as shown in FIG. 13A.

In row R18, it is ascertained whether the previous row (i.e., cycle) has a value 0 in the Zero column (block 1308). Since the Zero column of the previous row (row R17) has the value 0, the Old Code column is set to be equal to the previous External New Code value (block 1310), which is 0j in this case. The New Code value for the current row is received, as shown by the value 6 in row R18 of Table 4 (block 1312). It is then ascertained (block 1314) whether the New Code for the current cycle (which is an External New Code in this case) is less than the MinCounter value (which is 4 in the present example). Since the External New Code is 6, the method proceeds to block 1316 to ascertain whether the Internal New Code is in the dictionary, i.e., whether the address location 6 (which is the value of the Internal New Code) has been used. Since address location 6 was employed to store the value 1g1h in row R16, the method proceeds to block 1340 to find the content of the dictionary entry whose address is New Node value (or 6 in this cycle). The first 3 bits of the Content value (previously the Old Code portion of row R16) is parsed and assigned to the Zero column of row R18 (block 1342). The last 2 bits of the Content value (previously the Char Out portion of row R16) is parsed and assigned to the Char Out column of row R18 (block 1344). Thus, the value 1g is assigned to the Zero column. The Char Out column is assigned value 1h. Note that the method still decompresses correctly even if the address location 6 had been written over a few times. Note that the counter is not incremented in this cycle because the zero column is not zero. The method then returns to block 1308 as shown in FIG. 13A.

In row R19, it is ascertained whether the previous row (i.e., cycle) has a value 0 in the Zero column (block 1308). Since the Zero column of the previous row (row R18) has the value 1g, the method proceeds to block 1322 to obtain an Internal New Code, which is equal to the Zero column value of the previous cycle (row R18). That value is 1g as shown in Table 4. Next, the Old Code value is set (block 1324) to be equal to the value of the Old Code value in the previous cycle (row R18). That value is 0j as shown in Table 4. Next, the method proceeds to block 1314 to ascertain whether the New Code for the current cycle (which is an Internal New Code in this case) is less than the MinCounter value (which is 4 in the present example). Since the Internal New Code is 1g, the method proceeds to block 1326 to put the value 0 into the Zero column. The Char Out value is then set (block 1328) to be equal to New Code (which is 1g in this case). It should be noted that since Char Out is 2 bits and New Code is 3 bits, it may be desirable to remove the MSB of New Code to form Char Out. The method then proceeds to block 1330 to increment the counter from its current value, going from 4 to 5. In block 1332, it is ascertained whether the counter has overflowed by the increment step of block 1330. If an overflow occurs, the counter is reset in block 1334. Since the current counter value 5 is not greater than MaxCounter (or 6 in this example), the method proceeds to block 1336 to store the Content value (Old Code+Char Out) into the address location specified by Counter. Thus, the value 01 is stored into address location 5 for row R19. The method then returns to block 1308 as shown in FIG. 13A.

In row R20, it is ascertained whether the previous row (i.e., cycle) has a value 0 in the Zero column (block 1308). Since the Zero column of the previous row (row R19) has the value 0, the Old Code column is set to be equal to the previous External New Code value (block 1310), which is 6 in this case (from row R18). The New Code value for the current row is received, as shown by the value 1k in row R20 of Table 4 (block 1312). It is then ascertained (block 1314) whether the New Code for the current cycle (which is an External New Code in this case) is primary, i.e., less than the MinCounter value (which is 4 in the present example). Since the External New Code is 1k, the method proceeds to block 1326 to put the value 0 into the Zero column. The Char Out value is then set (block 1328) to be equal to New Code (which is 1k in this case). It should be noted that since Char Out is 2 bits and New Code is 3 bits, it may be desirable to remove the MSB of New Code to form Char Out. The method then proceeds to block 1330 to increment the counter from its current value, going from 5 to 6. In block 1332, it is ascertained whether the counter has overflowed by the increment step of block 1330. If an overflow occurs, the counter is reset in block 1334. Since the current counter value 6 is not greater than MaxCounter (or 6 in this example), the method proceeds to block 1336 to store the Content value (Old Code+Char Out) into the address location specified by Counter. Thus, the value 61k is stored into address location 6 for row R20. Again, note that in this case, the method simply overwrites the address location 6 (previously used to store the Content value 1g1h in row R16). As will be seen later in this example, this overwriting of the old dictionary entry, while allowing the use of a much smaller RAM to implement the dictionary, still gives the correct decompression result. The method then returns to block 1308 as shown in FIG. 13A.

In row R21, it is ascertained whether the previous row (i.e., cycle) has a value 0 in the Zero column (block 1308). Since the Zero column of the previous row (row R20) has the value 0, the Old Code column is set to be equal to the previous External New Code value (block 1310), which is 1k in this case. The New Code value for the current row is received, as shown by the value 1m in row R21 of Table 4 (block 1312). It is then ascertained (block 1314) whether the New Code for the current cycle (which is an External New Code in this case) is primary, i.e., less than the MinCounter value (which is 4 in the present example). Since the External New Code is 1m, the method proceeds to block 1326 to put the value 0 into the Zero column. The Char Out value is then set (block 1328) to be equal to New Code (which is 1m in this case). It should be noted that since Char Out is 2 bits and New Code is 3 bits, it may be desirable to remove the MSB of New Code to form Char Out. The method then proceeds to block 1330 to increment the counter from its current value, going from 6 to 7. In block 1332, it is ascertained whether the counter has overflowed by the increment step of block 1330. If an overflow occurs, the counter is reset in block 1334. Since the current counter value 7 is greater than MaxCounter (or 6 in this example), the method resets the counter to MinCounter (or 4 in this example). The method then proceeds to block 1336 to store the Content value (Old Code+Char Out) into the address location specified by Counter. Thus, the value 1k1m is stored into address location 4 for row R21. Note that in this case, the counter has overflowed and the method simply overwrites the address location 4 (previously used to store the Content value 1h0j in row R17). As will be seen later in this example, this overwriting of the old dictionary entry, while allowing the use of a much smaller RAM to implement the dictionary, still gives the correct decompression result. The method then returns to block 1308 as shown in FIG. 13A.

In row R22, it is ascertained whether the previous row (i.e., cycle) has a value 0 in the Zero column (block 1308). Since the Zero column of the previous row (row R14) has the value 0, the Old Code column is set to be equal to the previous External New Code value (block 1310), which is 1m in this case. The New Code value for the current row is received, as shown by the value 1n in row R15 of Table 4 (block 1312). It is then ascertained (block 1314) whether the New Code for the current cycle (which is an External New Code in this case) is primary, i.e., less than the MinCounter value (which is 4 in the present example). Since the External New Code is 1n, the method proceeds to block 1326 to put the value 0 into the Zero column. The Char Out value is then set (block 1328) to be equal to New Code (which is 1n in this case). It should be noted that since Char Out is 2 bits and New Code is 3 bits, it may be desirable to remove the MSB of New Code to form Char Out. The method then proceeds to block 1330 to increment the counter from its current value, going from 4 to 5. In block 1332, it is ascertained whether the counter has overflowed by the increment step of block 1330. If an overflow occurs, the counter is reset in block 1334. Since the current counter value 5 is not greater than MaxCounter (or 6 in this example), the method proceeds to block 1336 to store the Content value (Old Code+Char Out) into the address location specified by Counter. Thus, the value 1m1n is stored into address location 5 for row R22. Again, note that in this case, the method simply overwrites the address location 5 (previously used to store the Content value 01 in row R19). As will be seen later in this example, this overwriting of the old dictionary entry, while allowing the use of a much smaller RAM to implement the dictionary, still gives the correct decompression result. The method then returns to block 1308 as shown in FIG. 13A.

In row 23, the EOF end-of-file marker is encountered. Decompression is finished except for final processing, as discussed below.

As mentioned earlier, the values in the Char Out column are further processed in order to obtain the decompressed output value (Decomp Output). In one embodiment, the value in the zero column signals that decompression for the current External New Code value is finished. Since decompression may yield a set of output values for each External New Code value received, each set of output values produced for each External New Code value received is considered a group. These groups are shown in Table 4 as groups G1-G15 as shown. Note that groups G2, G3, G4, and G12 have multiple values in each group. As the Char Out values are obtained for each group, they are inputted into a temporary memory space. Once decompression is finished for that group, the Char Out values for that group are outputted in the reverse order such that the Char Out value received first is output last, and vice-versa. With reference to the group G3, for example, the Char Out values are produced in the order $1a$, $1y$, and $1x$. Outputting to column Decomp Output is accomplished for this group G3 by reversing the order so that the order now reads $1x$, $1y$, and $1a$ for rows R4, R5, and R6 respectively. Similarly, the group G4 is reversed to output, the Decomp Output column, the values $1x$, $1y$, $1z$, and $1x$ for rows R7, R8, R9, and R10 respectively. One skilled in the art will readily recognize that reversing the order for each group may be accomplished using any technique, including using a First-In-Last-Out queue.

With reference to Tables 3 and 4, when one ignores the subscripts, it should be apparent that the Decomp Output values of Table 4 are identical to the values in the Input Character column of Table 3. This is proof that the improved HSO compression technique of the present embodiment can correctly compress and decompress data even with a small dictionary.

It should be kept in mind that although the input characters in the example of Tables 3 and 4 are 2 bits each, the inventive HSO compression technique can compress input characters having any size. As can be appreciated from the foregoing, the inventive HSO technique has many unique features and advantages. For example, the described embodiment allows the use of a smaller number of output codes for compression, much fewer than the number of codes that would have been required if one unique code were allocated for a unique bit pattern that needs to be represented during compression. As the code overflows, it resets to its minimum value to allow compression to continue. This is seen during, for example, the compression of row R11 in the compression example of Table 3. The reduction in the number of unique output codes required in turn allows the use of a smaller dictionary during compression, which advantageously reduces the memory requirement, which is an advantageous situation whether the compression logic is implemented in hardware or software.

Another unique feature in the inventive combination that is the present inventive HSO compression technique relates to the use of a small shadow memory to track the associated pairings between a CAM content value and its associated CAM address to allow a previously used CAM address to be freed up when the counter (code output) overflows the imposed maximum value. As discussed earlier, the shadow memory addresses are the counter values, and the content stored at each address in the shadow memory is the CAM address currently used to store the counter value that forms the shadow memory address. This shadow memory advantageously allows the CAM address to be rapidly ascertained for any given counter value. This is seen, for example, during the compression of row R11 in the compression example of Table 3. The use of the shadow memory advantageously makes the compression process more efficient when a smaller number of output codes, much fewer than the number of codes that would have been required if one unique code were allocated for a unique bit pattern that needs to be represented during compression.

Another unique feature in the inventive combination that is the present inventive HSO compression technique relates to the way the special cases are handled when it is realized that the current search bit pattern is the same as the search bit pattern that is associated with the next input character during compression. This is seen during the compression of, for example, R12, R13, R14, R15, and R21 R11 in the compression example of Table 3. When a special case is encountered, the inventive HSO compression technique simply increments the counter (if such does not cause the counter to overflow) and outputs the first part of the current search bit pattern. Neither the CAM nor the shadow memory is updated, which saves processing cycles.

To enable the handling of the special cases during compression, the inventive HSO compression technique, in one embodiment, advantageously employs input buffer and a pipelined input structure in order to have multiple input characters available for examination and detection of the special cases. This is also another unique feature in combination with other features of the inventive HSO compression technique.

Even the CAM is structured in a unique, memory-saving manner that ensures processing efficiency. In one embodiment, the CAM only stores the counter values (output codes), with the CAM address representing the current bit pattern to search. To signal whether a given CAM address is employed or free, one or more tag bits may be provided with each CAM address location. One tag bit suffices to indicate whether a given CAM address is used. In one embodiment, multiple tag bits allow the tag bits to be cycled through when the dictionary is reused for compressing the next burst. For example, at the end of compression of a particular burst, the dictionary is then cleared for compressing the next burst (which may belong to another process and/or data flow). If a CAM is furnished with, for example two tag bits T1 and T2 for each CAM address to mark whether the CAM address is currently used, and tag bit T1 was used in the compression of the previous burst, the CAM can be used immediately for compression of the next burst by utilizing tag bit T2. Of course, it is possible to provide more than two tag bit fields if desired for higher bandwidth. Alternatively or additionally, multiple CAM arrays (with one or multiple tag bit fields) can be provided. The CAMs can be employed in a ping-pong fashion to store the dictionaries associated with consecutive input sequences. Thus, if two CAMs are provided, the first CAM will be used to store the dictionary associated with the first input sequence, the second CAM will be used to store the dictionary associated with the second input sequence (in this sense, the input sequence refers to a pattern of incoming bits comprising one or more frames or packets and associated with a single flow or file and can be compressed together), and the first CAM will be used again to store the dictionary associated with next (third) input sequence, and so on (e.g., the second CAM used for the dictionary associated with the next (fourth) input sequence). When one CAM is currently employed for storing the dictionary, the other CAM can be reset (e.g., by rewriting the tag field or tag fields) to get that CAM ready for use with the next input sequence. Thus, the compression process does not have to be interrupted in order to reset a CAM. One skilled in the art will recognize that three or more CAMs can be used in a round-robin fashion to achieve the same purpose if two CAMs cannot satisfy the bandwidth requirement.

In one embodiment the end of burst (EOF) is signaled to the compression logic using a unique bit pattern. This end of burst signal may be created by, for example, the input interface of the data optimization engine. The input interface is endowed with knowledge regarding the protocol employed to transmit the data and therefore would know where the burst ends and where the next burst begins in the data stream. By using a special end of burst (EOF) signal, it is unnecessary for the compression engine to know in advance how long the burst is. This allows compression to be truly flexible and adaptive with regard to how long the burst can be, further extending the flexibility of the inventive HSO compression technique (which is flexible and adaptive with regard to what type of data is received).

With regard to the decompression logic, the ability to use a small number of address locations in the dictionary to decompress advantageously allows the dictionary to be quite small. In the example of Table 4, for example, the dictionary has only three addresses: 4, 5, and 6. Unique in the combination that is the inventive HSO decompression technique is the ability to overwrite existing memory locations when the counter overflows. This overwrite feature is seen, for example, during the decompression of row R11 in the example of Table 4 when the counter overflows and is reset to 4. In this case, the address location 4 is simply overwritten with the new content value.

The overwrite ability and the use of the counter value as addresses into the decompression dictionary allow the inventive decompression logic to be implemented with a minimal memory requirement, which is advantageous irrespective whether the decompression logic is implemented in software or hardware. Minimizing the memory requirement both increases the processing speed and reducing complexity/size of the decompression logic. In one embodiment, the reduction in the size of the memory allows the decompression dictionary to be implemented using simply random access memory (RAM), with the attendant benefit in higher speed, reducing complexity and power consumption. The smaller memory requirement also makes it possible to design the dictionary memory using special high speed custom logic in an economical manner, which facilitates high speed decompression to keep up with higher data rate requirements.

In one embodiment, the end of burst (EOF) is signaled to the decompression logic using a unique bit pattern. This end of burst signal may be created by, for example, the input interface of the data optimization engine or the decompression engine may simply utilize the end of burst (EOF) signal provided by the compression circuitry when the packet or data frame was compressed earlier. As in the compression case, the input interface is endowed with knowledge regarding the protocol employed to transmit the data and therefore would know where the burst ends and where the next burst begins in the data stream. By using a special end of burst (EOF) signal, it is unnecessary for the decompression engine to know in advance how long the burst is. This allows decompression to be truly flexible and adaptive with regard to how long the burst can be, further extending the flexibility of the inventive HSO decompression technique (which is flexible and adaptive in that no prior knowledge of the dictionary is required for decompression of any type of compressed data).

Also unique in the combination that is the inventive HSO decompression technique is the reshuffling feature that allows the output to be properly ordered to restore the original uncompressed stream. With reference to the example of Table 4, this reshuffling process is seen within each group G1-G15, which process reshuffles the values CharOut values to derive the Decomp Output. As can be seen by a comparison with the compression input stream, Decomp Output is an exact copy of the original uncompressed data stream.

Figure 14:
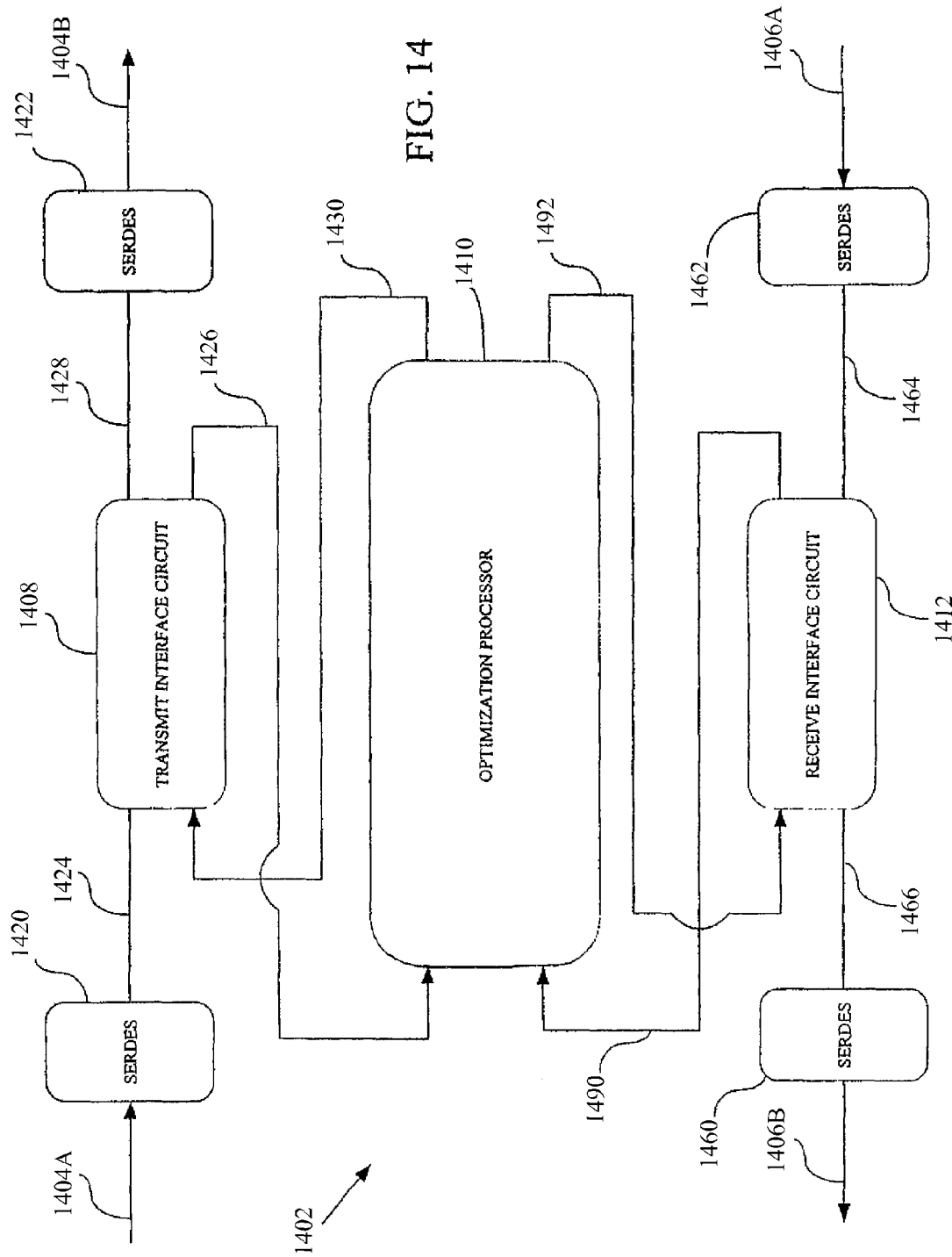
FIG. 14 shows, in accordance with one embodiment, another high-level block diagram of the data optimization engine.

FIG. 14 shows, in accordance with one embodiment, a data optimization engine 1402, which receives an incoming data stream on a communication channel 1404A, optimizes the optimizable data frames in the incoming data stream, and passes the optimized data frames, along with the data frames that cannot be optimized, out via a communication channel 1404B. In the reverse direction, data optimization engine 1402 receives an incoming data stream on a communication channel 1406A that may contain data frames previously optimized. Data optimization engine 1402 then de-optimizes the previously optimized data frames in the incoming data stream received at communication channel 1406A, and passes the de-optimized data out on a communication channel 1406B. Furthermore, data frames previously unoptimized are bypassed directly from communication channel 1406A to communication channel 1406B by data optimization engine 1402.

In FIG. 14, data optimization engine 1402 comprises a transmit interface circuit 1408, an optimization processor 1410, and a receive interface circuit 1412. Transmit interface circuit 1408 couples on the left side (transmit side) of FIG. 14 to a transmit-side SERDES (Serializer/Deserializer) 1420, and on the right side of FIG. 14 (receive side) to a receive side SERDES 1422. Transmit side SERDES 1420 receives the serial incoming data stream on communication channel 1404A, and converts the incoming serial data to a parallel data format to be transmitted to transmit interface circuit 1408 via a 10-bit bus 1424. Transmit interface circuit 1408 performs data alignment on the data frames of the incoming data stream, separates the optimizable data frames from the non-optimizable data frames, and bypasses the non-optimizable data frames out to receive side SERDES 1422 to be output on communication channel 1404B. Transmit interface circuit 1408 also performs data parsing on the optimizable data frames in the incoming data stream (received on communication channel 1404A), thus separating the optimizable portion of a data frame from the non-optimizable portion. The data in the optimizable portion is then translated or adapted by transmit interface circuit 1408 to a protocol or format that is suitable for optimization by optimization processor 1410.

With reference to FIG. 14, the optimizable portion of the optimizable data frame is sent from transmit interface circuit 1408 to optimization processor 1410 via a bus 1426. After the optimizable portion of the data frame is optimized, the now-optimized optimizable portion is received at transmit interface circuit 1408 via a bus 1430 to be reassembled by transmit interface circuit 1408 with the non-optimizable portions of the optimizable data frame for retransmission onward, via a bus 1428, to receive side SERDES 1422 and communication channel 1404B.

Furthermore, transmit interface circuit 1408 performs congestion control to ensure that if incoming data frames arrive in rapid bursts on communication channel 1404A, optimization processor 1410 is not swamped, and can have time to perform the optimization task on the optimizable portions of the optimizable data frames. While optimization processor 1410 performs its optimization task on the optimizable portion of the optimizable data frames, transmit interface circuit 1408 also performs traffic handling to ensure that meaningful data appears on communication channel 1404B (if required by the protocol on the communication channel 1404B) so as to render data optimization engine transparent to the receiving device.

Receive interface circuit 1412 couples on the left side (transmit side) of FIG. 14 to a transmit-side SERDES 1460, and on the right side of FIG. 14 (receive side) to a receive-side SERDES 1462. Receive-side SERDES 1462 receives the serial incoming data stream on communication channel 1406A, and converts the incoming serial data to a parallel data format to be transmitted to receive interface circuit 1412 via a 10-bit bus 1464. The incoming data stream may contain both non-optimized data frames, as well as data frames previously optimized by another data optimization engine.

Receive interface circuit 1412 performs data alignment on the data frames of the incoming data stream, separates the de-optimizable data frames (i.e., those previously optimized and now need to be decompressed and/or decrypted) from those that do not need de-optimization, and bypasses those data frames that do not need de-optimization out to transmit side SERDES 1460 to be output on communication channel 1406B. Receive interface circuit 1412 also performs data parsing on the de-optimizable data frames in the incoming data stream (received on communication channel 1406A), thus separating the de-optimizable portion of a data frame from the non-de-optimizable portion. The data in the de-optimizable portion is then translated or adapted by receive interface circuit 1412 to a protocol or format that is suitable for de-optimization by optimization processor 1410 (which performs the de-optimization for data received from receive interface circuit 1412 as discussed later herein).

With reference to FIG. 14, the de-optimizable portion of the de-optimizable data frame is sent from receive interface circuit 1412 to optimization processor 1410 via a bus 1490. After the de-optimizable portion of the data frame is de-optimized, the now-de-optimized portion is received at receive interface circuit 1412 via a bus 1492 to be reassembled by receive interface circuit 1412 with the non-de-optimizable portion of the de-optimizable data frame for retransmission onward, via a bus 1466, to transmit side SERDES 1460 and communication channel 1406B. Furthermore, receive interface circuit 1412 performs congestion control to ensure that if incoming data frames arrive in rapid bursts on communication channel 1406A, optimization processor 1410 is not swamped, and can have time to perform the de-optimization task on the de-optimizable portions of the de-optimizable data frames. While optimization processor 1410 performs its de-optimization tasks on the de-optimizable portion of the de-optimizable data frames, receive interface circuit 1412 also performs traffic handling to ensure that meaningful data appears on communication channel 1406B (if required by the protocol on the communication channel 1406B) so as to render data optimization engine transparent to the receiving device.

Figure 15:
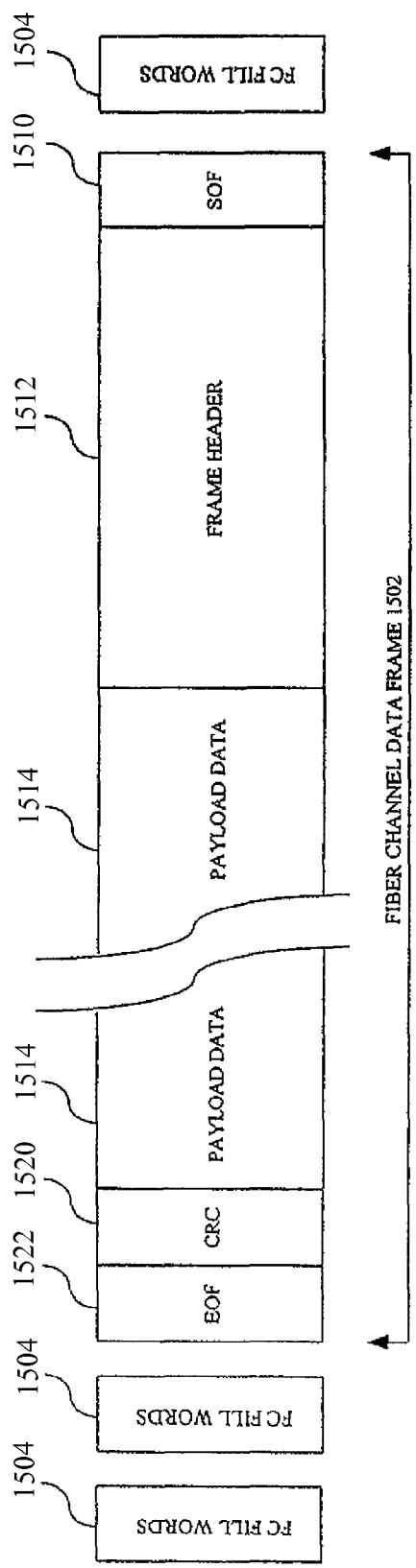
FIG. 15 illustrates a typical Fiber Channel data frame.

In the following figures, a data optimization engine configured to optimize data having the Fiber Channel (FC) protocol is discussed in detail. To facilitate discussion of the Fiber Channel implementation of data optimization engine 1402, a review of the frame format of a Fiber Channel data frame may be in order. Referring now to FIG. 15, there is shown a typical Fiber Channel data frame 1502. Adjacent Fiber Channel data frames 1502 are typically separated from one another by one or more primitive signals (an Idle word is a type of primitive signal word). Further information regarding these primitive signal words may be obtained from the aforementioned Kembel text. Generally, there is a minimum of six primitive signal words between the end of one Fiber Channel data frame 1502 and the start of the next Fiber Channel data frame. These primitive signal words are shown in FIG. 15 as primitive signal words 1504. A start-of-frame (SOF) delimiter 1510, which is typically negative in polarity, is 40 bits long and defines the start of Fiber Channel data frame 1502. There are six 40-bit words defining frame header 1512 adjacent to start-of-frame delimiter 1510. Following frame header 1512, there may be up to 528 of 4-byte words of payload (or up to 2,112 bytes of payload). This is shown as data payload 1514 in FIG. 15. The payload may also include optional header data, which reduces the actual payload capacity. Additional information regarding the Fiber Channel protocol may be obtained from the Kembel reference. Following data payload 1514, there is one 40-bit CRC (Cyclic Redundancy Check) to be followed by an end-of-frame delimiter, which is also 40 bits long. These are shown as CRC 1520 and end-of-frame (EOF) delimiter 1522 respectively in FIG. 15. With respect to polarity, as is well known to those familiar with the Fiber Channel specification, each 40-bit word in Fiber Channel data frame 1502 may have a different polarity.

Figure 16:
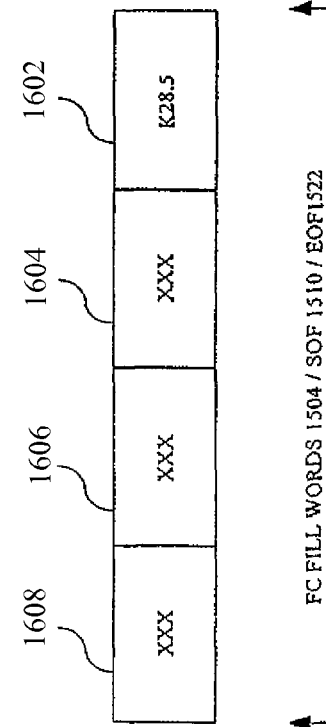
FIG. 16 illustrates the structure of an Idle word, representing a type of primitive signal word in the Fiber Channel protocol.

In FIG. 16, an Idle word 1600, representing a type of primitive signal word is shown. As mentioned earlier, each primitive signal word is 40 bits long and organized into four 10-bit words. The first 10-bit word of primitive signal word 1504 bears a special code K28.5 (shown by reference 1602 in FIG. 16). The Fiber Channel specification requires that all 10 bits of the K28.5 word be located within a single 40-bit word. To put it differently, the 10-bit K28.5 word cannot be split among adjacent 40-bit words. Following the K28.5 10-bit word, there are three other 10-bit words shown in FIG. 16 by reference numbers 1604, 1606, and 1608 respectively. As there are different primitive signal words, the content of the three 10-bit words that follow the K28.5 10-bit word may vary. Furthermore, start-of-frame delimiter 1510 and end-of-frame delimiter 1522 also start with a K28.5 10-bit word. As in the case of primitive signal words, the next three 10-bit words of a start-of-frame delimiter 1510 or an end-of-frame delimiter 1522 may vary in content as there are different start-of-frame delimiters 1510 and end-of-frame delimiters 1522 specified for each class.

Figure 17:
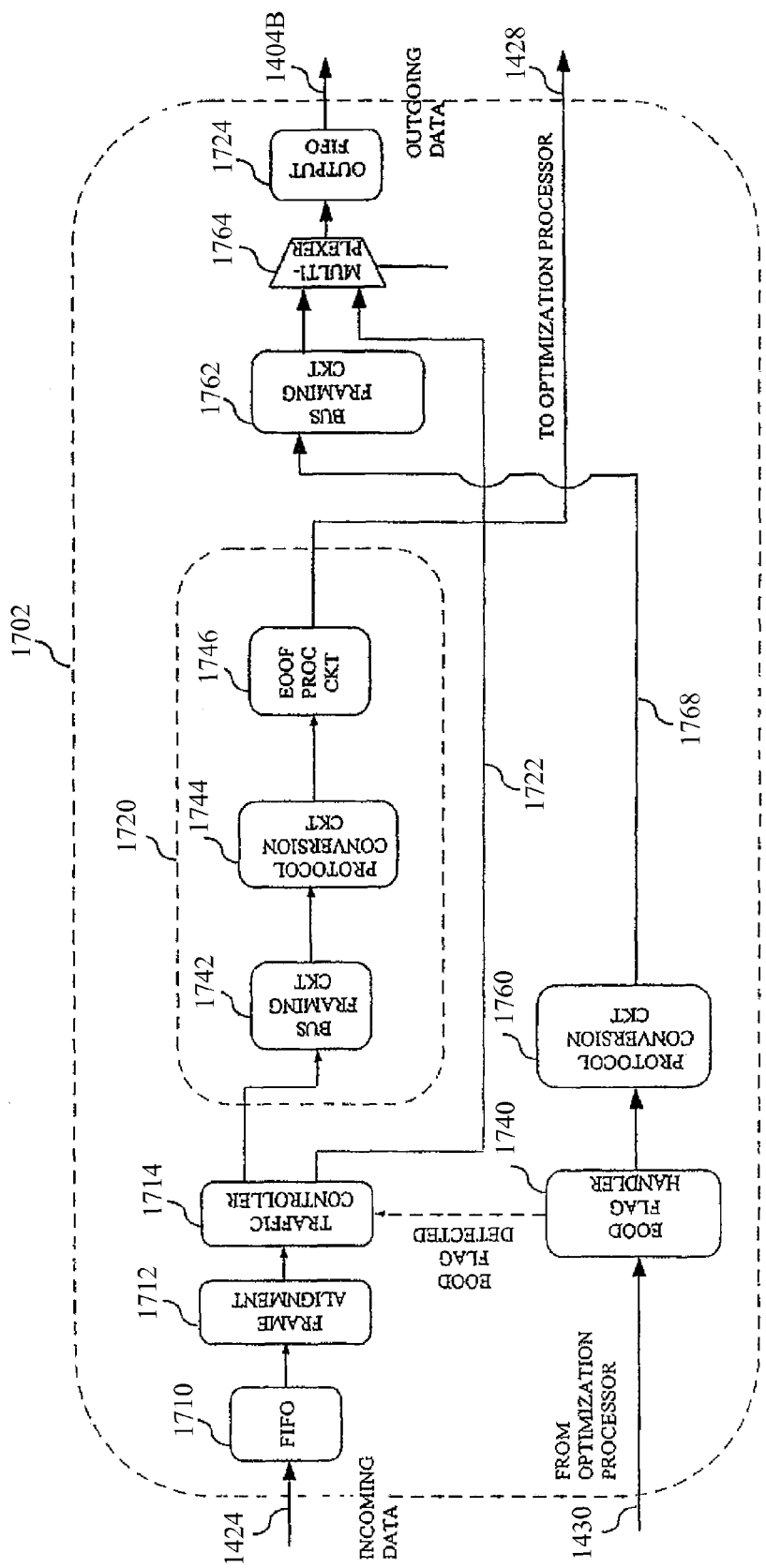
FIG. 17 shows, in accordance with one embodiment, a transmit interface circuit in greater detail.

FIG. 17 shows, in accordance with one embodiment, a transmit interface circuit 1702 in greater detail. As discussed in connection with FIG. 14, the incoming serial data stream is converted by the transmit side SERDES (1420 in FIGS. 14) to 10-bit words and received at bus 1424. Generally speaking, bus 1424 is a parallel bus, but it may also be a high-speed serial bus, for example. If bus 1424 is a 10-bit parallel bus, bus 1424 typically operates at between around 100 MHz to around 125 MHz to yield roughly one GHz or slightly above. In the case of Fiber Channel data, bus 1424, as a 10-bit parallel bus, may run at roughly 106 MHz. In the case of gigabit Ethernet data (which is not the case in FIG. 17), bus 1424 may run at, for example, 125 MHz.

A FIFO 1710 converts the 10-bit data on bus 1424 into 40-bit data. Besides performing framing of the incoming data from 10 bits to 40 bits, FIFO 1710 also acts as a shock absorber to absorb data bursts coming in via bus 1424. Framing the incoming data as 40-bit words allows transmit interface circuit 1702 to operate on a longer word, thereby enabling transmit interface circuit 1702 to operate at a lower clock speed while still maintaining a high throughput. Framing the incoming data as 40-bit words also makes it simpler to perform frame alignment in frame alignment circuit 1712.

Frame alignment circuit 1712 looks for the 10-bit K28.5 word within each 40-bit word. If it finds the 10-bit K28.5 word, that 10-bit K28.5 word and the next three 10-bit words are considered, as a 40-bit word unit, to be either an FC fill 40-bit word (1504 in FIG. 15), a start-of-frame delimiter (1510 in FIG. 15), or end-of-frame delimiter (1522 in FIG. 15). Using the start of the 10-bit K28.5 word to frame the 40-bit words received into transmit interface circuit 1702 accomplishes frame alignment by ensuring that the beginning of the start-of-frame delimiter 1510 can be accurately framed, or aligned, with respect to a reference 40-bit word. Consequently, the frame header 1512, as well as payload 1514 can also be properly framed with respect to reference 40-bit words and analyzed.

After frame alignment circuit 1712 frames the incoming data stream, the 40-bit words are passed to traffic controller circuit 1714 for further processing. Traffic controller circuit 1714 receives the 40-bit words from frame alignment circuit 1712, and ascertains whether a received 40-bit word is a primitive signal word, a start-of-frame delimiter, one of the frame header 40-bit words, a 40-bit CRC word, or a 40-bit end-of-frame delimiter, or part of the data payload. Since the primitive signal words and the start-of-frame delimiter are aligned with 40-bit reference words by frame alignment circuit 1712, the parsing of a Fiber Channel data frame into its constituent parts can be achieved with the knowledge of the relative positions of each 40-bit word in the Fiber Channel data frame, both relative to one another and relative to the start-of-frame delimiter and the end-of-frame delimiter (as discussed in FIG. 15).

Figure 18:
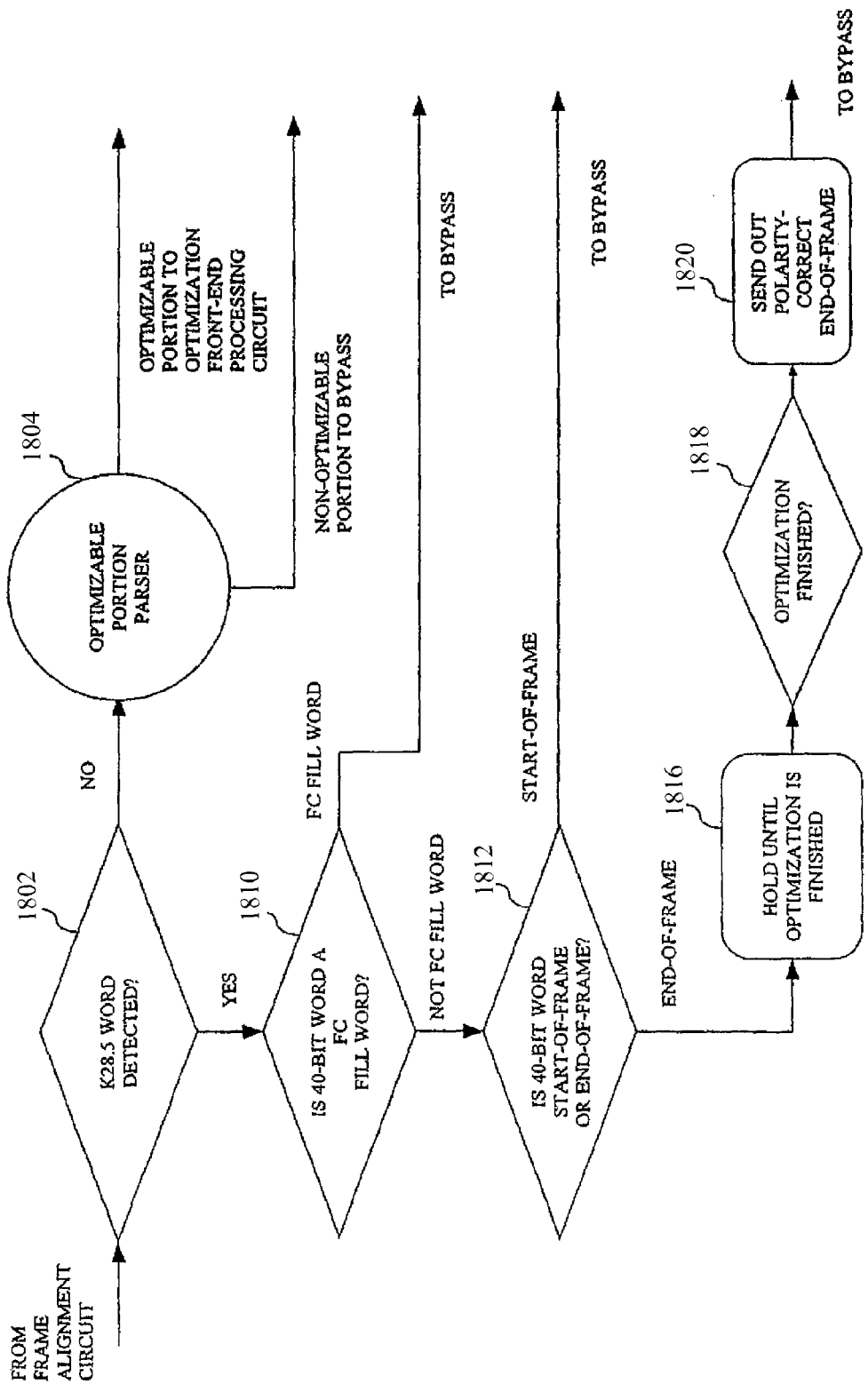
FIG. 18 illustrates, in accordance with one embodiment, a flowchart showing how the traffic controller circuit may process each 40-bit word received from the frame alignment circuit.

FIG. 18 illustrates, in accordance with one embodiment, a flowchart showing how traffic controller circuit 1714 may process each 40-bit word received from frame alignment circuit 1712. As each 40-bit word is received from frame alignment circuit 1712, traffic controller circuit 1714 first checks to see whether the first 10-bit of that 40-bit word is a 10-bit K28.5 word. This is shown in block 1802 of FIG. 18. If the first 10 bits of the incoming 40-bit word from frame alignment circuit 1712 is not a 10-bit K28.5 word, that 40-bit word must be either one of the frame header 40-bit words (1512 in FIG. 15), part of the data payload (1514 in FIG. 15), or a 40-bit CRC word (1520 in FIG. 15).

In this case, the 40-bit word is passed to an optimizable portion parser (block 1804 of FIG. 18), which ascertains whether the 40-bit word received is part of the optimizable portion of the Fiber Channel data frame, or part of the non-optimizable portion of the Fiber Channel data frame. In one embodiment, only the data payload (1514 of FIG. 15) is optimizable, i.e., eligible to be processed further via either compression and/or encryption by optimization processor 1410. In another embodiment, even a whole or a portion of the frame header (1512 of FIG. 15), and/or the CRC 40-bit word (1520 of FIG. 15) may also be eligible to be optimized further via compression or encryption by optimization processor 1410. Typically, however, when only the payload is optimized, the CRC is recalculated by transmit interface circuit 1702 for each Fiber Channel data frame that has been optimized and thus the CRC does not need to be optimized Irrespective of the specific implementation of the optimizable portion parser, the 40-bit word deemed to be part of the non-optimizable portion is allowed to bypass directly to output of transmit interface circuit 1702 while the optimizable portion is further processed.

In one embodiment, the header and/or payload is further analyzed to determine if the Fiber Channel data frame should not be optimized (in some cases, one or more fields in the header may indicate that this particular Fiber Channel data frame should not be optimized). In this case, even the optimizable portion (i.e., the portion eligible to be compressed and/or encrypted by optimization processor 1410) would also be bypassed directly to the output of transmit interface circuit 1702 via bus 1722, thereby, allowing the payload, header, and/or CRC portions of the Fiber Channel data frame to transparently pass through transmit interface circuit 1702 without modification or significant processing. If the header and/or payload do not indicate that the Fiber Channel data frame under consideration should not be optimized, the optimizable portion is then passed on to optimization front-end circuit 1720 (shown in FIG. 17) for further processing. On the other hand, if the first 10-bit of the 40-bit word received from frame alignment circuit 1712 is indeed a 10-bit K28.5 word, this 40-bit word is either a primitive signal word, a start-of-frame delimiter, or an end-of-frame delimiter. If the received 40-bit word is a primitive signal word (as ascertained in block 1810 of FIG. 18), the primitive signal word is bypassed directly to the output of transmit interface circuit 1702 via bypass bus 1722.

In one embodiment, traffic controller circuit 1714 monitors a threshold level at output FIFO 1724 (see FIG. 17) and outputs additional Idle words (or one of the fill words) to output FIFO 1724 to essentially cause output FIFO 1724 to output Idle words from transmit interface circuit 1702. In one embodiment, two fill words are output whenever the threshold is below a certain level. This is useful since the Fiber Channel protocol expects there to be protocol-acceptable data on the communication channel at all times. If optimization processor 1410 is busy optimizing a particularly long Fiber Channel data frame, traffic controller circuit 1714 fills the communication channel with protocol-acceptable data instead of allowing gibberish data to appear on the communication channel. In one embodiment, the Idle words may come from the output FIFO 1724 itself (as opposed to from the traffic controller circuit). The threshold within output FIFO 1724 that triggers the output of additional Idle words may be set via software during configuration or execution, or may be adaptively changed based on traffic pattern and bandwidth usage pattern of the incoming data stream.

On the other hand, if it is ascertained in block 1810 that the incoming 40-bit word starts with a 10-bit K28.5 word but that 40-bit word is not a primitive signal word, a further decision point is made in block 1812, which ascertains whether the incoming 40-bit word is the start-of-frame delimiter or the end-of-frame delimiter. If the incoming 40-bit word is ascertained in block 1812 to be a start-of-frame delimiter, this start-of-frame delimiter is immediately bypassed to the output of transmit interface circuit 1702 via bypass bus 1722. On the other hand, if it is ascertained in block 1812 that the incoming 40-bit word is an end-of-frame delimiter, the end-of-frame delimiter is held by traffic controller circuit 1714 until traffic controller circuit 1714 receives a signal from an end-of-optimized-data-flag-handler circuit 1740 (see FIG. 17) that indicates that traffic controller circuit 1714 can release a polarity-correct version of the end-of-frame delimiter to the output of transmit interface circuit 1702. This is shown in blocks 1816, 1818, and 1820 of FIG. 18 respectively. Furthermore, the end-of-frame delimiter is also bypassed to the output of transmit interface circuit 1702 if it turns out that the optimizable portion belongs to a Fiber Channel data frame that has been marked as one that should not be optimized (e.g., as ascertained by examining a relevant field in the header or by analysis of the payload data). This is because such a Fiber Channel data frame will not be optimized and there is no need to hold on to the end-of-frame delimiter waiting for the optimization processor to finish optimizing the optimizable portion because there is in fact no optimization to be done.

As mentioned earlier, in connection with block 1804 of FIG. 18, the optimizable portion of a Fiber Channel data frame that can be optimized is passed on to an optimization front-end circuit 1720 (see FIG. 17) for further processing prior to actually being optimized by optimization processor 1410. Referring back to FIG. 17 now, in optimization front-end circuit 1720, the 40-bit words are de-framed into 10-bit words by a bus framing circuit 1742. In one embodiment, bus framing circuit 1742 is implemented by four 10-bit multiplexers that are selected by a counter. Thus, 40-bits of data are received in parallel and are separated into groups of four 10-bit words, and the counter selects the 10-bit words in a round-robin fashion.

These 10-bit words are input into a protocol conversion circuit 1744, which converts the optimizable portion into a format acceptable for optimization by optimization processor 1410. In one embodiment, the 10-bit words received from bus framing circuit 1742 are converted to 8-bit words using a 10-bit/8-bit look-up table. The use of a look-up table to convert 10-bit data to 8-bit data is well known in the art. One implementation of such a 10-bit/8-bit lookup table may be found at, e.g., the aforementioned Kembel text.

The data to be optimized, now converted to 8-bit in the example of FIG. 17, is input into an end-of-optimization-file-processing circuit 1746, which tags or marks the last word of the optimizable portion of the Fiber Channel data frame with a flag to indicate to optimization processor 1410 that the 8-bit word so flagged represents the last 8-bit word of the file to be optimized for the current Fiber Channel data frame. In one embodiment, an extra bit is added to each 8-bit word received from protocol conversion circuit 1744. Consequently, 9-bit words are sent to optimization processor 1410 with one bit of each 9-bit word representing the end-of-optimization-file flag. The last 9-bit word of the optimization file would have its end-of-optimization-file 1-bit flag set. When optimization processor 1410 receives these 9-bit words, a circuit in the optimization processor 1410 (e.g., an input FIFO within optimization processor 1410) performs the task of detecting the end of the optimization file, and strips away the additional flag bit after detection to allow the optimization core within optimization processor 1410 to operate only on the 8-bit words. In other words, the extra 1-bit is added to flag the end of the optimization file between transmit interface circuit 1408 and optimization processor 1410, and is stripped away before the optimizable portion of the Fiber Channel data frame is optimized (compressed and/or encrypted) by optimization processor 1410. In this manner, substantially no overhead is incurred by the optimization core (i.e., the actual compression/decompression engine or the encryption/decryption engine) within the optimization processor by this universal and flexible (i.e., easily adaptable to different incoming protocols) in-band signaling technique for communicating the end-of-optimized-file information between the transmit interface circuit and the optimization processor.

In another embodiment, transmit interface circuit 1408 may flag the end of the optimization file by other means, such as by a dedicated signal (out of band signaling vs. in band signaling). In this case, the data may be sent, using the above example, as 8-bit data. In any case, the optimizable portion of the Fiber Channel data frame is then optimized by optimization processor 1410, and sent back to transmit interface circuit 1702 as 8-bit words via a bus 1430. Optimization processor 1410 also generates a unique end-of-optimized-data flag in the optimized data sent back to transmit interface circuit 1702 via bus 1430. As discussed earlier, this end-of-optimized-data flag is detected by an end-of-optimized-data-flag-handler circuit 1740.

The optimized data is then converted back to 10-bit via protocol conversion circuit 1760, which, in the case of FIG. 17, is a conventional 8-bit/10-bit table look-up. Thus, 10-bit words are sent from protocol conversion circuit 1760 to a bus framing circuit 1762 (via a bus 1768) to frame four 10-bit words into one 40-bit word for output to a multiplexer 1764. In one embodiment, bus framing circuit 1762 is implemented using four shift registers and a counter that shifts, in a round-robin fashion, the first, second, third, and fourth 10-bit words into a 40-bit word, and outputs the 40-bit word to a multiplexer 1764. For the last 40-bit word of the optimized data, bus-framing circuit 1762 also pads the data so that a full 40-bit word is sent to multiplexer 1764.

Thus, as each 40-bit word is received from frame alignment circuit 1712, traffic controller circuit 1714 ascertains whether the 40-bit word received is a primitive signal word, a start-of-frame delimiter, an end-of-frame delimiter. If a primitive signal word is detected, it is immediately bypassed via bypass bus 1722 and multiplexer 1764 to output FIFO 1724. Multiplexer 1764 merely selects, based on whether data is bypassed via bypass bus 1722 or sent through bus framing circuit 1762, whether output FIFO 1724 will receive data from the bypass bus 1722 or from bus framing circuit 1762. If a start-of-frame delimiter is detected, traffic controller circuit 1714 immediately bypasses the start-of-frame delimiter to output FIFO 1724 via bypass bus 1722 and multiplexer 1764. The start-of-frame delimiter then waits in output FIFO 1724 to be assembled with the optimized data sent back by optimization processor 1410. The non-optimizable portion of the Fiber Channel frame is also bypassed directly to output FIFO 1724 (see FIG. 18) via bypass bus 1722 and multiplexer 1764.

If the 40-bit word is neither a primitive signal word nor one of the start-of-frame delimiters and end-of-frame delimiters, traffic circuit 1714 sorts the incoming 40-bit word as either an optimizable portion or a non-optimizable portion (as discussed in FIG. 18). The optimizable portion is then processed by optimization front-end circuit 1720 and optimization processor 1410, and received as optimized data to be assembled with the waiting start-of-frame delimiter and any bypassed non-optimizable portion (such as the header).

After the end-of-optimized-data flag is detected in the optimized data stream coming from optimization processor 1410 by end-of-optimized-data-flag-handler circuit 1740, a new CRC may be calculated and assembled with the optimized data in output FIFO 1724. The detection of the end-of-optimized-data-flag-handler circuit 1740 also permits traffic controller circuit 1714 to release a polarity-correct version of the end-of-frame delimiter it stored earlier for the current Fiber Channel data frame. This end-of-frame delimiter is bypassed via bypass bus 1722 and multiplexer 1764 to be assembled with the waiting but incomplete Fiber Channel data frame in output FIFO 1724.

As mentioned earlier, transmit interface circuit 1702 also performs congestion control to ensure that optimization processor 1410 is not overloaded when data arrives at data optimization engine 1402 in rapid bursts. In one embodiment, when traffic controller circuit 1714 detects an end-of-frame delimiter, it waits until after processing of the current Fiber Channel data frame is finished before it receives the next Fiber Channel data frame for processing. For example, it may wait until it receives a signal from end-of-optimized-data-flag-handler circuit 1740, indicating that optimization processor 1410 has finished processing the current optimizable portion of the current Fiber Channel data frame before it receives additional data from frame alignment circuit 1712. In the meantime, FIFO 1710 may act as a shock absorber to absorb the data bursts while waiting for optimization processor 1410 to finish its current processing.

In one embodiment, the transmit interface circuit 1408 also marks the header of the optimized Fiber Channel data frame so that that Fiber Channel data frame may be recognized in the future as one that contains optimized data. This marking helps another data optimization engine to ascertain whether a Fiber Channel data frame has been optimized earlier by a data optimization engine.

Figure 19:
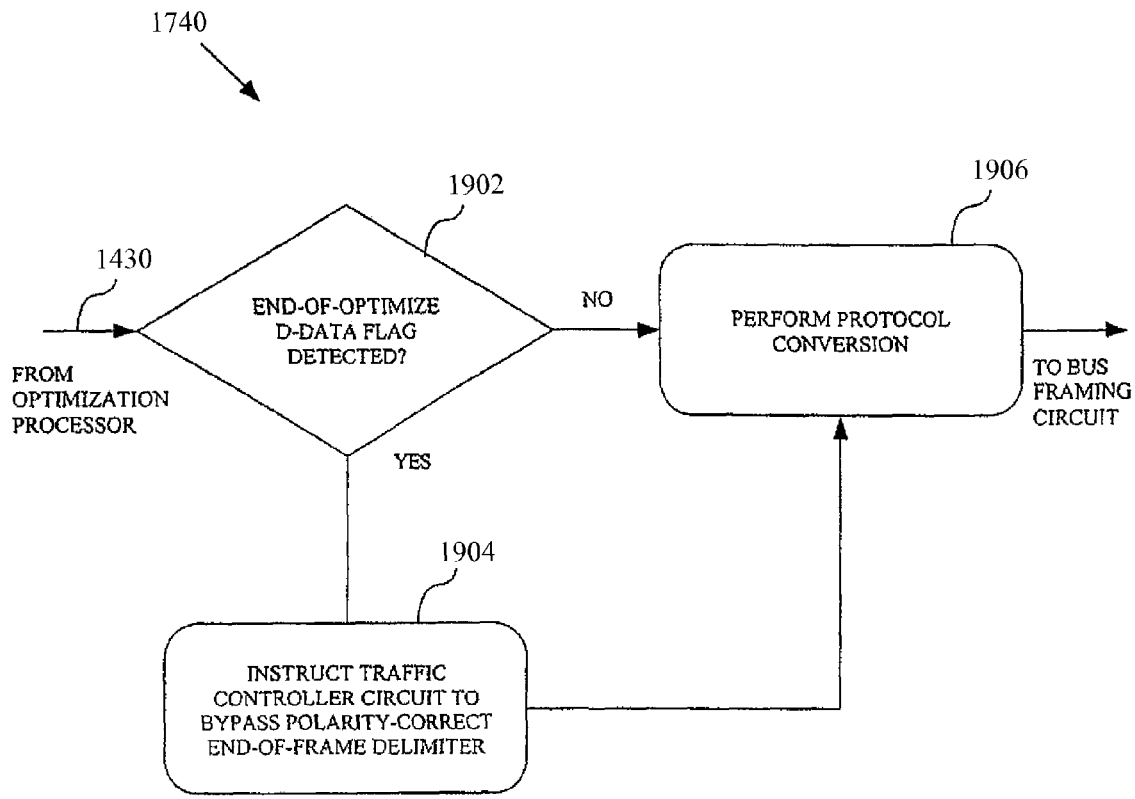
FIG. 19 illustrates, in accordance with one embodiment, how the end-of-optimized-data-flag-handler circuit handles optimized data received from the optimization processor.

FIG. 19 illustrates, in accordance with one embodiment, how end-of-optimized-data-flag-handler circuit 1740 handles optimized data received from the optimization processor 1410 and detects an end-of-optimized-data flag in the stream of optimized data received. In FIG. 19, optimized data is received from optimization processor 1410 via a bus 1430 (shown in both FIGS. 17 and 19). Since the word size of the optimized data words received from optimization processor 1410 may differ from the actual size of the codes output by the compressor and/or encryption engine, a strategy needs to be developed to ensure that the end-of-optimized-data flag can be reliably detected.

In one embodiment, the optimization processor 1410 implements the aforementioned high-speed optimized compression algorithm, and yields 11 bits of code for the incoming 8-bit words into the optimization processor. The use of 11 bits is advantageous since it allows the use of a dictionary that can compress the entire Fiber Channel payload (2112 bytes maximum) without a significant possibility of overflowing. In this case, although the optimized data received from bus 1430 are words that are 8-bit long each (which is the size of data words expected by the transmit interface circuit), the data is packed into 8-bit words and sent in frames of 88 bits (8.times.11).

In the present example, 11-bit of code is generated for the incoming 8-bit data words by optimization processor 1410 implementing an adaptive compression scheme (such as LZW or the aforementioned inventive HSO). In block 1902, it is ascertained whether the last 11 bits of the 88-bit frame of optimized data received from optimization processor 1410 contains the hex value 7FF. This is because in this example, the hex value 7FF is chosen as the special end-of-optimized-data flag to allow optimization processor 1410 to flag to transmit interface circuit 1702 that this particular data frame contains the last of the optimized data. If the optimized data does not fill up the 88-bit frame, the remainder of the 88-bit frame may be padded with 1's to make sure that the last 11 bits would contain the hex value 7FF. However, end-of-optimized-data-flag-handler circuit 1740 may simply look, in one embodiment, for this specific pattern (or another unique pattern designated to represent the end of the optimized data flag) anywhere within the 88-bit frame.

In one embodiment, the unique 11-bit code 7FF that represents the EOF may straddle a maximum of 3 consecutive bytes. In this case, monitoring for 3 consecutive 7FF bytes will ensure that EOF will be detected in the data stream. In another aspect, padding is performed after the 3 consecutive 7FF bytes until the frame reaches 32 bits, which is the word size (for 8-bit encoding) for the Fiber Channel payload. If another protocol is employed, padding is performed on the last frame to add to the byte that contains the EOF until the last frame reaches a size that would be outputted from the data optimization engine.

If the end-of-optimized-data flag is detected in the 88-bit optimized data frame, the end-of-optimized-data-flag-handler circuit 1740 signals (in block 1904) to traffic controller circuit 1714 to bypass the end-of-frame delimiter with the correct polarity that it stored earlier to output FIFO 1724. In this manner, a universal and flexible (i.e., easily adaptable to different incoming protocols) in-band signaling technique for communicating the end-of-optimized-data information between the optimization processor and the transmit interface circuit is accomplished.

With respect to the polarity of the end-of-frame delimiter, in one embodiment, when traffic controller circuit 1714 detects an end-of-frame delimiter in the incoming data stream, it stores both the CRD+ (Current Running Disparity) and CRD− versions of the end-of-frame delimiter detected for an optimizable Fiber Channel data frame. When end-of-optimized-data-flag-handler circuit 1740 signals that the end-of-frame delimiter, with the correct polarity, should be bypassed to output FIFO 1724, traffic controller circuit 1714 consults protocol conversion circuit 1760 to determine whether the positive or the negative polarity version should be sent onward to output FIFO 1724. This decision is based on the polarity of the last word of optimized data converted by protocol conversion circuit 1760. In any case, the optimized data received from bus 1430 is passed on to protocol conversion circuit 1760 (in step 1906) to be converted to 10-bit data. Note that this unique code signifying the end of the optimized data remains embedded in the optimized data stream after protocol conversion, and is detectable by the received interface circuit (1412 of FIG. 14) when it comes time to "de-optimize" the data.

Figure 20:
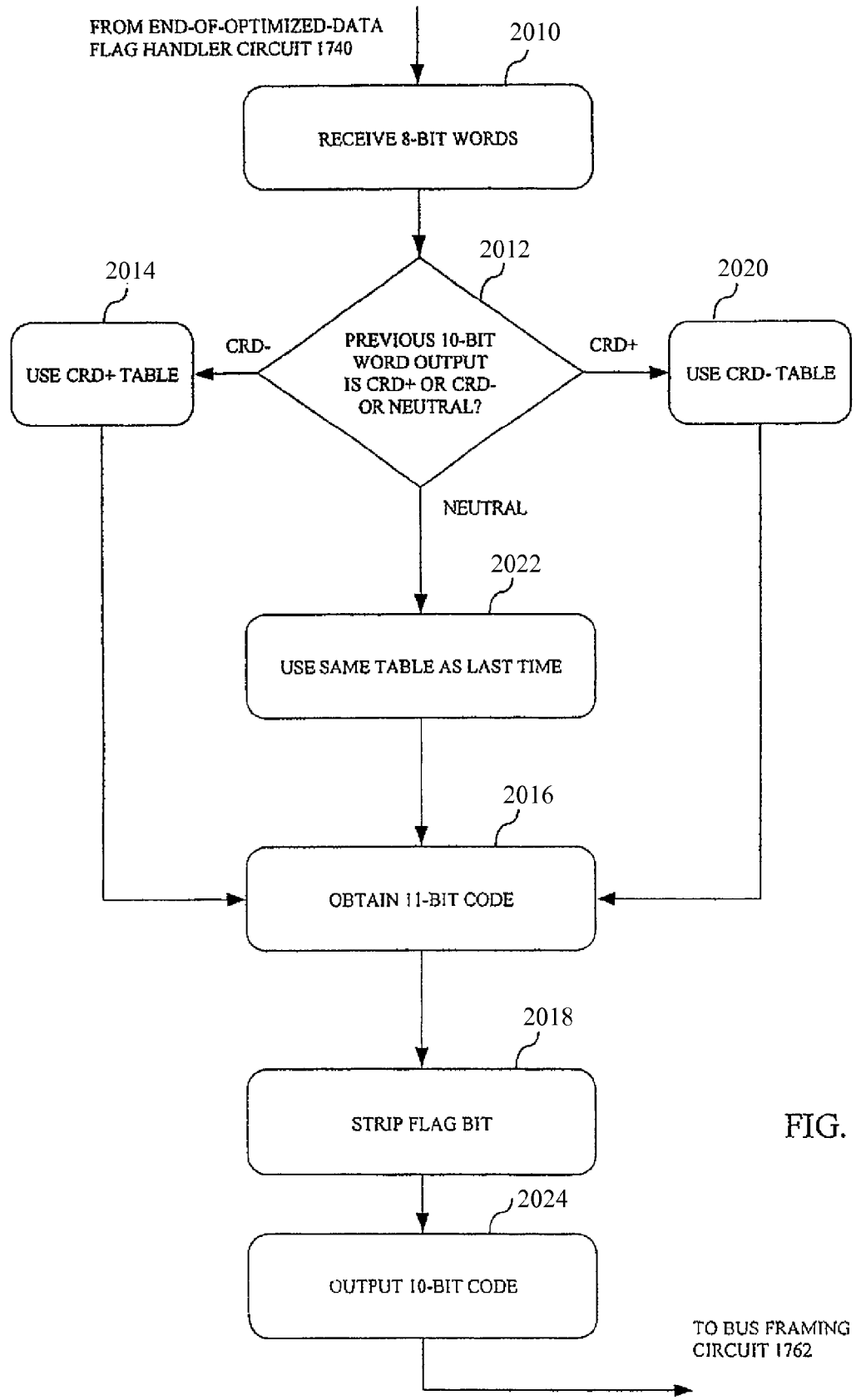
FIG. 20 illustrates, in accordance with one embodiment, how the protocol conversion circuit may perform the protocol conversion such that output words having the correct polarities may be output to bus framing circuit.

As is well known, different words in the Fiber Channel data frame may have different polarities as specified by the Fiber Channel specification. FIG. 20 illustrates, in accordance with one embodiment, how protocol conversion circuit 1760 may perform the protocol conversion such that output words having the correct polarities may be output to bus framing circuit 1760 for eventual output to output FIFO 1724 (see FIG. 17). In FIG. 20, the protocol conversion from 8-bit words to 10-bit words is performed using an 8-bit/10-bit table look-up. However, the 8-bit/10-bit table is pre-processed to generate two different tables: A CRD+ table and a CRD− table. The CRD+ table includes entries from 8-bit words to CRD+ 10-bit words. The CRD− table has entries for translating 8-bit words into the CRD− 10-bit words.

Furthermore, there is a neutral flag in the form of an extra bit in each entry. This extra bit may be appended or prepended to the 10-bit code, or may be a separate column altogether. For each 10-bit word in the table entry (either CRD+ or CRD− entry), if the number of 0's and 1's are equal in the 10-bit code, the neutral flag is set. The use of two polarity tables and a neutral flag allows the protocol conversion circuit to rapidly generate the polarity-correct 10-bit words for output.

In the flowchart of FIG. 20, each input 8-bit code into protocol conversion circuit 1760 (block 2010) is ascertained in block 2012 to determine whether the previous 10-bit code output is positive in polarity, negative in polarity, or neutral (i.e., the number of 0's and 1's are equal in the 10-bit code and flagged as being neutral). If the previous 10-bit code is output from the CRD+ table and the neutral flag of the previous 10-bit code is not set, then the previous 10-bit code is deemed to be positive for the purposes of block 2012. On the other hand, if the previous 10-bit code is output from the CRD− table, and the neutral flag of the previous 10-bit code is not set, then the previous 10-bit code is deemed to be negative in polarity for the purposes of block 2012. If the previous 10-bit code is output from either the CRD Plus or the CRD Minus table, but the neutral flag is set, then the previous 10-bit code is deemed to be neutral for the purposes of block 2012.

In the case of a previously negative 10-bit code, the next 10-bit code to be output comes from the CRD+ table, as seen in block 2014. In the CRD+ table, the 10-bit code is then obtained (or 11-bit code if the one neutral flag bit is directly appended or pre-pended to the 10-bit code). This is shown in block 2016. In block 2018, the flag bit is removed, and the 10-bit code is output (in block 2024) to the bus framing circuit 1762 (see FIG. 17). In the case where the previous 10-bit code is positive in polarity, the next 10-bit code is obtained from the CRD− table (as shown in block 2020). Thereafter, the 10-bit code is obtained and forwarded to bus framing circuit 1762. If the previous 10-bit code is neutral, the next 10-bit code is obtained from the table that was used to obtain the previous 10-bit code. This is shown in block 2022. In so doing, the 11-bit code is obtained (2016), the flag bit is stripped (2018) and the 10-bit code is passed (2024) onto bus framing circuit 1762.

Note that the polarity of the last 10-bit code of the optimized data stream is also employed to determine the polarity of the end-of-frame delimiter to be bypassed by traffic controller circuit 1714 of FIG. 17 to output FIFO 1724 to complete the Fiber Channel data frame encapsulating the optimized data to be output onto the media. If the polarity of the last 10-bit code of the optimized data stream is positive, a negative end-of-frame delimiter is sent. Conversely, if the polarity of the last 10-bit code of the optimized data stream is negative, a positive end-of-frame delimiter is sent.

Figure 21:
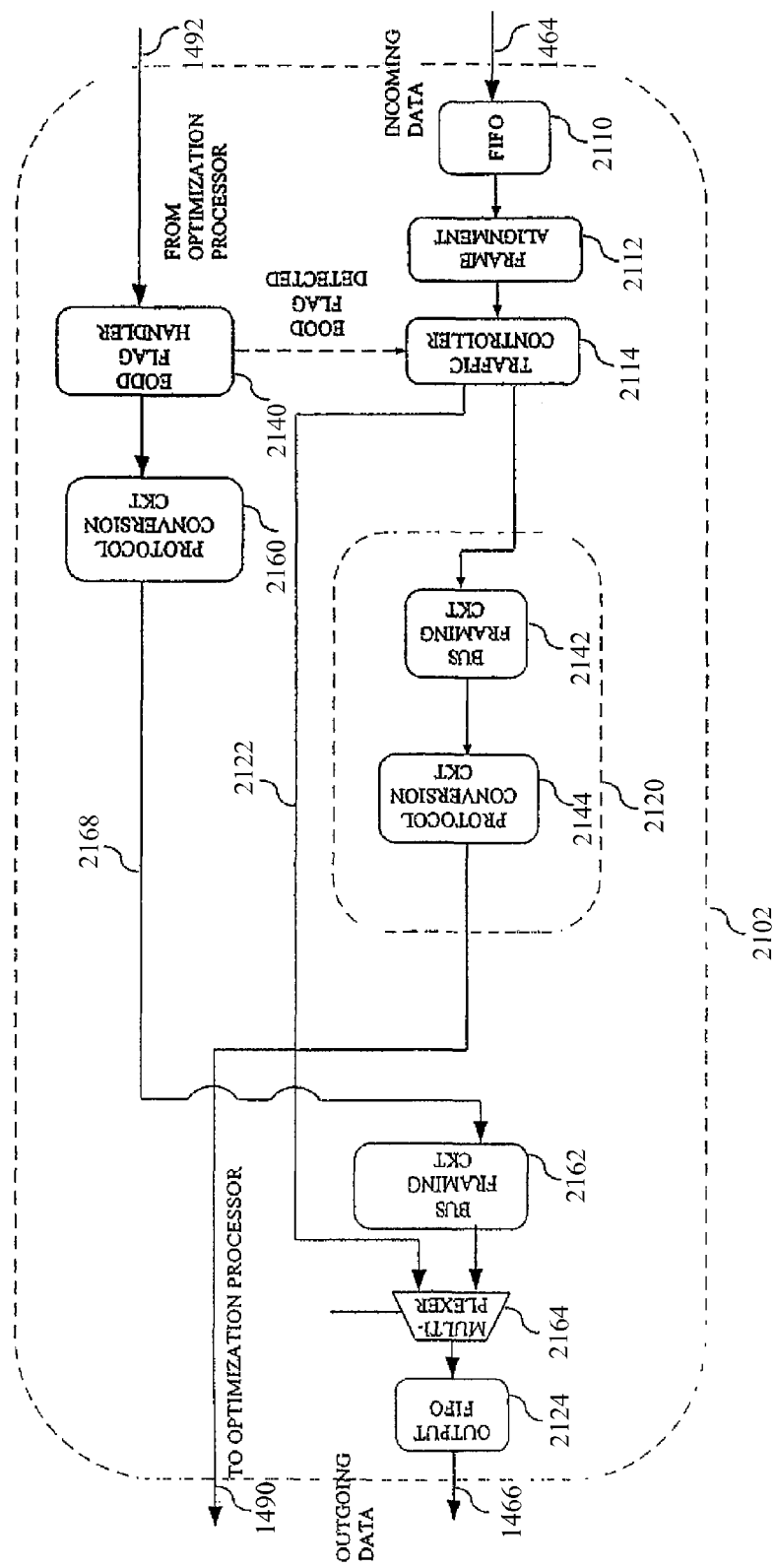
FIG. 21 shows, in accordance with one embodiment, a receive interface circuit in greater detail.

FIG. 21 shows, in accordance with one embodiment, a receive interface circuit 2102 in greater detail. The receive interface circuit reverses the process performed by the transmit interface circuit, with some differences as discussed herein. The incoming serial data stream is first converted by the receive side SERDES (1462 in FIGS. 14) to 10-bit words and received at bus 1464. Generally speaking, bus 1464 is a parallel bus, but it may also be a high-speed serial bus, for example. If bus 1464 is a 10-bit parallel bus, bus 1464 typically operates at between around 100 MHz to around 125 MHz to yield roughly one GHz or slightly above. In the case of Fiber Channel data, bus 1464, as a 10-bit parallel bus, may run at roughly 106 MHz. In the case of gigabit Ethernet data (which is not the case in FIG. 21), bus 1464 may run at, for example, 125 MHz.

A FIFO 2110 converts the 10-bit data on bus 1464 into 40-bit data. Besides performing framing of the incoming data from 10 bits to 40 bits, FIFO 2110 also acts as a shock absorber to absorb data bursts coming in via bus 1464. Framing the incoming data as 40-bit words allows transmit interface circuit 2102 to operate on a longer word, thereby enabling transmit interface circuit 2102 to operate at a lower clock speed while still maintaining a high throughput. Framing the incoming data as 40-bit words also makes it simpler to perform frame alignment in frame alignment circuit 2112.

Frame alignment circuit 2112 looks for the 10-bit K28.5 word within each 40-bit word. If it finds the 10-bit K28.5 word, that 10-bit K28.5 word and the next three 10-bit words are considered, as a 40-bit word unit, to be either a FC fill 40-bit word (1504 in FIG. 15), a start-of-frame delimiter (1510 in FIG. 15), or end-of-frame delimiter (1522 in FIG. 15). Using the start of the 10-bit K28.5 word to frame the 40-bit words received into receive interface circuit 2102 accomplishes frame alignment by ensuring that the beginning of the start-of-frame delimiter 1510 can be accurately framed, or aligned, with respect to a reference 40-bit word. Consequently, the frame header 1512, as well as payload 1514 can also be properly framed with respect to reference 40-bit words and analyzed.

After frame alignment circuit 2112 frames the incoming data stream, the 40-bit words are passed to traffic controller circuit 2114 for further processing. Traffic controller circuit 2114 receives the 40-bit words from frame alignment circuit 2112, and ascertains whether a received 40-bit word is a primitive signal word, a start-of-frame delimiter, one of the frame header 40-bit words, a 40-bit CRC word, or a 40-bit end-of-frame delimiter, or part of the data payload. Since the primitive signal words and the start-of-frame delimiter are aligned with 40-bit reference words by frame alignment circuit 2112, the parsing of a Fiber Channel data frame into its constituent parts can be achieved with the knowledge of the relative positions of each 40-bit word in the Fiber Channel data frame, i.e., relative to one another and/or relative to the start-of-frame delimiter and/or the end-of-frame delimiter (as discussed in FIG. 15).

In one embodiment, the traffic controller circuit 2114 may check an appropriate flag in one of the fields in the frame header, which flag is set by the transmit interface circuit or the optimization circuitry earlier, to see if this Fiber Channel data frame had been optimized before. If decryption is involved, the traffic controller may also, alternatively or additionally, check for the presence of an encryption key (assuming pubic key encryption was involved) to determine if this Fiber Channel data frame had been optimized before. If it had not been optimized before, the entire Fiber Channel data frame, up to the end-of-frame delimiter may be immediately bypassed to the output of receive interface circuit 2102 via bypass bus 2122, thereby rendering the data optimization engine substantially transparent with respect to the Fiber Channel data frames previously not optimized.

In another embodiment, as each 40-bit word is received from frame alignment circuit 2112, traffic controller circuit 2114 first checks to see whether the first 10-bit of that 40-bit word is a 10-bit K28.5 word. If the first 10 bits of the incoming 40-bit word from frame alignment circuit 2112 is not a 10-bit K28.5 word, that 40-bit word must be either one of the frame header 40-bit words (1512 in FIG. 15), part of the data payload (1514 in FIG. 15), or a 40-bit CRC word (1520 in FIG. 15).

In this case, the 40-bit word is passed to a de-optimizable portion parser, which ascertains whether the 40-bit word received is part of the de-optimizable portion of the Fiber Channel data frame, or part of the non-de-optimizable portion of the Fiber Channel data frame. In one embodiment, only the data payload (1514 of FIG. 15) is de-optimizable, i.e., eligible to be processed further via either decompression and/or decryption by optimization processor 1410. In another embodiment, even a whole or a portion of the frame header (1512 of FIG. 15), and/or the CRC 40-bit word (1520 of FIG. 15) may also be eligible to be de-optimized further via decompression or decryption by optimization processor 1410. Typically, however, when only the payload is de-optimized, the CRC is recalculated by receive interface circuit 2102 for each Fiber Channel data frame that has been de-optimized and thus the CRC does not need to be de-optimized Irrespective of the specific implementation of the de-optimizable portion parser, the 40-bit word deemed to be part of the non-de-optimizable portion is allowed to bypass directly to output of receive interface circuit 2102 while the de-optimizable portion is further processed.

The header and/or payload is further analyzed to determine if the Fiber Channel data frame should not be de-optimized (in some cases, one or more fields in the header may indicate that this particular Fiber Channel data frame should not be de-optimized). In this case, even the de-optimizable portion (i.e., the portion eligible to be decompressed and/or decrypted by optimization processor 1410) would also be bypassed directly to the output of transmit interface circuit 2102 via bus 2122, thereby, allowing the payload, header, and/or CRC portions of the Fiber Channel data frame to transparently pass through transmit interface circuit 2102 without modification or significant processing.

On the other hand, if it is ascertained that the de-optimizable portion should be de-optimized (due to a detection that the Fiber Channel data frame was optimized earlier or due to the presence of a public key), the de-optimizable portion is then passed on to optimization front-end circuit 2120 (shown in FIG. 21) for further processing.

If the first 10-bit of the 40-bit word received from frame alignment circuit 2112 is indeed a 10-bit K28.5 word, this 40-bit word is a primitive signal word, a start-of-frame delimiter, or an end-of-frame delimiter. If the received 40-bit word is a primitive signal word (as ascertained in block 1810 of FIG. 18), the primitive signal word is bypassed directly to the output of transmit interface circuit 2102 via bypass bus 2122.

In one embodiment, traffic controller circuit 2114 monitors a threshold level at output FIFO 2124 (see FIG. 21) and outputs additional Idle words (or one of the fill words) to output FIFO 2124 to essentially cause output FIFO 2124 to output Idle words from transmit interface circuit 2102. In one embodiment, two fill words are output whenever the threshold is below a certain level. This is useful since the Fiber Channel protocol expects there to be protocol-acceptable data on the communication channel at all times. If optimization processor 1410 is busy de-optimizing a particularly long Fiber Channel data frame, traffic controller circuit 2114 fills the communication channel with protocol-acceptable data instead of allowing gibberish data to appear on the communication channel. In one embodiment, the Idle words may come from the output FIFO 2124 itself (as opposed to from the traffic controller circuit). The threshold within output FIFO 2124 that triggers the output of additional Idle words may be set via software during configuration or execution, or may be adaptively changed based on traffic pattern and bandwidth usage pattern of the incoming data stream.

On the other hand, if it is ascertained that the incoming 40-bit word starts with a 10-bit K28.5 word but that 40-bit word is not a primitive signal word, a further decision point is made, which ascertains whether the incoming 40-bit word is the start-of-frame delimiter or the end-of-frame delimiter. If the incoming 40-bit word is ascertained to be a start-of-frame delimiter, this start-of-frame delimiter is immediately bypassed to the output of transmit interface circuit 2102 via bypass bus 2122. On the other hand, if it is ascertained in block 1812 that the incoming 40-bit word is an end-of-frame delimiter, the end-of-frame delimiter is held by traffic controller circuit 2114 until traffic controller circuit 2114 receives a signal from an end-of-deoptimized-data-flag-handler circuit 2140 (see FIG. 21) that indicates that traffic controller circuit 2114 can release a polarity-correct version of the end-of-frame delimiter to the output of receive interface circuit 2102. A technique for selecting the polarity-correct end-of-frame delimiter based on the polarity of the words previously examined has been discussed in connection with the transmit interface circuit of FIG. 17.

Furthermore, the end-of-frame delimiter is also bypassed to the output of transmit interface circuit 2102 if it turns out that the de-optimizable portion belongs to a Fiber Channel data frame should not be de-optimized (e.g., as ascertained by examining a relevant field in the header or by analysis of the payload data). This is because such a Fiber Channel data frame will not be de-optimized and there is no need to hold on to the end-of-frame delimiter waiting for the optimization processor to finish de-optimizing the de-optimizable portion because there is in fact no de-optimization to be done.

The de-optimizable portion of a Fiber Channel data frame that can be de-optimized is passed on to a de-optimization front-end circuit 2120 (see FIG. 21) for further processing prior to actually being de-optimized by optimization processor 1410. Referring back to FIG. 21 now, in de-optimization front-end circuit 2120, the 40-bit words are de-framed into 10-bit words by a bus framing circuit 2142. In one embodiment, bus framing circuit 2142 is implemented by four 10-bit multiplexers that are selected by a counter. Thus, 40-bits of data are received in parallel and are separated into groups of four 10-bit words, and the counter selects the 10-bit words in a round-robin fashion.

These 10-bit words are input into a protocol conversion circuit 2144, which converts the de-optimizable portion into a format acceptable for de-optimization by optimization processor 1410. In one embodiment, the 10-bit words received from bus framing circuit 2142 are converted to 8-bit words using a 10-bit/8-bit look-up table. The use of a look-up table to convert 10-bit data to 8-bit data is well known in the art. Information regarding 8 b/10 b encoding and decoding may be obtained, for example from the aforementioned Kembel text.

The de-optimizable portion of the Fiber Channel data frame is then de-optimized (decompressed and/or decrypted) by optimization processor 1410, and sent back to transmit interface circuit 2102 as 8-bit words via a bus 1430. Optimization processor 1410 can ascertain the end of the de-optimized data file by detecting the end-of-optimization-data flag previously provided with the de-optimizable portion during the optimization process. This end-of-optimized-data flag is also detected by an end-of-de-optimized-data-flag (EODD) handler circuit 2140.

The de-optimized data is then converted back to 10-bit via protocol conversion circuit 2160, which, in the case of FIG. 21, is a conventional 8-bit/10-bit table look-up. Thus, 10-bit words are sent from protocol conversion circuit 2160 to a bus framing circuit 2162 (via a bus 2168) to frame four 10-bit words into one 40-bit word for output to a multiplexer 2164. Multiplexer 2164 merely selects, based on whether data is bypassed via bypass bus 2122 or sent through bus framing circuit 2162, whether output FIFO 2124 will receive data from the bypass bus 2122 or from bus framing circuit 2162. In one embodiment, bus framing circuit 2162 is implemented using four shift registers and a counter that shifts, in a round-robin fashion, the first, second, third, and fourth 10-bit words into a 40-bit word, and outputs the 40-bit word to a multiplexer 2164. For the last 40-bit word of the de-optimized data, bus-framing circuit 2162 also pads the data so that a full 40-bit word is sent to multiplexer 2164.

After the end-of-de-optimized-data flag is detected in the de-optimized data stream coming from optimization processor 1410 by end-of-optimized-data-flag-handler circuit 2140, a new CRC may be calculated and assembled with the de-optimized data in output FIFO 2124. The detection of the end-of-de-optimized-data-flag-handler circuit 2140 also permits traffic controller circuit 2114 to release a polarity-correct version of the end-of-frame delimiter it stored earlier for the current Fiber Channel data frame. This end-of-frame delimiter is bypassed via bypass bus 2122 and multiplexer 2164 to be assembled with the waiting but incomplete Fiber Channel data frame in output FIFO 2124.

As mentioned earlier, receive interface circuit 2102 also performs congestion control to ensure that optimization processor 1410 is not overloaded when data arrives at data optimization engine 1402 in rapid bursts. In one embodiment, when traffic controller circuit 2114 detects an end-of-frame delimiter, it waits until after processing of the current Fiber Channel data frame is finished before it receives the next Fiber Channel data frame for processing. For example, it may wait until it receives a signal from end-of-de-optimized-data-flag-handler circuit 2140, indicating that optimization processor 1410 has finished processing the current de-optimizable portion of the current Fiber Channel data frame before it receives additional data from frame alignment circuit 2112. In the meantime, FIFO 2110 may act as a shock absorber to absorb the data bursts while waiting for optimization processor 1410 to finish its current processing.

While the various embodiments have been described in terms of several examples, there are alterations, permutations, and equivalents which fall within the scope of the described subject matter. For example, although the Fiber Channel protocol has been discussed in details, it should be understood that the modular architecture of the data optimization engine herein, its ability to work with different protocols, the HSO compression technique, and other innovative techniques and arrangements described herein, may be readily applicable to any protocol, including packet-based protocols such as Ethernet, TCP/IP, etc. When packet-oriented protocols are involved, processing by the data optimization engine is performed on a packet-by-packet basis. It should also be noted that there are many alternative ways of implementing the methods and apparatuses described above. It is therefore intended that the following appended claims be interpreted as including all such alterations, permutations, and equivalents as fall within the true spirit and scope of the described embodiments.

I claim:

1. A method, comprising:
   a computer system receiving a stream of data including a plurality of compressed code words, wherein the plurality of compressed code words includes different bit patterns;
   the computer system creating a dictionary having a number of entries, wherein an entry in the dictionary is usable to map a given one of the plurality of compressed code words to a corresponding decompressed word, wherein the number of entries is selected to be smaller than a number of the different bit patterns, and wherein the dictionary allows for replacement of existing entries based at least in part on an overflow of a counter;
   the computer system using the dictionary to decompress the plurality of compressed code words into a plurality of decompressed words; and
   the computer system outputting the plurality of decompressed words.

2. The method of claim 1, wherein the decompressing does not require prior knowledge of the dictionary.

3. A method, comprising:
   a computer system receiving a stream of data including a plurality of input words having a number of different bit patterns;
   the computer system creating a dictionary usable to map a given one of the plurality of input words to a corresponding compressed code word, wherein the dictionary has a number of entries, and wherein the number of entries is selected to be less than the number of different bit patterns;
   the computer system compressing the plurality of input words into a plurality of compressed code words, wherein the dictionary allows for rewriting of existing entries during the compressing based at least in part on an overflow of a counter; and
   the computer system outputting the plurality of compressed code words.

4. The method of claim 3, wherein the compressing utilizes one or more content-addressed memory arrays to store dictionary entries.

5. The method of claim 4, wherein the compressing includes storing a next stream of data in a second content-addressed memory array without requiring that a first content-addressed memory array be cleared.

6. The method of claim 3, wherein the compressing includes skipping processing of current data if future input characters would result in a future search bit pattern that is identical to a current search bit pattern.

7. A computer readable storage device having computer-executable instructions stored thereon that, in response to execution by a computing system, cause the computing system to perform operations comprising:
   receiving a stream of data including a plurality of compressed code words having a number of different bit patterns;
   creating a dictionary having a number of entries selected to be smaller than the number of different bit patterns, wherein an entry in the dictionary is usable to map a given one of the plurality of compressed code words to a corresponding decompressed word, wherein the dictionary allows for replacement of previous entries based at least in part on an overflow of a counter;
   using the dictionary to decompress the plurality of compressed code words into a plurality of decompressed words; and
   outputting the plurality of decompressed words.

8. The computer readable storage device of claim 7, wherein the decompressing occurs without prior knowledge of the dictionary.

9. The computer readable storage device of claim 7, wherein the decompressing occurs without knowledge of the length of the stream of data.

10. A computer readable storage device having computer-executable instructions stored thereon that, in response to execution by a computing system, cause the computing system to perform operations comprising:
    receiving a stream of data comprising a plurality of input words;
    compressing the plurality of input words into a plurality of compressed code words using a content-addressable memory (CAM) configured to store dictionary entries, wherein the CAM includes a first bit associated with a given address that is usable to indicate whether the given address is either in use or free, and wherein the CAM includes a second bit associated with the given address that is usable to indicate whether an address subsequent to the given address is either in use or free without requiring that the first bit be cleared;
    responsive to reaching the end of the plurality of input words, outputting the plurality of compressed code words, along with an end-of-file signal, as a compressed stream of data; and
    wherein the plurality of compressed code words are fewer in number than the plurality of input words.

11. The computer readable storage device of claim 10, wherein the CAM allows for reuse of dictionary entries.

12. The computer readable storage device of claim 10, wherein the compressing utilizes an input buffer that allows a view of future input characters and skipping processing of current data if the future input characters would result in an identical search bit pattern to a current search bit pattern.

13. A system comprising at least one processor and at least one memory coupled to the at least one processor, the at least one memory having stored therein program instructions that, in response to execution by the system, cause the system to perform operations comprising:
    receiving a stream of data including a plurality of compressed code words having a number of different bit patterns;
    creating a dictionary having a number of entries selected to be smaller than the number of different bit patterns, wherein an entry in the dictionary is usable to map a given one of the plurality of compressed code words to a corresponding decompressed word, wherein the dictionary allows for replacement of previous entries based at least in part on an overflow of a counter;

decompressing the plurality of compressed code words into a plurality of decompressed words using the dictionary;

outputting the plurality of decompressed words in response to encountering an end-of-file signal in the stream of data; and wherein the plurality of compressed code words are fewer in number than the plurality of decompressed words.

14. The system of claim 13, wherein the decompressing does not require prior knowledge of the dictionary.

15. The system of claim 13, wherein the decompressing does not require knowledge of the length of the stream of data before decompressing the stream of data.

16. A system comprising at least one processor and at least one memory coupled to the at least one processor, the at least one memory having stored therein program instructions that, in response to execution by the system, cause the system to perform operations comprising:

receiving a stream of data including a plurality of input words;

compressing the plurality of input words into a plurality of compressed code words utilizing an input buffer to view future input characters and skip processing of current data if the future input characters would result in an identical search bit pattern to a current search bit pattern; and responsive to reaching the end of the plurality of input words, outputting the plurality of compressed code words, along with an end-of-file signal, as a compressed stream of data, wherein the plurality of compressed code words are fewer in number than the plurality of input words.

17. The system of claim 16, wherein the compressing comprises utilizing a dictionary which allows for reuse of entries.

18. The system of claim 17, wherein the dictionary has a fixed size.

19. The system of claim 18, wherein the dictionary is smaller in size than would be used by a LZW compression algorithm to compress the same stream of data.

20. The system of claim 17, wherein the compressing comprises utilizing content-addressed memory to store dictionary entries.

21. The system of claim 20, wherein the compressing comprises utilizing shadow memory which tracks associated pairings between values and addresses in the content-addressed memory.

22. The system of claim 20, wherein the compressing comprises utilizing two or more content-addressed memory arrays so that a second content-addressed memory array can be utilized for a next stream of data without requiring a first content-addressed memory array to be cleared beforehand.

* * * * *

UNITED STATES PATENT AND TRADEMARK OFFICE
CERTIFICATE OF CORRECTION

| | | |
|---|---|---|
| PATENT NO. | : 8,504,725 B2 | Page 1 of 1 |
| APPLICATION NO. | : 12/559891 | |
| DATED | : August 6, 2013 | |
| INVENTOR(S) | : Achler | |

It is certified that error appears in the above-identified patent and that said Letters Patent is hereby corrected as shown below:

On the Title Page, in Column 1, delete Item "(60)" and insert Item -- (63) --, therefor.

In the Specification

In Column 3, Line 23, delete "storage media 306" and insert -- storage media 206 --, therefor.

In Column 16, Line 52, delete "Calif" and insert -- Calif. --, therefor.

In Column 32, Line 20, delete "idle" and insert -- is1e --, therefor.

In Column 32, Line 33, delete "isle" and insert -- is1e --, therefor.

In Column 32, Line 35, delete "if" and insert -- 1f --, therefor.

In Column 32, Line 42, delete "(which is if in this case)." and insert -- (which is 1f in this case). --, therefor.

In Column 42, Line 34, delete "(1420 in FIGS. 14)" and insert -- (1420 in FIG. 14) --, therefor.

In Column 49, Line 21, delete "(1462 in FIGS. 14)" and insert -- (1462 in FIG. 14) --, therefor.

Signed and Sealed this
Seventeenth Day of June, 2014

Michelle K. Lee
*Deputy Director of the United States Patent and Trademark Office*